US008846146B2

(12) United States Patent  
Abelson et al.

(10) Patent No.: US 8,846,146 B2  
(45) Date of Patent: Sep. 30, 2014

(54) SMOOTHING AGENTS TO ENHANCE NUCLEATION DENSITY IN THIN FILM CHEMICAL VAPOR DEPOSITION

(75) Inventors: John R. Abelson, Urbana, IL (US); Gregory S. Girolami, Urbana, IL (US); Shaista Babar, Urbana, IL (US); Navneet Kumar, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 13/285,974

(22) Filed: Oct. 31, 2011

(65) Prior Publication Data

US 2012/0107503 A1     May 3, 2012

Related U.S. Application Data

(60) Provisional application No. 61/408,777, filed on Nov. 1, 2010.

(51) Int. Cl.
| | |
|---|---|
| *C23C 16/00* | (2006.01) |
| *C23C 16/02* | (2006.01) |
| *C23C 16/04* | (2006.01) |
| *C23C 16/18* | (2006.01) |

(52) U.S. Cl.  
CPC ............. *C23C 16/0272* (2013.01); *C23C 16/04* (2013.01); *C23C 16/18* (2013.01)  
USPC .................................... 427/248.1; 427/255.7

(58) Field of Classification Search  
None  
See application file for complete search history.

(56) References Cited

U.S. PATENT DOCUMENTS

| | | | | |
|---|---|---|---|---|
| 5,641,545 | A | * | 6/1997 | Sandhu .................. 427/573 |
| 6,537,905 | B1 | | 3/2003 | Chen et al. |
| 6,613,695 | B2 | | 9/2003 | Pomarede et al. |
| 6,638,859 | B2 | | 10/2003 | Sneh et al. |
| 6,676,756 | B1 | | 1/2004 | Li et al. |
| 7,592,254 | B2 | | 9/2009 | Abelson et al. |
| 7,943,527 | B2 | | 5/2011 | Kumar et al. |
| 2006/0029745 | A1 | * | 2/2006 | Sandhu .................. 427/569 |
| 2009/0098343 | A1 | | 4/2009 | Arena et al. |
| 2010/0048029 | A1 | | 2/2010 | Kumar et al. |

OTHER PUBLICATIONS

Kumar, Thesis, 2009 (month currently unkonwn).*  
Yanguas-Gil, J. Vac Science Technol. A, V27, 5, Sep./Oct. 2009.*  
Kumar—Journal of Am. Chem. Society—2008, V130, p. 17660—"supporting information" (primary document provided with applicants IDS dated Oct. 31, 2011).*  
Chaara et al., "MOCVD TiN from TDEAT and Ammonia: Experiments and Simulations," Advanced Metallization and Interconnect Systems for ULSI Applications V-08, 159-166 (1993).  
Kumar et al., "Low Temperature Chemical Vapor Deposition of Hafnium Nitride—Boron Nitride Nanocomposite Films," Chem. Mater. 21(23), 5601-5606 (2009).

(Continued)

*Primary Examiner* — Joseph Miller, Jr.  
(74) *Attorney, Agent, or Firm* — Lathrop & Gage LLP

(57) ABSTRACT

The present invention provides methods for making structures, including nanosized and microsized thin film structures that exhibit a high degree of smoothness useful for applications in microelectronics. Deposition processing of the invention utilize smoothing agents capable of selectively adjusting the relative rates of processes involved in thin film formation and growth to access enhanced nucleation densities resulting in smooth thin film structures, including ultrathin (e.g., <10 nm) smooth films.

28 Claims, 26 Drawing Sheets

(56) References Cited

OTHER PUBLICATIONS

Kumar et al., "Growth Inhibition to Enhance Conformal Coverage in Thin Film Chemical Vapor Deposition," J. Am. Chem. Soc. 130(52), 17660-17661 (2008).
Schlote et al., "$SiO_2$ Films from Tetraethoxysilane-Based LPCVD: An Experimental Investigation of the By-Product-Inhibited Deposition Mechanism," J. Electrochem. Soc. 146(9), 3415-3419 (1999).
Weiller et al., "Effect of Dimethylamine on the Chemical Vapor Deposition of TiN from Tetrakis(dimethylamido)titanium and Ammonia," J. Electrochem. Soc., 144(3), L40-L43 (1997).
Weiller, "$HNMe_2$ Inhibits the Reaction of $Ti(NMe_2)_4$ with $NH_3$: Implications for the Chemical Vapor Deposition of TiN and Related Nitrides," Chem. Mater. 7(9), 1609-1611 (1995).
Yang et al., "CVD Growth Kinetics of $HfB_2$ Thin Films from the Single-Source Precursor $Hf(BH_4)_4$," Chem. Mater. 18(21), 5088-5096 (2006).
Ahmed et al. (2000) "CVD Diamond: Controlling Structure and Morphology," Vacuum 56:153-158.
Aron et al. (1982) "Some Properties of R.F.—Sputtered Hafnium Nitride Coatings," *Thin Solid Films*. 96:87.
Aspnes (1984) *Proc. Soc. Photo-Opt. Instrument. Eng.* 452:60-70.
Baker et al. (2011) "Nucleation and Growth of Pt Atomic Layer Deposition on $Al_2O_3$ Substrates Using (Methylcyclopentadienyl)-Trimethyl Platinum and $O_2$ Plasma," Journal of Applied Physics 109(8): 084333.
Bales et al. (1991) "Macroscopic Model for Columnar Growth of Amorphous Films by Sputter Deposition," *J. Vac. Sci. Technol. A.* 9(1):145-149.
Cote et al. (1999) "Plasma-Assisted Chemical Vapor Deposition of Dielectric Thin Films for ULSI Semiconductor Circuits," IBM J. Res. Dev. 43:5.
Crowell et al. (2003) "Chemical Methods of Thin Film Deposition: Chemical Vapor Deposition, Atomic Layer Deposition, and Related Technologies," *J. Vac. Sci. Technol. A* 21:S88.
Dresser et al. (1989) "The Adsorption and Decomposition of NH3, on Si(100)—Detection of the NH2(a) Species," *Surface Science*. 218(1):75-107.
Fix et al. (1991) "Chemical Vapor Deposition of Titanium, Zirconium, and Hafnium Nitride Thin Films," *Chem. Mater.* 3:1138-1148.
George (2010) "Atomic Layer Deposition: An Overview," *Chemical Reviews*. 110:111-131.
Gissler (1994) "Preparation and Characterization of Cubic Boron Nitride and Metal Boron Nitride Films," *Surf. Interface Anal.* 22:139-148.
Gordon et al. (2004) "Review of Recent Progress in Atomic Layer Deposition (ALD) of Materials for Micro- and Nano-Electronics," *Abstr. Pap. Am. Chem. Soc.* 227:U553.
Heitzinger et al. (2003) "Simulation of Arsenic in Situ Doping with Polysilicon CVD and its Application to High Aspect Ratio Trenches," *IEEE Tran. Comput. Aided. Design*. 22:285.
Hoffman (1994) "Chemical Vapour Deposition of Nitride Thin Films," *Polyhedron*.13:1169-1179.
Hofmann (1991) "Compositional Depth Profiling by Sputtering," *Prog. Surf. Sci.* 36:35-87.
Holzschuh (2004) "Deposition of Ti—B—N (Single and Multilayer) and Zr—B—N Coatings by Chemical Vapor Deposition Techniques on Cutting Tools," *Thin Solid Films*. 469:92-98.
Islamraja et al. (1991) "A 3-Dimensional Model for Low-Pressure Chemical-Vapor-Deposition Step Coverage in Trenches and Circular Vias," *J. Appl. Phys*. 70:7137.
Jayaraman et al. (2005) "Chromium Diboride Thin Films by Low Temperature Chemical Vapor Deposition," *J. Vac. Sci. Technol. A*. 23:631-633.
Jayaraman et al. (2005) "Hafnium Diboride Thin Films by Chemical Vapor Deposition from a Single Source Precursor," *J. Vac. Sci. Technol. A*. 23(6):1619-1625.
Jayaraman et al. (2006) "HfB2 and Hf—B—N Hard Coatings by Chemical Vapor Deposition," *Surf. Coat. Technol.* 200:6629-6633.
Jellison et al. (1996) "Parameterization of the Optical Functions of Amorphous Materials in the Interband Region," *Appl. Phys. Lett.* 69:371-373.
Johansson et al. (1984) "Structure of Reactively Magnetron Sputtered Hf—N Films," *Appl. Phys. Lett.* 44:670-672.
Kajikawa et al. (2005) *Applied Surface Science*. 245:281-289.
Karabacak et al. (2011) "Thin-film Growth Dynamics with Shadowing and Re-Emission Effects," *Journal of Nanophotonics*. 5(1):052501.
Kim (2006) "The Application of Atomic Layer Deposition for Metallization of 65 nm and Beyond," *Surface & Coatings Technology*. 200:3104-3111.
Kim et al. (2003) "Atomic Layer Deposition of Metal and Nitride Thin Films: Current Research Efforts and Applications for Semiconductor Device Processing," *J. Vac. Sci. Technol B* 21:2231.
Klaus et al. (2000) "$SiO_2$ Chemical Vapor Deposition at Room Temperature Using $SiCl_4$ and $H_2O$ with an $NH_3$ Catalyst," *Journal of the Electrochemical Society*. 147(7):2658-2664.
Kuech et al. (1991) "Facet Modulation Selective Epitaxy—A Technique for Quantum-Well Wire Doublet Fabrication," *J. Cryst. Growth* 107:116.
Kumar et al. (2009) "Remote Plasma Treatment of Si Surfaces: Enhanced Nucleation in Low-Temperature Chemical Vapor Deposition," *Applied Physics Letters*. 95:144107.
Kumar et al. (2009) "Low Temperature Chemical Vapor Deposition of Hafnium Nitride—Boron Nitride Nanocomposite Films," *Chemistry of Materials*. 21(23):5601-5606.
Kumar (Oct. 2009) "Control of Reaction Surface in Low Temperature CVD to Enhance Nucleation and Conformal Coverage," Thesis, University of Illinois at Urbana-Champaign.
Lim et al. (2003) "Atomic Layer Deposition of Transition Metals," *Nature Materials*. 2:749-754.
Nguyen (1999) "High-Density Plasma Chemical Vapor Deposition of Silicon-Based Dielectric Films for Integrated Circuits," *IBM J. Res. Dev.* 43:109.
Okada et al. (1999) "Adsorption and Desorption Kinetics of Tetrakis(Dimethylamino)Titanium and Dimethylamine on Tin Surfaces," 137:113-124.
Okorn-Schmidt (1999) "Characterization of Silicon Surface Preparation Processes for Advanced Gate Dielectrics," *IBM J. Res. Dev.* 43(3):351-365.
Panayiotatos et al. (2003) "Homogeneous and Amorphous Sputtered sp3-Bonded BN Films at RT: A Stress, Spectroscopic Ellipsometry and XPS Study," *Diam. Relat. Mat.* 12:1151-1156.
Perry et al. (1985) "An XPS Study of Hafnium Nitride Films," *Solid State Commun*. 56:837-841.
Perry et al. (1987) "Non-Stoichiometry Effects in the XPS Spectra of HfN Films," *Solid State Commun*. 62:23-26.
Peytavy et al. (1979) "A Study of Some Properties of Titanium Boronitride Used for the Coating of Cutting Tools," *Wear*. 52:89-94.
Rossnagel (1998) "Directional and Ionized Physical Vapor Deposition for Microelectronics Applications," *J. Vac. Sci. Technol. B* 16:2585.
Satta et al. (2002) "Growth mechanism and continuity of atomic layer deposited TiN films on thermal $SiO2$," *Journal of Applied Physics*. 92,7641-7646.
Schmid et al. (1998) "Optical and Electronic Properties of Sputtered TiNX Thin Films," *J. Vac. Sci. Technol. A*. 16:2870-2875.
Shacham-Diamand (2001) "Barrier Layers for Cu ULSI Metallization," *J. Electron. Mater*. 30:336-344.
Shim et al. (2002) "Bottom-up Filling of Submicrometer Features in Catalyst-Enhanced Chemical Vapor Deposition of Copper," *J. Electrochem. Soc*. 149:G109.
Singh et al. (1993) "Effect of Surface Re-Emission on the Surface Roughness of Film Growth in Low Pressure Chemical Vapor Deposition," *J. Vac. Sci. Technol. A*. 11:557-568.
Smith (1970) "Structure and Electrical Properties of Sputtered Films of Hafnium and Hafnium Compounds," *J. Appl. Phys*. 41:4227.
Sperling et al. (2004) "Simultaneous Short-Range Smoothening and Global Roughening During Growth of Hydrogenated Amorphous Silicon Films," *Appl. Phys. Lett*. 85:3456-3458.

(56) References Cited

OTHER PUBLICATIONS

Sperling et al. (2007) "Kinetic Roughening of Amorphous Silicon During Hot-Wire Chemical Vapor Deposition at Low Temperature," *Journal of Applied Physics*. 101(2):024915.

Takenaka (2004) "Anisotropic Deposition of Cu in Trenches by H-Assisted Plasma Chemical Vapor Deposition," *J. Vac. Sci. Technol. A* 22:1903.

Tauc et al. (1966) "Optical Properties and Electronic Structure of Amorphous Germanium," *Phys. Status Solidi*. 15:627-637.

Vereecken et al. (2005) "The Chemistry of Additives in Damascene Copper Plating," *IBM J. Res. Dev.* 49:3.

Watanabe et al. (2004) "Direct-Bandgap Properties and Evidence for Ultraviolet Lasing of Hexagonal Boron Nitride Single Crystal," *Nat. Mater*. 3:404-409.

Williams (1997) "Transition Metal Carbides, Nitrides, and Borides for Electronic Applications," *J. Miner. Met. Mater. Soc*. 49:38-42.

Wulu et al. (1991) "Simulation of Mass Transport for Deposition in Via Holes and Trenches," *J. Electrochem. Soc*. 138:1831.

Yang et al. (2006) "Crystalline Texture in Hafnium Diboride Thin Films Grown by Chemical Vapor Deposition," *J. Cryst. Growth*. 294:389-395.

Yang et al. (2007) "In Situ Spectroscopic Ellipsometry Analyses of Hafnium Diboride Thin Films Deposited by Single-Source Chemical Vapor Deposition," *J. Vac. Sci. Technol. A*. 25:200-206.

\* cited by examiner

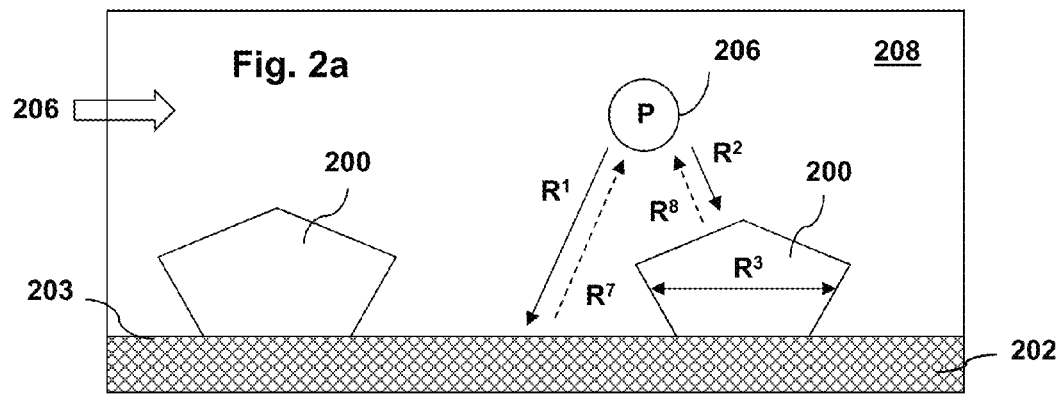
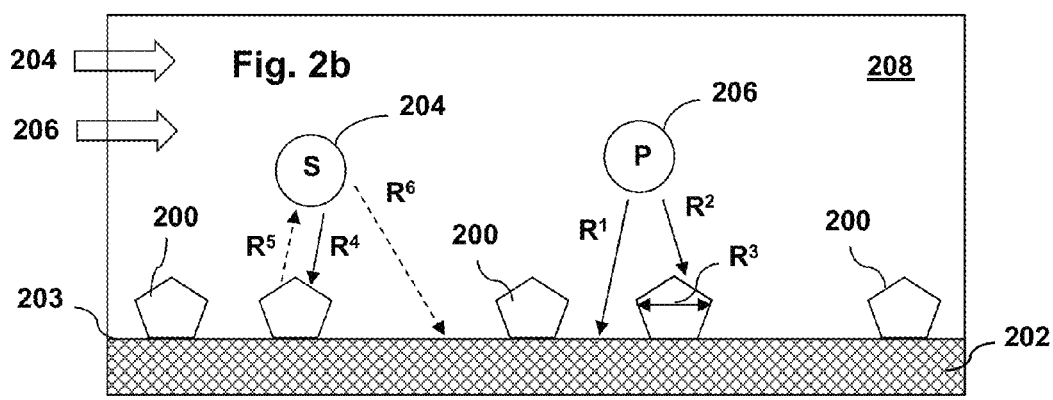
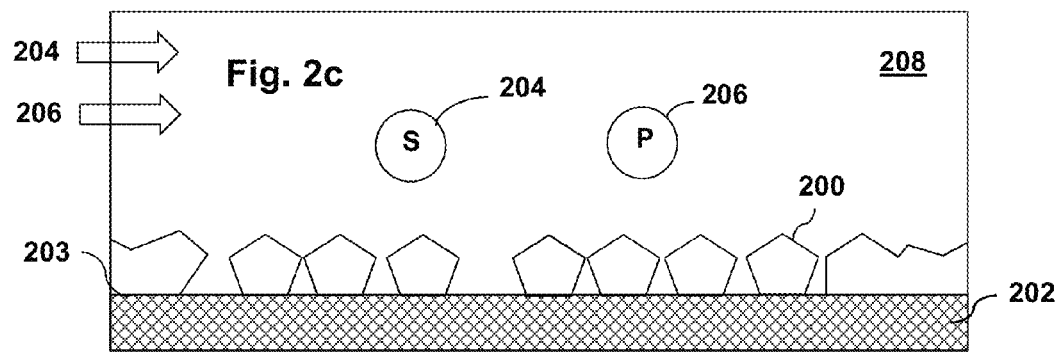
Figure 2

Roughness: 0.26nm

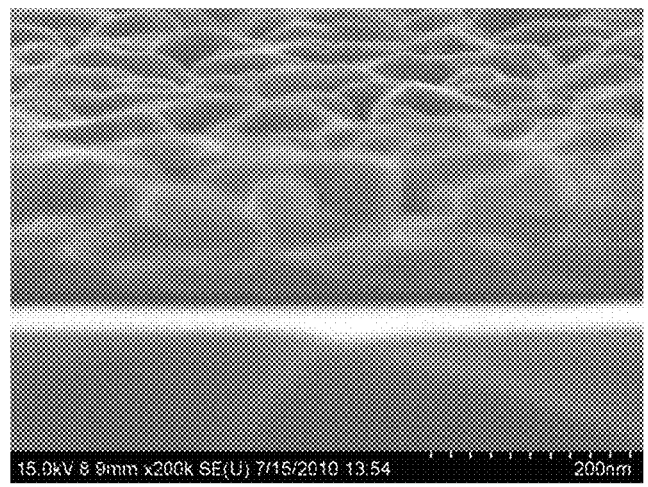
Cu(hfac)VTMS
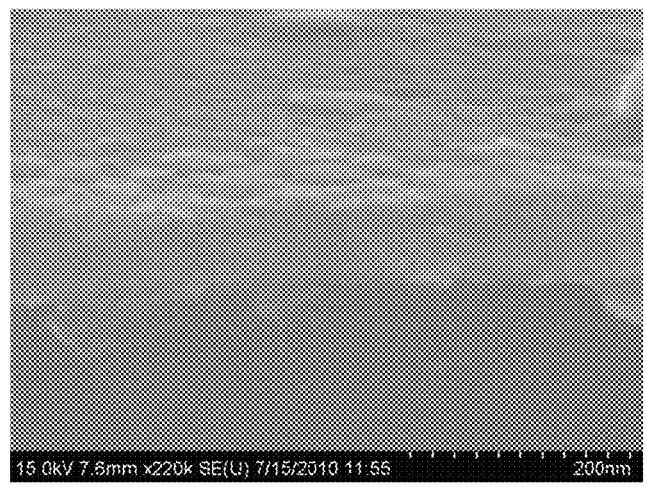
Cu(hfac)VTMS + VTMS
Figure 16

Cu(hfac)MHY (2.2 mTorr)

Cu(hfac)MHY+VTMS (3.6 mTorr)

(1) Cu(hfac)MHY+VTMS (3.6 mTorr)
(2) Cu(hfac)MHY (2.2 mTorr)

Cu(hfac)MHY+MHY (2.6 mTorr)

Cu(hfac)MHY+MHY (2.5(5) mTorr)

Aspect ratio (AR) = L/w

SMOOTHING AGENTS TO ENHANCE NUCLEATION DENSITY IN THIN FILM CHEMICAL VAPOR DEPOSITION

CROSS-REFERENCE TO RELATED APPLICATIONS

This application claims the benefit of priority from U.S. Provisional Patent Application No. 61/408,777, filed Nov. 1, 2010, which is hereby incorporated by reference in its entirety.

STATEMENT REGARDING FEDERALLY SPONSORED RESEARCH OR DEVELOPMENT

This invention was made, at least in part, with United States governmental support awarded by National Science Foundation Grant NSF CH 07-50422. The United States Government has certain rights in this invention.

BACKGROUND OF THE INVENTION

Substrate processing combining advanced lithographic processing and thin film deposition techniques enables fabrication and integration of device structures having dimensions ranging from 10s of nanometers to 10s of centimeters. Such state of the art material processing methods are generally compatible with a range of substrate and deposition materials, including high quality dielectric, semiconducting, conducting and biological materials. Given the degree of precision and versatility provided by these methods, substrate patterning techniques provide a robust fabrication platform for accessing a wide range of useful functional devices. For example, advanced lithographic processing and thin film deposition techniques play a central role in most semiconductor based technologies including, but not limited to, the manufacture of dense integrated circuits, memory devices, and microelectronic display systems. Furthermore, advanced lithographic processing and thin film deposition techniques also provide the primary fabrication platform for making micro- and nano-electromechanical (MEMS & NEMS) and micro- and nano-fluidic systems supporting a range of applications, including sensing.

Recent developments in lithographic processing, including deep ultraviolet photolithography, electron beam writing and X-ray lithography methods, continue to extend the applicability of these techniques for generating patterns of smaller and smaller structures on substrates. Advances in lithographic processing and etching techniques, for example, make it possible to generate high aspect ratio recessed features (e.g., aspect ratio>10:1 depth:width) having well defined nanometer and micron sized dimensions. High aspect ratio structures having these dimensions have potential to support densely packed device elements for future generations of microelectronic and nanoelectronic systems, such as diffusion barriers, insulator layers, and electrical contacts and interconnects. As target device dimensions continue to be reduced with the evolution of advanced lithography techniques, significant technical challenges are presented for conformally filling or coating such high aspect ratio nanometer and micron sized structures with functional materials. These challenges constitute a barrier to achieving the desired reduction of device dimensions in ultra-large scale integrated circuit (ULSI) architecture and the multilevel metallization therein.

To fabricate certain device components, a selected material or combination of materials is deposited onto recessed features, such as trenches or vias, patterned into a substrate surface that spatially defines and integrates the elements of the device. Deposition is commonly accomplished by exposure of the feature to a precursor gas or combination of precursor gases that condenses on, or reacts on or with, surfaces of the feature, to generate deposited layers that coat and/or fill the recessed feature with a functional material having selected properties. Important to providing device components exhibiting good electrical, mechanical, optical and/or other properties, is the ability to provide a highly smooth thin film structure, for example, a smooth film filling or coating recessed features in a continuous and conformal manner. For example, deposition methods are needed for some device applications that form a smooth thin film layer in or on the feature without voids or gaps in the bulk of the deposited material. Voids and gaps, such as pinholes, are undesirable because they affect the electronic and chemical properties of the deposited layer, such as inductance, resistivity and/or capacitance, thereby, potentially degrading overall device performance and undermining device uniformity. Further, voids and gaps in the bulk of the deposit or between the deposit and surfaces of the recessed feature also compromise overall mechanical integrity of the processed structure and may give rise to device failure. As an example, there is currently a need for processing techniques for making thin diffusion barriers without any pinholes or other gaps, as such device structures may fail if there is even a single pinhole allowing incompatible materials to penetrate—such as Cu in dielectric layers.

To address these challenges a number of processing strategies have been developed for coating or filling high aspect ratio recessed features for fabrication of a microelectronic device. While at least in part addressing some of the problems with processing high aspect ratio features, these techniques are not compatible with all types of deposition materials, substrates and recessed feature geometries. In addition, each technique presents its own set of limitations that impedes adoption and implementation.

Physical vapor deposition (PVD) encompasses a gamut of techniques including evaporation, sputtering and variants thereof. Due to the near-unity net sticking coefficient of the arriving flux in most PVD coating applications, the ability of PVD processes to coat high aspect ratio features uniformly is severely limited. Modified PVD processes, however, such as collimated sputtering and ionized PVD have been demonstrated to provide some limited success in coating and filling moderate aspect ratio ($\leq 5:1$) features. (See, S. M. Rossnagel, J. Vac. Sci. Technol. B 16 (1998) 2585).

Conventional thermal and plasma based chemical vapor deposition (CVD) processes typically perform well for moderate to low aspect ratio ($\leq 5:1$) structures. The success of these processes for coating higher aspect ratio features is largely dependent on operating in a regime in which the reactive species has a relatively low net sticking coefficient with respect to accommodation on the feature. (See, M. M. Islamraja, M. A. Cappelli, J. P. McVittie, K. C. Saraswat, J. Appl. Phys. 70 (1991) 7137; and H. C. Wulu, K. C. Saraswat, J. P. Mcvittie, J. Electrochem. Soc. 138 (1991) 1831.)

A modified approach, high density plasma (HDP) CVD and variants, employs physical erosion (sputtering) of the deposited material by high energy ions to remove material from the exposed surfaces, including the trench opening. (See, S. V. Nguyen, IBM J. Res. Dev. 43 (1999) 109; D. R. Cote, S. V. Nguyen, A. K. Stamper, D. S. Armbrust, D. Tobben, R. A. Conti, G. Y. Lee, IBM J. Res. Dev. 43 (1999) 5; and K. Takenaka, M. Kita, T. Kinoshita, K. Koga, M. Shirantani, Y. Watanabe, J. Vac. Sci. Technol. A 22 (2004), 1903).

The flux of high energy ions does not impinge on the lower side walls of the trench; hence the film grows at a greater net rate in lower regions of the trench. Film and substrate damage from high energy ions, however, can be a severe limitation in this process.

Another approach is selective deposition by CVD, which is based on the inability of the precursor to nucleate a film on one substrate material compared to another. This approach has been utilized to selectively grow films on recesses in a substrate. The CVD of tungsten (W) and of group III-V semiconductors from their halogen based precursors are examples in which films nucleate on a semiconductor substrate but not on a mask material such as $SiO_2$. (See, T. F. Kuech, M. S. Goorsky, M. A. Tischler, A. Palevski, P. Solomon, R. Potemski, C. S. Tsai, J. A. Lebens, K. J. Vahala, J. Cryst. Growth 107 (1991) 116; and K. C. Saraswat, S. Swirhun, J. P. McVittie, J. Electrochem. Soc. 131 (1984) C86). A nucleation layer at the bottom of a trench or, via can afford a bottom-up fill as demonstrated for Al-CVD. (See, L. Y. Chen, T. Guo, R. C. Mosley, F. Chen, Fully planarized dual damascene metallization using copper line interconnect and selective CVD aluminum plug, U.S. Pat. No. 6,537,905, Applied Materials Inc., 2003). Successful implementation of such approaches, however, depends on the ability to establish high density nucleation conditions necessary for generating a smooth thin film layer. Disadvantages of these techniques include the need for intermediate photolithographic steps to define a mask layer, and the need for mechanical polishing to remove unwanted seed layer.

Atomic Layer Deposition (ALD) is a technique with proven capability to coat aspect ratios exceeding 100:1. (See, R. G. Gordon, Abstr. Pap. Am. Chem. Soc. 227 (2004) U553; J. E. Crowell, J. Vac. Sci. Technol. A 21 (2003) S88; H. Kim, J. Vac. Sci. Technol. B 21 (2003) 2231; B. S. Lim, A. Rahtu, R. G. Gordon, Nat. Mater. 2 (2003) 749). The ALD process works by sequential exposure of the substrate to two or more different reactant gases (e.g., co-reactants) under the special condition that the surface reactions during each exposure are self-limiting. The film typically grows at a very slow rate (e.g. a fraction of a monolayer per cycle), and, therefore, the cycle time is limited by the rate at which each reactant can be filled into and emptied from the growth chamber (or the lower portion of the recessed structure, whichever is longer).

Electrochemical Deposition (ECD) is a well-established technique for coating surfaces and for filling deep features. This technique is commonly used to produce bottom-up growth of copper in trenches on ULSI circuits: differential plating kinetics are used to obtain "superconformal" or "super-filled" features. (See, P. M. Vereecken, R. A. Binstead, H. Deligianni, P. C. Andricacos, IBM J. Res. Dev. 49 (2005) 3). The differential plating kinetics are generated by using specific additives that segregate to the trench top or bottom and serve as either leveler (for differential inhibition of growth) or catalyst (for differential acceleration of growth). The net effect of ECD methods is a higher growth rate at the trench bottom.

Bottom-up copper CVD extends the idea in electrochemical deposition to CVD approaches. In copper CVD from hexafluoroacetylacetonate-copper-vinyltrimethylsilane, iodine is added as a catalytic-surfactant to enable a bottom-up fill. (See, K. C. Shim, H. B. Lee, O. K. Kwon, H. S. Park, W. Koh, S. W. Kang, J. Electrochem. Soc. 149 (2002) G109). In this method, iodine is provided as a growth promoter and has a concentration that rises inside the feature as the deposition proceeds.

Bottom-up growth was reported by Heitzinger et al. in the specific system of polysilicon deposition from silane (the CVD precursor) when arsine was added to the process gas. (See, C. Heitzinger, W. Pyka, N. Tamaoki, T. Takase, T. Ohmine, S. Selberherr, IEEE Tran. Comput. Aided. Design. 22 (2003) 285.). In this method, arsine acts as a growth suppressor and is also incorporated into the deposition layer. A high process temperature (700° C.) is required to ensure a high reaction rate for arsine. The authors modeled their trench coverage on the basis of depleting arsine concentration in the trench and conclude that the experimental conditions employed result in operation in the time limit domain. (See, page 291, paragraph 3). The time limit stems from the fact that the suppressor is re-emitted from the film surface at some rate and ultimately will diffuse to the bottom of the trench, despite the fact that it has a higher net sticking coefficient and lower concentration with respect to the precursor. In the time limit domain, the bottom-up growth only takes place before the suppressor arrives at the bottom of the via by diffusion. After that, the suppressor concentration saturates from top to bottom and yields equal growth rates at all locations inside the via. A significant disadvantage of the time domain techniques described in Heitzinger et al. is that coating/filling larger structures requires a longer time to build up the appropriate layer thickness; and, thus, the time-limit bottom-up growth will not work because the suppressor will reach the, bottom of the via before the structure is filled. Moreover, the time delay in these systems is very short (e.g. 54.25 s in FIGS. 8 and 23.92 s in FIG. 9 of Heitzinger et al.) and it is difficult to control such a short growth time during processing.

U.S. Pat. No. 7,592,254 discloses deposition techniques using a suppressor gas to generate a conformal or superconformal layer on a recessed feature. In some techniques of this reference, for example, a recessed feature is contacted with a flow of a deposition gas and a flow of a suppressor gas capable of accommodation on the surfaces of the recessed feature in a manner establishing a substantially steady state, anisotropic spatial distribution of the flux suppressor gas to the recessed feature. The flux of suppressor gas to the recessed feature generates suppressor on selected, localized regions of the surfaces of the recessed feature where suppression of the rate of deposition from the deposition gas is desired. U.S. Pat. No. 7,592,254 discloses processes useful for providing superconformal or bottom-up filling of recessed features, wherein the composition and flow rate of suppressor gas is selected such that the rate of deposition onto regions of the recessed feature proximate to (e.g. within about the upper one-third of the feature undergoing processing) the opening and/or in line-of-sight of a source of deposition gas is reduced. This reference further discloses processing wherein deposition preferentially occurs on the side surfaces of the recessed feature proximate to the bottom (e.g. below about the upper one-third of the feature undergoing processing), thereby allowing preferential deposition and growth of a conformal or superconformal layer onto the lower regions of the recessed feature. In some embodiments, for example, the suppressor gas is not desorbed in a form that is capable of subsequent re-accommodation on surfaces, so that it does not diffuse deeper into a high aspect ratio structure.

It will be appreciated from the foregoing that there is currently a need in the art for methods for making smooth thin film structures, including ultrathin smooth conformal films. In addition, methods are needed to enhance the smoothness of thin films for coating and filling recessed features, for example, in nanosized or microsized recessed features of a device substrate.

SUMMARY OF THE INVENTION

The present invention augments methods for making structures, including nanosized and microsized thin film structures that exhibit a high degree of smoothness useful for applications in microelectronics. Deposition processes of the invention utilize smoothing agents capable of selectively adjusting the relative rates of processes involved in thin film formation and growth to access enhanced nucleation densities resulting in smooth thin film structures, including ultrathin (e.g., <10 nm) smooth films. The invention provides methods for conformally coating and/or filling features of a substrate with a film, including high aspect ratio (e.g. aspect ratio>10) recessed features such as trench and/or via structures having nanosized vertical (e.g. depth) and/or lateral (e.g., width and length) dimensions. In an embodiment, for example, the present methods are useful for making thin films having a low surface roughness such as a root mean squared (rms) surface roughness less than or equal to 1 nm. In an embodiment, for example, the present methods enable formation of smooth thin film structures exhibiting substantially uniform densities (e.g., within 20%) that are substantially free of pinholes or other gaps (e.g., having a volume of void per area of film less than or equal to $1\times10^{-6}\,\mu m^3/\mu m^2$, or $1\times10^{-6}\,\mu m$) in the bulk or interface of the thin film and a device substrate. The present methods are compatible with a wide range of existing materials, processing techniques and processing conditions, and, thus, provide a versatile processing platform for making diverse classes of device structures, including diffusion barriers, dielectric layers and metallic layers, such as electrical contacts and interconnects. Methods of the present invention are useful for fabricating a range of functional electronic devices including integrated electronic circuits, macroelectronic devices and arrays, memory devices, display devices, sensors, MEMS & NEMS systems, photovoltaic devices, and micro- and nanofluidic systems.

In an aspect, the invention provides methods wherein the combination of a smoothing agent and a deposition precursor gas are provided during deposition processing to increase the density of nuclei that form on a substrate during thin film formation, wherein coalescence of the nuclei results in a smooth thin film structure. In an embodiment, for example, the invention provides methods wherein a precursor gas is provided in combination with a smoothing agent that suppresses the rate of growth of nuclei relative to the rate of generating new nuclei on a substrate surface. By selectively adjusting the relative rates of the formation and growth of nuclei, methods of some embodiments of the invention provide deposition conditions supporting formation and growth of densely spaced nuclei, for example, wherein the lateral spacing between nuclei is comparable to, or optionally smaller than, the desired thickness at which complete coalescence occurs (e.g., 0.5-10 nm). Use of a smoothing agent during deposition is particularly useful, for example, for making thin film structures exhibiting enhanced density and smoothness relative to conventional physical vapor deposition (PVD) and chemical vapor deposition (CVD) methods not employing a smoothing agent. This aspect of the invention enables fabrication of ultrathin (e.g., thickness≤100 nm, optionally≤20 nm, optionally≤5 nm) layers of functional materials exhibiting useful mechanical, electrical, chemical, optical and other properties. In some embodiments, for example, the composition and partial pressures of a smoothing agent(s) and a deposition precursor gas(es) are selected such that the smoothing agent selectively decreases the rate of nuclei growth relative to the rate of nuclei formation so as to achieve a smooth thin film having enhanced properties. In some embodiments, for example, the compositions and partial pressures of a smoothing agent and a deposition precursor gas(es) are selected such that the presence of the smoothing agent affects the physical properties (e.g., smoothness, density, conformality, etc.), but not the chemical composition, of the deposited thin film.

In an aspect, the invention provides a method for making a smooth layer on a substrate, the method comprising the steps of: (1) providing the substrate having a receiving surface; (2) contacting the receiving surface of the substrate with a precursor gas, wherein accommodation of the precursor gas by the substrate results in formation of nuclei of deposited material on the receiving surface of the substrate; (3) contacting the nuclei on the receiving surface with the precursor gas; wherein accommodation of the precursor gas by the nuclei, substrate or both the nuclei and the substrate results in growth of the nuclei at a growth rate; and (4) contacting the nuclei, the substrate or both the nuclei and the substrate with a smoothing agent, wherein accommodation of the smoothing agent by the nuclei, the substrate or both the nuclei and the substrate results in formation of the smooth layer on the substrate. In some methods simultaneous or sequential exposure of the substrate to a precursor gas and smoothing agent provides relative rates of nuclei formation and growth allowing for additional nuclei to fill in the uncovered portions of the receiving surface, thereby enhancing nucleation density. In an embodiment, for example, accommodation of the smoothing agent by the nuclei or the substrate decreases the growth rate sufficiently to form an average density of nuclei on the receiving surface of at least $1\times10^{11}\,cm^{-2}$.

The smooth layer formed by the present method, for example, has a surface roughness (rms) less than or equal to 1 nm. In an embodiment, for example, the smooth layer formed by the present method has a surface roughness (rms) selected over the range of 0.1 nm to 10 nm. In an embodiment, the smooth layer is a conformal thin film, and optionally is a superconformal thin film. In an embodiment, the smooth layer fills or coats one or more recessed features on the receiving surface of the substrate.

In an embodiment, the precursor gas comprises one or more chemical vapor deposition precursor gases or atomic layer deposition precursor gases. In an embodiment, the precursor gas condenses on and/or reacts with, or on, the substrate or the nuclei, for example, via chemical decomposition reaction(s), so as to generate deposited material. In an embodiment, the smoothing agent is a gas. In an embodiment, the steps of contacting the nuclei on the receiving surface with the precursor gas and contacting the nuclei, substrate or both the nuclei and substrate with the smoothing agent are carried out simultaneously. Alternatively, the invention includes methods wherein the steps of contacting the nuclei on the receiving surface with the precursor gas and contacting the nuclei, substrate or both the nuclei and substrate with the smoothing agent are carried out sequentially. In some embodiments, a method of the invention further comprises contacting the substrate, the nuclei or both with a co-reactant gas, such as a CVD or ALD co-reactant or precursor. In some embodiments, the step of contacting the substrate, the nuclei or both with a precursor and the step of contacting the substrate, the nuclei or both with a co-reactant gas are carried out simultaneously or sequentially, for example in a CVD process or an ALD process.

In aspect, the smoothing agent is an inhibitor gas. In an embodiment, for example, accommodation of the smoothing agent by the nuclei, the substrate or both the nuclei and the substrate decreases the growth rate of the nuclei sufficiently such that growth and coalescence of nuclei, including additional nuclei, on the substrate generates the smooth layer. In an embodiment, for example, accommodation of the smoothing agent by the nuclei, the substrate or both the nuclei and the substrate decreases the growth rate of the nuclei by a factor of at least 2 relative to a growth rate of the nuclei in the absence of the smoothing agent. In an embodiment, for example, accommodation of the smoothing agent by the nuclei, the substrate or both the nuclei and the substrate decreases the growth rate of the nuclei by a factor selected over the range of 2 to 100 relative to a growth rate of the nuclei in the absence of the smoothing agent. In an embodiment, for example, the precursor gas has a net sticking coefficient with respect to accommodation on the nuclei, wherein accommodation of the smoothing agent by the nuclei, the substrate or both the nuclei and the substrate results in a decrease of the net sticking coefficient of the precursor gas with respect to accommodation on the nuclei by a factor greater than or equal to 2. In an embodiment, for example, the precursor gas has a net sticking coefficient with respect to accommodation on the nuclei, wherein accommodation of the smoothing agent by the nuclei, the substrate or both the nuclei and the substrate results in a decrease of the net sticking coefficient of the precursor gas with respect to accommodation on the nuclei by a factor selected from the range of 2 to 1000, and optionally selected from the range of 2 to 100, and optionally selected from the range of 2 to 10.

In an embodiment, the method of the invention further comprises the step of stopping contacting the nuclei with the smoothing agent after formation of a smooth layer of a preselected thickness, such as a preselected thickness selected over the range of 0.5 nm to 50 nm, and optionally selected over the range of 0.5 nm to 10 nm. In an embodiment, the method of the invention further comprises growing the smooth layer after the step of stopping contacting the nuclei with the smoothing agent by contacting the smooth layer with the precursor gas in the absence of the smoothing agent. In an embodiment, methods of the present invention further comprise providing the substrate in a deposition chamber, providing a source of precursor gas in fluid communication with the substrate in the deposition chamber and providing a source of smoothing agent in fluid communication with the substrate in the deposition chamber.

An advantage of the present methods is the ability to generate high quality smooth and ultrathin film structures, for example, thin films having thicknesses less than or equal to 100 nanometers, optionally less than or equal to 20 nanometers, optionally less than 10 nanometers, and optionally less than 5 nanometers. In an embodiment, for example, the ultrathin smooth layer generated by the present methods has a thickness selected over the range of 0.3 nm to 20 nm. An advantage of the present methods is the ability to generate high quality ultrasmooth film structures, for example, having a surface roughness (rms) less than or equal to 20 nm, optionally a surface roughness (rms) less than or equal to 10 nm, and optionally a surface roughness (rms) less than or equal to 5 nm. In an embodiment, for example, the smooth layer generated by the present methods has a surface roughness (rms) selected over the range of 0.1 nm to 10 nm, and optionally a surface roughness (rms) selected over the range of 0.1 nm to 2 nm.

Use of a smoothing agent comprising an inhibitor gas is beneficial in some methods of the present invention for selectively adjusting the relative rates of processes involved in the nucleation, growth and coalescence of deposited materials, such as chemical vapor deposition and atomic layer deposition materials. In some aspects, for example, processing using an inhibitor gas provides control over the relative rates of formation and growth of nuclei on a substrate surface so as to access deposition conditions resulting in the formation of a smooth conformal layer, such as a smooth conformal thin film.

In the absence of a smoothing agent, such as an inhibitor gas, the formation and growth of nuclei is largely mediated by processes involving interaction of one or more precursor gases with the receiving surface of the substrate and the surfaces of nuclei formed on the substrate, such as accommodation by substrate surfaces and accommodation by the surfaces of nuclei present on the substrate (e.g., via physical adsorption, chemical adsorption, condensation, desorption, chemical reactions including decomposition reactions or other processes). Use of a smoothing agent in the present methods, however, provides an effective means of adjusting the relative rates of formation and growth of nuclei on a substrate surface, for example, by decreasing the rates of processes involved with nuclei growth. In some embodiments, for example, decreasing the growth rate of nuclei relative to the rate of nucleation results in a larger nucleation density on the substrate surface during deposition and film growth processes. In an embodiment, for example, accommodation of the smoothing agent by the nuclei decreases the nuclei growth rate sufficiently to form an average density of nuclei on the receiving surface of at least $1 \times 10^{11}$ $cm^{-2}$. As used herein, "density of nuclei" refers to the countable number of nuclei per area of the substrate; nuclei may be counted by the use of scientific techniques known in the art, for example, by atomic force microscopy or scanning tunneling microscopy. In an embodiment, for example, accommodation of the smoothing agent by the nuclei decreases the nuclei growth rate sufficiently to provide for coalescence of the thin film to occur at a thickness less than 5 nm, optionally at a thickness less than 1 nm, and optionally at a thickness less than 0.5 nm.

In some embodiments, for example, smoothing agent is accommodated by surfaces of the growing nuclei, thereby generating condensed phase species on, or within, the nuclei that decrease the rate of growth of the nuclei, for example, by decreasing the rate of accommodation of precursor gases by surfaces of the nuclei. In some embodiments, for example, interaction between the smoothing agent and the surfaces of the nuclei results in formation of condensed phase species on the surface and/or within the nuclei, such as species physisorbed on the surface of the nuclei, species chemisorbed on the surface of the nuclei and species on the surface of the nuclei that are products of reaction(s) of the smoothing agent and nuclei and/or decomposition of the smoothing agent. Such condensed phase species include condensed phase inhibitor species including stable species present on the surface of the nuclei and metastable species that undergo reaction and/or subsequent release to the gas phase. In some embodiments, processes of accommodation of the smoothing agent by the surfaces of the nuclei and loss of condensed phase species from the surfaces of the nuclei establish a steady state amount of condensed phase species on the nuclei, for example, a steady state amount of condensed phase species providing a decrease in the of rate of growth of nuclei relative to the rate of generation of new nuclei so as to generate a smooth layer on the substrate. In some embodiments, the presence of condensed phase species on the surface and/or in the bulk of nuclei function to increase the rates of chemical reactions resulting in reformation and subsequent desorption of precursor.

In some methods of the invention, smoothing agent is accommodated on the surface of growing nuclei and the presence of inhibitor species on the nuclei decreases the rate of nuclei growth in the presence of precursor gas. In an embodiment, for example, accommodation of the smoothing agent by the nuclei decreases the growth rate of the nuclei by a factor of at least 2 relative to a growth rate of the nuclei in the absence of the smoothing agent. In an embodiment, for example, accommodation of the smoothing agent by the nuclei decreases the growth rate of the nuclei by a factor selected over the range of 2 to 100 relative to a growth rate of the nuclei in the absence of the smoothing agent. As used herein, the expression "growth rate of the nuclei in the absence of the smoothing agent" refers to a growth rate under identical deposition conditions (e.g., composition and partial pressure of precursor gas(es), composition and temperature of substrate, carrier gas conditions, deposition chamber pressure etc.) with the exception that the smoothing agent is not present during deposition processing. In some methods, the composition and partial pressure of the smoothing agent and the composition and pressure of the precursor gas are selected to provide a preselected growth rate of the smooth layer. In an embodiment, accommodation of the smoothing agent and the precursor gas provides a steady state growth rate of the smooth layer and/or the nuclei on the substrate. Alternatively, the invention provides methods, for example, wherein accommodation of the smoothing agent and the precursor gas provides a non-steady state growth rate of the smooth layer and/or the nuclei on the substrate. In an embodiment, for example, accommodation of the smoothing agent and the precursor gas provides an average growth rate of the smooth layer equal to or less than 5 nm $min^{-1}$, and optionally equal to or less than 1 nm $min^{-1}$. In an embodiment, accommodation of the smoothing agent and the precursor gas provides an average growth rate of the nuclei equal to or less than 1 nm $min^{-1}$, and optionally equal to or less than 0.1 nm $min^{-1}$.

In some methods of the invention, the precursor gas has a net sticking coefficient with respect to accommodation on the nuclei, and accommodation of the smoothing agent by the nuclei results in a decrease of the net sticking coefficient of the precursor gas with respect to accommodation on the nuclei by a factor greater than or equal to 2, and optionally a factor greater than or equal to 100. In an embodiment, for example, accommodation of the smoothing agent by the nuclei results in a decrease of the net sticking coefficient of the precursor gas with respect to accommodation on the nuclei by a factor selected from the range of 2 to 100, and optionally selected from the range of 100 to 1000. Smoothing agents of the invention are useful for decreasing the relative rates of growth of nuclei with respect to the rate of formation of new nuclei (i.e., the nucleation rate). For some applications, therefore, the compositions and partial pressures of the precursor gas, smoothing agent and substrate are selected such that the presence of inhibitor does not substantially affect the rate of formation of new nuclei (e.g., changes in nucleation rate less than 20% due to presence of smoothing agent). In an embodiment, for example, the presence of smoothing agent does not decrease the net sticking coefficient of the precursor gas with respect to accommodation by the substrate by more than a factor of 1.5, and optionally by more than a factor of 10.

The present methods are applicable to precursor gases and precursor gas partial pressure useful in a range of deposition techniques, including CVD precursor gases and partial pressures, and partial pressures and ALD precursor gases and partial pressures. In an embodiment, for example, the precursor gas is selected from the group consisting of hydrides, borohydrides, halides, oxides, chalcogenides, nitrides, pnictides, alkyls, aryls, allyls, cyclopentadienyls, alkenes, arenes, silyls, amides, amidinates, amines, phosphides, phosphines, arsines, diazines, alkoxides, alcohols, ethers, siloxides, carboxylates, beta-diketonates, thiolates, selenolates, and tellurolates.

In an embodiment, the precursor gas comprises $Hf(BH_4)_4$, Cu(hfac)(vtms), Cu(hfac)(mhy), $Cu(tmod)_2$, $Ti(BH_4)_3(dme)$, or $Zr(BH_4)_4$. In an embodiment, for example, the precursor gas has a partial pressure selected from the range of $1 \times 10^{-4}$ mTorr to 20 mTorr.

In some methods, the precursor gas has a relatively large net sticking coefficient with respect to accommodation on the substrate, for example a net sticking coefficient equal to or greater than $1 \times 10^{-6}$. Use of a precursor gas with a relatively large net sticking coefficient with respect to the substrate is useful in some embodiments so as to provide a rate of nucleation useful for making thin film structures. In an embodiment, for example, the precursor gas has a net sticking coefficient with respect to accommodation on the substrate selected over the range of $1 \times 10^{-6}$-1. In some methods, the precursor gas has a relatively large net sticking coefficient with respect to accommodation on the nuclei in the absence of inhibitor, for example a net sticking coefficient with respect to accommodation on the nuclei in the absence of inhibitor equal to or greater than $1 \times 10^{-6}$. In an embodiment, for example, the precursor gas has a net sticking coefficient with respect to accommodation on the nuclei in the absence of inhibitor selected over the range of $1 \times 10^{-6}$-1.

Smoothing agents of the invention are accommodated by the surface of nuclei and/or the substrate and selectively adjust the relative rates of processes involved in nucleation and thin film growth, for example to enhance the density of nuclei in a manner resulting in formation of a smooth layer. In some embodiments, for example, the smoothing agent is an inhibitor gas that is accommodated on the surface of nuclei, thereby generating inhibitor species in the condensed phase on or in the nuclei capable of reducing the growth rate of the nuclei. A range of smoothing agents are useful in the present invention including molecular species, atomic species, ionic species and activated species (e.g., electronically excited species, plasma generated species, etc.). In an embodiment, the smoothing agent is a neutral molecule. In an embodiment, the smoothing agent is an electron donor molecule. In an embodiment, the smoothing agent comprises $NH_3$, $H_2O$, vtms, H(hfac), H(tmod), MHY or dme. In an embodiment, the smoothing agent is $NH_3$, $HNR^1R^2$, $H_2N\ R^1$, or $H_2O$, where each of $R^1$ and $R^2$ is independently H or $C_1$-$C_{10}$ alkyl, and optionally H or $C_1$-$C_6$ alkyl, and optionally H or $C_1$-$C_3$ alkyl. In an embodiment, the smoothing agent is $NH_3$. In some embodiments, the smoothing agent is not incorporated into the smooth film. In an embodiment, accommodation of the inhibitor by the nuclei does not change the thin film stoichiometry or introduce nitrogen, sulfur, carbon, halogens and/or oxygen atoms into the growing smooth thin film.

The partial pressures of smoothing agent determine, in part, the rate of accommodation of smoothing agent to nuclei on the substrate, and/or the steady state amount of condensed phase species, such as inhibitors, on the nuclei present in the condensed phase during deposition processing. Accordingly, selection of the smoothing agent partial pressure in some methods determines, in part, the extent of the reduction in the growth rate of nuclei. In an embodiment, for example, the smoothing agent has a partial pressure selected from the range of $1 \times 10^6$ mTorr to 50 mTorr, optionally selected from the range of $1 \times 10^{-4}$ mTorr to 20 mTorr, and optionally selected from the range of $1 \times 10^{-4}$ mTorr to 10 mTorr.

In some methods, the smoothing agent has a relatively large net sticking coefficient with respect to accommodation on the surfaces of the nuclei, for example, a net sticking coefficient with respect to accommodation on the nuclei greater than or equal to $1\times10^{-6}$, and optionally greater than or equal to $1\times10^4$. In an embodiment, for example, the smoothing agent has a net sticking coefficient with respect to accommodation on the nuclei selected over the range of $1\times10^{-6}$-1, and optionally selected over the range of 0.01-1. In some methods, the smoothing agent is not appreciably taken up by the substrate in the absence of nuclei.

In some embodiments, the combination of precursor and smoothing agent is selected on the basis of the desired composition, chemical properties and physical properties of the thin film structure generated. In an embodiment, for example, the smoothing agent and the precursor gas are a combination selected from the group consisting of: $NH_3$ and $Hf(BH_4)_4$ for making $HfB_2$ films; vtms and Cu(hfac)(vtms) for making Cu films; H(tmod) and $Cu(tmod)_2$ for making Cu films [in $CO_{2(l)}$]; and dme and $Ti(BH_4)_3$(dme) for making $TiB_2$ films:

The present methods are useful for processing substrates having a range of compositions, geometries and morphologies. In an embodiment, for example, the substrate comprises a material selected from the group consisting of a dielectric, a conductor, a semiconductor or a polymer. In an embodiment, the substrate is a crystalline substrate. In an embodiment, the substrate is a dielectric substrate such as a polymer substrate or a metal oxide or a semiconductor oxide such as $SiO_2$. In an embodiment, for example, the substrate is at a temperature less than or equal to 600° C., and optionally a temperature less than or equal to 350° C. In an embodiment, for example, the substrate is at a temperature selected from the range of 175° C. to 600° C. In an embodiment, the substrate is provided in a deposition chamber, and optionally the smoothing agent and precursor gas(es) are simultaneously injected into the deposition chamber.

The present methods are useful for processing substrates having a receiving surface with one or more features, such as recessed and relief features. For example methods of the invention are useful for conformally coating and/or filling a recessed feature having an opening, a bottom surface and side surfaces extending from the opening to the bottom surface, such as a trench, trough, slit, channel, via, hole, void, pore and depression. In an embodiment, the invention provides methods for conformally coating and/or filling high aspect ratio features of a substrate, such as recessed features having an aspect ratio greater than or equal to 10, and optionally an aspect ratio greater than or equal to 50, and optionally an aspect ratio greater than or equal to 100. The present methods are useful for processing porous substrates having a receiving surface with a plurality of pores extending into the substrate.

The invention provides methods of making a smooth layer by chemical vapor deposition or atomic layer deposition. In an embodiment, the method is carried out in a deposition chamber, such as a vacuum deposition chamber, CVD deposition chamber, ALD deposition chamber, sputtering deposition chamber or evaporative deposition chamber. In an embodiment, the method comprises simultaneously flowing or otherwise injecting precursor gas(es) and smoothing agent(s) into the chamber. In an embodiment, the method comprises flowing precursor gas(es), smoothing agent(s) and a carrier gas(es) into the chamber. In an embodiment, the deposition chamber is substantially free of gases other than the precursor gas(es), smoothing agent(s) and carrier gas(es). In an embodiment, the steps of contacting the substrate and nuclei with precursor gas and smoothing agent comprise gas phase deposition processing, for example, involving contacting a substrate with gas phase precursor(s) and smoothing agent(s). In an embodiment, the present methods are carried out in the absence of an applied electric field. In an embodiment, for example, the invention provides a method of making a diffusion barrier, insulator layer or metallic layer in an electronic device. In an embodiment, for example, the invention provides a method of making a continuous thin film substantially free of pin holes and void regions (e.g., less than 1 pin hole or void region per $cm^2$, and optionally less than 1 pin hole or void region per $\mu m^2$).

Methods of the invention include processes wherein a substrate or material on a receiving surface of a substrate is contacted with one or more precursor(s) and smoothing agents provided in the gas phase. In an embodiment, for example, the present methods involve deposition and/or accommodation of a gas phase precursor(s) and/or a gas phase smoothing agent(s) on a substrate surface, nuclei on a substrate surface or a thin film on a substrate surface. In an embodiment, for example, the present methods involve a nucleation process that is initiated by and/or controlled by deposition or accommodation of a gas phase precursor(s) and/or a gas phase smoothing agent(s) on a substrate surface, nuclei on a substrate surface or a thin film on a substrate surface. In an embodiment, the methods of the present invention do not involve deposition or accommodation of precursor(s) and smoothing agent(s) provided to a substrate in the condensed phase (e.g., in a solution). In an embodiment, the methods of the present invention do not involve an electrochemical deposition or accommodation process. In an embodiment, the methods of the present invention do not involve electrochemical deposition or update of precursor(s) and/or smoothing agent(s) provided in the condensed phase.

In an aspect, the invention provides a method of enhancing a nucleation density of a thin film deposited on a substrate, the method comprising the steps of: (1) providing the substrate having a receiving surface; (2) contacting the receiving surface of the substrate with a precursor gas, wherein accommodation of the precursor gas by the substrate results in formation of nuclei of deposited material on the receiving surface of the substrate; (3) contacting the nuclei on the receiving surface with the precursor gas; wherein accommodation of the precursor gas by the nuclei, substrate or both the nuclei and the substrate results in growth of the nuclei at a growth rate; and (4) contacting the nuclei, the substrate or both the nuclei and the substrate with a smoothing agent, wherein accommodation of the smoothing agent by the nuclei, the substrate or both the nuclei and the substrate results in enhancement of the nucleation density of the thin film deposited on the substrate. In an embodiment, for example, the nucleation density of the thin film is greater than or equal to $1\times10^{11}$ $cm^{-2}$. In an embodiment, for example, the thin film coalesces at a thickness less than or equal to 5 nm and optionally less than or equal to 1 nm and optionally less than or equal to 0.5 nm. In an aspect, the nucleation density of the thin film is enhanced relative to equivalent deposition conditions but in the absence of smoothing agent, for example, enhanced by a factor of at least 2 and optionally enhanced by a factor of at least 100.

In an aspect, the invention provides a method for making a smooth $HfB_2$ layer on a substrate, the method comprising the steps of: (1) providing the substrate having a receiving surface; (2) contacting the receiving surface of the substrate with $Hf(BH_4)_4$ gas, wherein accommodation of the $Hf(BH_4)_4$ gas by the substrate results in formation of $HfB_2$ nuclei on the receiving surface of the substrate; (3) contacting the $HfB_2$ nuclei on the receiving surface with the $Hf(BH_4)_4$ gas; wherein accommodation of the $Hf(BH_4)_4$ gas by the $HfB_2$ nuclei, substrate or both the $HfB_2$ nuclei and substrate results in growth of the $HfB_2$ nuclei at a growth rate; and (4) contacting the $HfB_2$ nuclei, the substrate or both the $HfB_2$ nuclei and the substrate with $NH_3$ gas, wherein accommodation of the $NH_3$ gas by the $HfB_2$ nuclei, substrate or both $HfB_2$ nuclei and substrate results in formation of the smooth $HfB_2$ layer on the substrate. In an embodiment, accommodation of the $NH_3$ gas by the $HfB_2$ nuclei, substrate or both $HfB_2$ nuclei and substrate decreases the growth rate of the $HfB_2$ nuclei sufficiently such that growth and coalescence of $HfB_2$ nuclei, including additional $HfB_2$ nuclei, generates the smooth $HfB_2$ layer on the substrate. In an embodiment, the steps of contacting the receiving surface of the substrate with a $Hf(BH_4)_4$ gas, contacting the $HfB_2$ nuclei and the receiving surface with the $Hf(BH_4)_4$ gas; and contacting the $HfB_2$ nuclei on the receiving surface with an $NH_3$ gas are carried out simultaneously. In an embodiment, the substrate is $SiO_2$. In an embodiment, the method is optionally carried out at a temperature selected over the range of 175-350° C. In an embodiment, the partial pressure of $Hf(BH_4)_4$ gas is selected over the range of $1 \times 10^{-4}$ mTorr to 50 mTorr and the partial pressure of $NH_3$ gas is selected over the range of $1 \times 10^{-4}$ mTorr to 20 mTorr.

In an aspect, the invention provides a method for making a smooth layer on a substrate, the method comprising the steps of: providing the substrate having a receiving surface; contacting the receiving surface of the substrate with a precursor gas, wherein accommodation of the precursor gas by the substrate results in formation of nuclei of deposited material on the receiving surface of the substrate; contacting the nuclei on the receiving surface with the precursor gas; wherein accommodation of the precursor gas by the nuclei, substrate or both the nuclei and the substrate results in growth of the nuclei at a growth rate; contacting the nuclei, the substrate or both the nuclei and the substrate with a smoothing agent, wherein accommodation of the smoothing agent by the nuclei, the substrate or both the nuclei and the substrate results in formation of the smooth layer on the substrate; stopping contacting the nuclei with the smoothing agent after formation of a smooth layer of a preselected thickness; and growing the smooth layer after the step of stopping contacting the nuclei with the smoothing agent by contacting the smooth layer with the precursor gas in the absence of the smoothing agent. In an embodiment, the preselected thickness forms a continuous layer having a surface roughness (rms) that is sufficient to promote uniform thin film growth of a smooth conformal or superconformal film on the surface of the continuous layer. In an embodiment, the preselected thickness may be selected over the range of 0.5 nm to 50 nm, optionally selected over the range of 0.5 nm to 20 nm, and optionally selected over the range of 0.5 nm to 10 nm. In an embodiment, the preselected thickness may be less than or equal to 50 nm. In an embodiment, growth of the smooth layer after the step of stopping contacting the nuclei with the smoothing agent produces the smooth layer having a total thickness greater than or equal to 1 nm or selected over the range of 1 nm to 1 mm, optionally selected over the range of 1 nm to 1 µm, optionally selected over the range of 1 nm to 500 nm, optionally selected over the range of 1 nm to 250 nm, and optionally selected over the range of 1 nm to 100 nm.

Without wishing to be bound by any particular theory, there can be discussion herein of beliefs or understandings of underlying principles or mechanisms relating to the invention. It is recognized that regardless of the ultimate correctness of any explanation or hypothesis, an embodiment of the invention can nonetheless be operative and useful.

BRIEF DESCRIPTION OF THE DRAWINGS

FIGS. 2a, 2b and 2c provide schematic diagrams illustrating deposition processing in a method involving exposure of a substrate to a precursor gas (2a) and a method involving simultaneous exposure of a substrate to a precursor gas and a smoothing agent (2b and 2c).

FIG. 16. SEM micrographs of copper films grown on copper oxide substrates from (a) Cu(hfac)VTMS precursor alone and (b) Cu(hfac)VTMS precursor together with a VTMS smoothing agent.

DETAILED DESCRIPTION OF THE INVENTION

Figure 1:
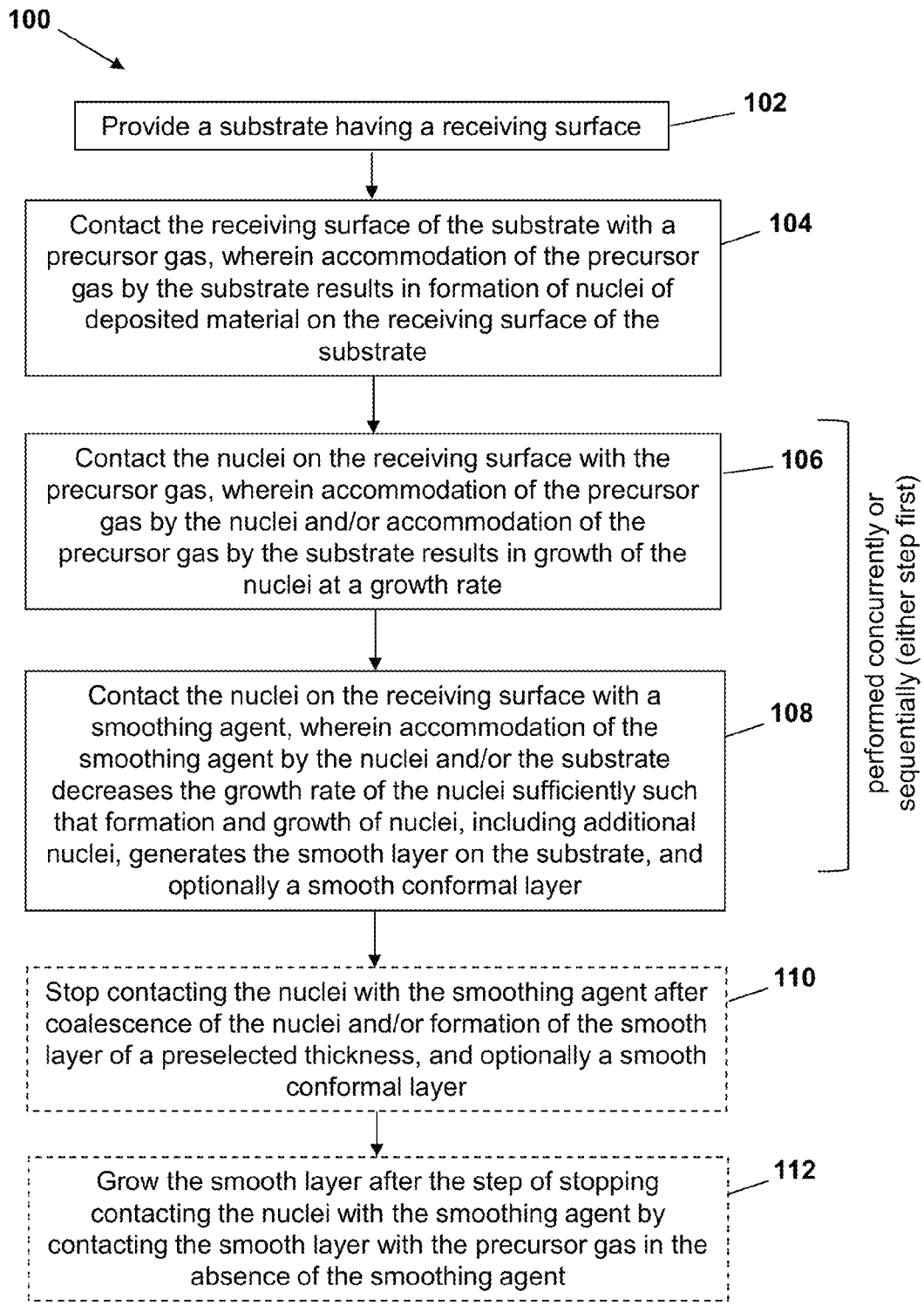
FIG. 1 is a schematic providing a process flow diagram of methods of the invention for making smooth thin film structures.

Referring to the drawings, like numerals indicate like elements and the same number appearing in more than one drawing refers to the same element. In addition, hereinafter, the following definitions apply:

"Molecule" refers to a collection of chemically bound atoms with a characteristic composition. As used herein, a molecule can be neutral or can be electrically charged, such as singly charged and multiply charged ions.

"Conformal layer" refers to the physical characteristics of a layer of deposited material, for example, a thin film structure deposited on a substrate. In an embodiment, a conformal layer lacks pinholes, gaps or voids having a volume larger than about $1 \times 10^{-6}$ μm³ within the bulk phase of the conformal layer or positioned between the layer and the surface(s) of a feature coated by the layer. In some embodiments, conformal layers have uniform thickness at any surface of the layer (e.g., with variation less than about 20%). In some embodiments, conformal layers have uniform density throughout the layer (e.g., with variation less than about 20%). Conformal layers in the present invention may have a uniform composition throughout the layer or may have a composition that varies through all or a portion of the layer. The term "superconformal" refers to the result in which the thickness of coating on the bottom of the feature proximate to the bottom of the feature is larger than the thickness of coating on a surface immediately outside of the feature adjacent to its opening.

"Aspect ratio" is a physical characteristic of a feature, such as a recessed feature, equal to the depth of the feature divided by a physical dimension defining the opening size of the feature (i.e. a cross sectional dimension (width or diameter) of the opening). Methods of the present invention are well suited for conformally or superconformally coating and/or uniformly filling high aspect ratio recessed features.

"Feature" refers to a three-dimensional structure or structural component of a substrate. Features may be recessed in which they extend into a substrate surface or may be relief features embossed on a substrate surface. Features include, but are not limited to, trenches, cavities, vias, channels, posts, slots, stands, columns, ribbons, pores, holes, apertures or any combination of these. Features include pores, channels, holes, cavities and apertures in porous and/or fibrous substrates.

"Accommodation" refers to the processes involved with the loss and/or uptake of a gas to a surface or bulk phase. As used herein, accommodation includes a range of chemical and physical processes involving gas molecules, atomic species and ions and a surface. For example, accommodation may include physisorption, chemisorption, decomposition, chemical reaction, and condensation processes. Accommodation includes reactions of gas molecules, including gas molecules adsorbed or otherwise condensed on a surface, and condensed phase species present on a surface and/or present in the bulk phase.

Figure 3:
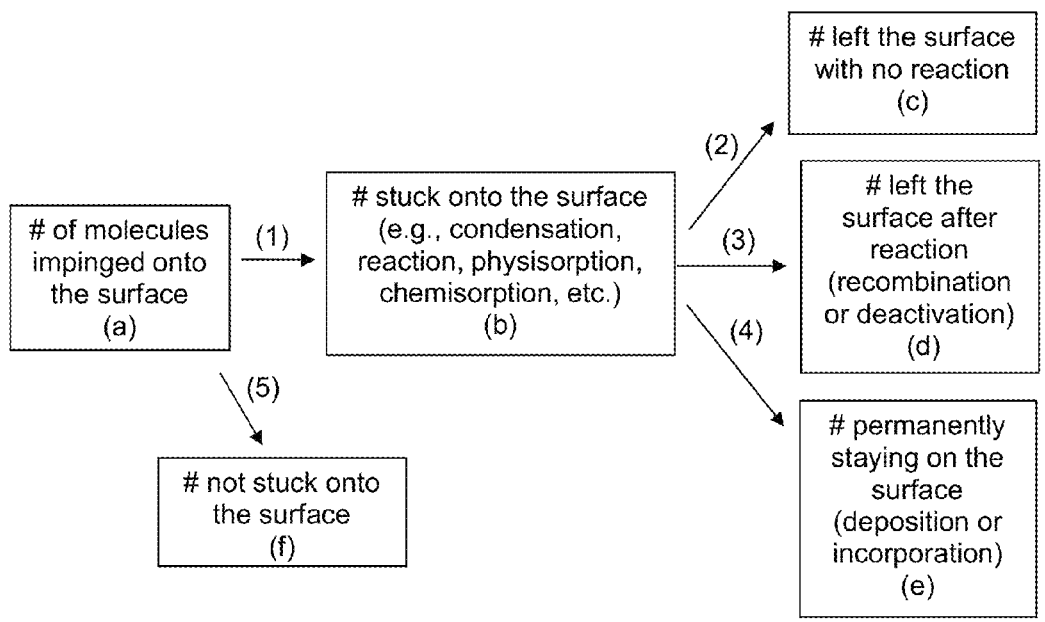
FIG. 3 provides a flow diagram illustrating a range of interrelated physical and chemical processes involved in uptake and reaction of gas phase materials (such as smoothing agent(s) and/or precursor gas(es)) with surfaces (e.g., substrate surfaces or the surfaces of nuclei).

"Net sticking coefficient" and "net accommodation coefficient" are used synonymously in the present description, and refer to a characteristic of a material, such as a smoothing agent or precursor gas, that is the fraction of collisions of an atom or molecule with a surface that result in accommodation (including reactive or non-reactive uptake) by the surface. Thus, the net sticking coefficient is the probability that a molecule or atom colliding with a surface will be lost from the gas phase to the surface or bulk phase. In this context, "lost to the surface" is intended to broadly encompass a wide range of chemical and physical processes including reactive loss, condensation, physi-adsorption, chemi-adsorption and other forms of surface trapping. FIG. 3 provides a flow diagram illustrating a range of physical and chemical processes involved in uptake and reaction of gas phase materials with surfaces. Using fundamental principles (e.g. mass balance coefficients), a and b can be related to coefficients c, d and e by the following expressions:

$$a = b + f;  \text{and}$$

$$b = c + d + e.$$

Surface reaction probability or surface consumption rate is related to these parameters by the expression:

$$\text{Surface Reaction Probability or Surface Consumption Rate} = (d+e)/a.$$

"Flux" refers to the number of molecules or atoms that impinge upon (e.g. collide or otherwise interact with) a surface or that pass through a given area of space per unit time per unit area. Flux may be expressed in units of (number s$^{-1}$ cm$^{-2}$), and is provided by the equation:

$$\text{Flux} = \frac{(\text{\# of molecules impinged on the surface})}{\text{time} \times \text{area}}$$

"Smoothing agent" refers to molecules and/or atomic species that selectively adjust the relative rates of chemical and/or physical processes involved in the nucleation, formation and growth of layers, such as thin film structures, generated by the deposition and/or accommodation of precursors (and optionally co-reactants), so as to generate a smooth layer. Some smoothing agents of the invention are accommodated by the surfaces of nuclei and/or the substrate and selectively adjust the relative rates of processes involved in nucleation, coalescence and thin film growth, for example, to enhance the density of nuclei in a manner resulting in formation of a smooth layer. In an embodiment, for example, a smooth agent of the invention functions as a nucleation density enhancing agent. In an embodiment, for example, accommodation of a smoothing agent on a substrate surface and/or the surfaces of nuclei on a substrate selectively adjusts the relative rates of nucleation and growth of the nuclei. In an embodiment, accommodation of a smoothing agent on a substrate surface and/or the surfaces of nuclei on a substrate selectively adjusts the relative rates of nucleation and growth of a thin film on a surface(s) of the substrate. Smoothing agents include gases, such as inhibitor gases. In an embodiment, accommodation of a smoothing agent on a substrate surface and/or the surfaces of nuclei on a substrate decreases the growth rate of nuclei and/or a thin film on a surface of the substrate. In some methods of the invention, the smoothing agent is not provided to the substrate surface in the condensed phase (e.g., a solution).

"Inhibitor gases" include atomic species, molecular species, ionic species or combinations of these that interact with the surfaces of nuclei formed from deposition of a precursor gas to a substrate in a manner so as to decrease the rate of growth of the nuclei relative to that of the rate of formation of new nuclei. In an embodiment, an inhibitor gas reduces the rate of nuclei growth, for example by decreasing the rate of accommodation of precursor gas, and optionally does not significantly affect (e.g., changes less than 20%) the rate of nucleation. Some inhibitor gases of the invention are accommodated by the surfaces of nuclei to generate inhibitor species in the condensed phase on, or within, the nuclei, wherein the presence of such inhibitor species decreases the rate of accommodation of precursor gas by the surface of the nuclei. In some embodiments, for example, interaction between the inhibitor gas and the surfaces of the nuclei results in formation of inhibitor species on the surface and/or within the nuclei, such as inhibitor species physisorbed on the surface of the nuclei, inhibitor species chemisorbed on the surface of the nuclei and inhibitor species on the surface of the nuclei that are products of reaction of the inhibitor gas and nuclei. Inhibitor species include stable species present on the surface of the nuclei and metastable species that undergo reaction and/or are subsequently reintroduced into the gas phase. In some embodiments, processes of accommodation of the inhibitor gas by the surfaces of the nuclei and loss of inhibitor species from the surfaces of the nuclei establish a steady state amount of inhibitor species on the nuclei, for example, a steady state amount of inhibitor species providing a decrease in the rate of growth of nuclei relative to the rate of generation of new nuclei so as to generate a smooth conformal layer on the substrate. Inhibitor gases useful in the present invention may reduce the rate of nuclei growth by decreasing the net sticking coefficient of a precursor gas on the surface of growing nuclei. Inhibitor gases may be neutral or possess an electric charge (i.e. an ion).

As used herein, the phrase "density of nuclei" or the term "density", when it refers to nuclei on a surface, refers to areal density, i.e., density over a two-dimensional area, quantified as the number of nuclei per unit area.

The term "physical dimension" or "dimension" refers to a physical characteristic of a structure, feature of a structure or pattern of structures or features that characterizes how the structure, features or pattern of structures or features is oriented in two or three dimensions and/or occupies space. Physical dimensions of structures, features of structures or patterns of structures or features include, length, width, height, depth, radius, radius of curvature and periodicity. "Nanosized" refers to a physical dimension ranging from 1 nm to 1000 nm and "microsized" refers to a physical dimension ranging from 1 µm to 1000 µm.

"Smooth" refers to a property of a thin film relating to the extent of vertical deviations of a real surface from its ideal form, such as a planar geometry of a thin film. In an embodiment, a smooth film has a low surface roughness, such as a surface root mean squared (rms) surface roughness less than or equal to 20 nm, and in some embodiments a surface root mean squared (rms) surface roughness less than or equal to 10 nm. In an embodiment, an ultrasmooth film has a very low surface roughness, such as a surface root mean squared (rms) surface roughness less than or equal to 1 nm.

"Precursor gas" refers to molecules or atoms that interact with a receiving surface of a substrate in a manner that forms nuclei and/or a deposited layer (i.e. undergoes deposition), such as a thin film layer. Precursor gases interact with a receiving surface, for example, via accommodation to result in nucleation and growth of nuclei. Precursor gases may also interact with the surfaces of nuclei, for example, via accommodation to result in growth of nuclei. Useful precursor gases, for example, are CVD or ALD precursors that react with the surfaces of a substrate to generate a deposited layer having a desired composition via a chemical vapor deposition process or atomic layer deposition process. Alternatively, other useful precursor gases are PVD gases that condense on a substrate surface, are physi-adsorbed and/or are chemi-adsorbed on a substrate surface via a physical vapor deposition process. Useful precursor gases include, but are not limited to, pure elements, and compounds that are combinations of elements (including hydrogen) with one or more of the following functional groups: hydrides, borohydrides, halides, oxides, chalcogenides, nitrides, pnictides, alkyls, aryls, allyls, cyclopentadienyls, alkenes, arenes, silyls, amides, amidinates, amines, phosphides, phosphines, arsines, diazines, alkoxides, alcohols, ethers, siloxides, carboxylates, beta-diketonates, thiolates, selenolates, and tellurolates. The present invention includes methods simultaneously exposing a substrate to a plurality of precursor gases, and methods wherein different precursor gases are sequentially exposed to a substrate undergoing processing (i.e. a first precursor gas(es) is replaced with different precursor gas(es) during processing).

"Fluid communication" refers to the configuration of two or more elements such that a fluid, such as a gas, is capable of flowing in the gas phase or via surface diffusion from one element to another element. Elements may be in fluid communication via one or more additional elements such as openings, tubes, channels, valves, pumps or any combination of these.

"Substrate" refers to a material, layer or other structure having a surface, such as a receiving surface, that is capable of supporting a deposited material, such as a thin film structure or layer. Substrates may optionally have a receiving surface having one or more features, such as nanosized or microsized recessed features including high aspect ratio features.

"Semiconductor" refers to any material that is an insulator at a very low temperature, but which has an appreciable electrical conductivity at an elevated temperature of about 300 Kelvin and/or when suitably modified by alloying with "dopant" atoms that purposefully increase the electrical conductivity. In the present description, use of the term semiconductor is intended to be consistent with use of this term in the art of microelectronics and electronic devices. Useful semiconductors include those comprising elemental semiconductors, such as silicon, germanium and carbon, and compound semiconductors, such as group IV compound semiconductors such as SiC and SiGe, group III-V semiconductors such as AlSb, AlAs, AlN, AlP, BN, BP, BAs, GaSb, GaAs, GaN, GaP, InSb, InAs, InN, and InP, group III-V ternary semiconductor alloys such as $Al_xGa_{1-x}As$, group II-VI semiconductors such as CsSe, CdS, CdTe, ZnO, ZnSe, ZnS, and ZnTe, group I-VII semiconductors such as CuCl, group IV-VI semiconductors such as PbS, PbTe, and SnS, layer semiconductors such as $PbI_2$, $MoS_2$, and GaSe, and oxide semiconductors such as CuO and $Cu_2O$. The term semiconductor includes intrinsic semiconductors and extrinsic semiconductors that are doped with one or more selected materials, including semiconductors having p-type doping materials and n-type doping materials, to provide beneficial electronic properties useful for a given application or device. The term semiconductor includes composite materials comprising a mixture of semiconductors and/or dopants. Specific semiconductor materials useful for some embodiments include, but are not limited to, Si, Ge, Se, diamond, fullerenes, SiC, SiGe, SiO, $SiO_2$, SiN, AlSb, AlAs, AlIn, AlN, AlP, AlS, BN, BP, BAs, $As_2S_3$, GaSb, GaAs, GaN, GaP, GaSe, InSb, InAs, InN, InP, CsSe, CdS, CdSe, CdTe, $Cd_3P_2$, $Cd_3As_2$, $Cd_3Sb_2$, ZnO, ZnSe, ZnS, ZnTe, $Zn_3P_2$, $Zn_3As_2$, $Zn_3Sb_2$, $ZnSiP_2$, CuCl, PbS, PbSe, PbTe, FeO, $FeS_2$, NiO, EuO, EuS, PtSi, TlBr, $CrBr_3$, SnS, SnTe, $PbI_2$, $MoS_2$, GaSe, CuO, $Cu_2O$, HgS, HgSe, HgTe, $HgI_2$, MgS, MgSe, MgTe, CaS, CaSe, SrS, SrTe, BaS, BaSe, BaTe, $SnO_2$, TiO, $TiO_2$, $Bi_2S_3$, $Bi_2O_3$, $Bi_2Te_3$, $BiI_3$, $UO_2$, $UO_3$, $AgGaS_2$, PbMnTe, $BaTiO_3$, $SrTiO_3$, $LiNbO_3$, $La_2CuO_4$, $La_{0.7}Ca_{0.3}MnO_3$, CdZnTe, CdMnTe, CuInSe$_2$, copper indium gallium selenide (GIGS), HgCdTe, HgZnTe, HgZnSe, PbSnTe, $Tl_2SnTe_5$, $Tl_2GeTe_5$, AlGaAs, AlGaN, AlGaP, AlInAs, AlInSb, AlInP, AlInAsP, AlGaAsN, GaAsP, GaAsN, GaMnAs, GaAsSbN, GaInAs, GaInP, AlGaAsSb, AlGaAsP, AlGaInP, GaInAsP, InGaAs, InGaP, InGaN, InAsSb, InGaSb, InMnAs, InGaAsP, InGaAsN, InAlAsN, GaInNAsSb, GaInAsSbP, and any combination of these. Porous silicon semiconductor materials are useful for aspects described herein. Impurities of semiconductor materials are atoms, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to, oxygen, carbon, and metals including heavy metals. Heavy metal impurities include, but are not limited to, the group of elements between copper and lead on the periodic table, calcium, sodium, and all ions, compounds and/or complexes thereof.

"Dielectric" refers to a non-conducting or insulating material. Specific examples of inorganic dielectric materials include, but are not limited to, silicon nitride, silicon dioxide and polymers.

"Electronic device" generally refers to a device incorporating a plurality of components, and includes large area electronics, macroelectronic devices, display devices, integrated circuits, memory devices, photovoltaic devices, MEMS, NEMS, microfluidic and nanofluidic devices, and sensors including biological and/or chemical sensors, and physical sensors (e.g., temperature, etc.).

"Coalescence" refers to a process in which formation and growth of nuclei on a substrate leads to the conception of a substantially pinhole-free film, such as a smooth thin film layer or other structure.

As generally understood in the art, "hfac" refers to hexafluoroacetylacetone or an ionic form thereof, e.g., hexafluoroacetylacetonate; "dme" refers to 1,2-dimethoxyethane; "vtms" refers to vinyltrimethylsilane; "mhy" refers to 2-methyl-1-hexen-3-yne; and "tmod" refers to 2,2,7-trimethyloctane-3,5-dione or an ionic form thereof, e.g., 2,2,7-trimethyloctane-3,5-dionate.

In the following description, numerous specific details of the devices, device components and methods of the present invention are set forth in order to provide a thorough explanation of the precise nature of the invention. It will be apparent, however, to those of skill in the art that the invention can be practiced without these specific details.

FIG. 1 provides a flowchart 100 illustrating exemplary steps for a method of making a smooth layer on a substrate, such as a substrate for an electronic device. In step 102, a substrate having a receiving surface is provided, for example, the substrate may be provided in a deposition chamber such as an evaporative, sputtering, CVD or ALD deposition chamber. The substrate may, in some embodiments, include one or more recessed features—such as a trench, trough, slit, channel, via, hole, void, pore or depression—and the smooth layer may fill or coat the recessed feature(s). Optionally, the substrate is heated to a temperature less than or equal to 600° C. to facilitate uptake of precursor and nucleation and growth of the thin film. In step 104, the receiving surface of the substrate is contacted with a precursor gas. The precursor gas may, for example, be a high purity gas CVD or ALD precursor gas (e.g., at least 99% pure, at least 99.9% pure, or at least 99.99% pure) injected into a reaction chamber, which is optionally at a low pressure. A partial pressure of the precursor gas is optionally less than or equal to 1 mTorr. An inert carrier gas, such as $N_2$, Ar, Xe, or combinations thereof, may also be provided to help transport the precursor gas into the deposition chamber.

Still referring to FIG. 1, accommodation of the precursor gas by the substrate results in formation of nuclei of deposited material on the receiving surface of the substrate. In step 106, the nuclei and/or the substrate is further contacted with the precursor gas, resulting in growth of the nuclei at a growth rate and formation of additional nuclei. The nuclei on the receiving surface are also contacted with a smoothing agent, in step 108, which may be a high purity gas, such as an inhibitor gas, injected into the reaction chamber, either alone or together with a carrier gas. Optionally, the smoothing agent has a partial pressure less than or equal to 1 mTorr. In an embodiment, for example, accommodation of the smoothing agent by the nuclei decreases the growth rate of the nuclei sufficiently such that formation and growth of additional nuclei on the receiving surface generates the smooth layer on the substrate. As described in FIG. 1, steps 106 and 108 may occur simultaneously or sequentially, with either step occurring first. In optional step 110, contact between the nuclei and the smoothing agent is stopped after coalescence of the nuclei and/or formation of a smooth layer of a preselected thickness. Optionally, in step 112, growth of the smooth layer is resumed by contacting the smooth layer with the precursor gas in the absence of the smoothing agent.

FIGS. 2a, 2b and 2c show schematic diagrams of the formation and growth of nuclei 200 on a receiving surface 203 of a substrate 202. FIG. 2a illustrates conditions wherein a precursor gas 206 is provided in the absence of a smoothing agent gas 204 and FIG. 2b illustrates conditions wherein a precursor gas 206 and a smoothing agent 204 are provided together. The arrows shown in FIGS. 2a and 2b are intended to schematically illustrate some processes (e.g., accommodation, chemical reaction, growth of nuclei, desorption, release to gas phase, etc.) involved in formation of a thin film structure. Solid arrows indicate steps in some methods of the invention and dashed arrows indicate processes that may or may not occur depending on the processing conditions (e.g., composition and partial pressure of smoothing agent, composition and partial pressure of precursor gas, composition of substrate, temperature, etc.). The letter "P" schematically represents precursor gas and the letter "S" schematically represents the smoothing agent.

In FIG. 2a, a precursor gas 206 is provided to a reaction chamber 208 including substrate 202, such as a deposition chamber having a substrate for an electronic device with one or more recessed features. Introduction of precursor gas 206 to the reaction chamber is schematically shown by the arrow in the left corner of FIG. 2a. A carrier gas (not shown) is optionally provided with the precursor gas. Precursor gas 206 is accommodated by receiving surface 203 of substrate 202 so as to generate nuclei 200 of deposited material, for example, by a nucleation process involving chemically or physically adsorbed precursor gas or reaction products of the precursor gas 206. In some embodiments, for example, accommodation of precursor gas 206 by substrate 202 occurs via chemical reaction on receiving surface 203 of substrate 202, such as a decomposition reaction(s), thereby resulting in formation of nuclei 200 of deposited material at a growth rate and formation of additional nuclei. Precursor gas 206 is also accommodated on the surfaces of nuclei 200 and/or by substrate 202, thereby resulting in growth of nuclei 200. The process of accommodation of precursor gas 206 on substrate 202 is shown as $R^1$, the process of desorption of precursor gas 206 from substrate 202 is shown as $R^7$, the process of accommodation of precursor gas 206 on nuclei 200 is shown as $R^2$, the process of desorption of precursor gas 206 from nuclei 200 is shown as $R^8$, and growth of nuclei 200 from accommodation of precursor gas 206 is shown as $R^3$.

In FIG. 2b, a combination of precursor gas 206 and a smoothing agent 204 is provided to a reaction chamber 208 including substrate 202, such as a deposition chamber having a substrate for an electronic device with one or more recessed features. Introduction of precursor gas 206 and smoothing agent 204 to reaction chamber 208 is schematically shown by the arrows in the left corner of FIGS. 2b and 2c. Introduction of smoothing agent 204 into reaction chamber 208 may occur concurrently or sequentially with the introduction of precursor gas 206. A carrier gas (not shown) is optionally provided with the precursor gas and smoothing agent. Precursor gas 206 undergoes similar processes as described in connection with FIG. 2a, such as accommodation on receiving surface 203 of substrate 202 and accommodation on the surfaces of nuclei 200, thereby resulting in formation and growth of nuclei 200 on receiving surface 203 of substrate 202. In addition, smoothing agent 204 is accommodated by nuclei 200 and/or substrate 202. Optionally, smoothing agent comprises an inhibitor gas 204 that undergoes accommodation and/or chemical reactions to generate condensed phase inhibitor species on the surface, or in the bulk, of nuclei 200 or substrate 202. Optionally, smoothing agent is also accommodated by receiving surface 203 of substrate 202. Accommodation of smoothing agent 204 by the surfaces of nuclei 200 is shown by process $R^4$, accommodation of smoothing agent 204 by receiving surface 203 is shown by process $R^6$, and release (e.g., desorption) of condensed phase inhibitor species to the gas phase is shown by process $R^5$. In some embodiments, smoothing agent 204 functions to decrease the rate of nuclei growth (process $R^3$) relative to the rate of formation of nuclei 200 on receiving surface 203 of substrate 202. In an embodiment, for example, accommodation of smoothing agent 204 forms inhibitor species on nuclei 200 which decreases the growth rate of nuclei 200 by reducing the rate of process $R^2$ corresponding to accommodation of precursor gas 206 on nuclei 200. FIG. 2c shows the substrate 202 at a later time after exposure to precursor gas 206 and smoothing agent 204. As shown in FIG. 2c, the substrate is covered by additional nuclei which are beginning to coalesce into a thin film. As shown in FIG. 2c, substrate 202 is characterized by a larger density of smaller nuclei on receiving surface 203 compared to that shown in FIG. 2a.

A comparison of FIG. 2a, FIG. 2b and FIG. 2c shows that reduction of the relative rate of nuclei growth relative to the rate of formation of nuclei by introduction of smoothing agent results in an increase in density of nuclei formed on the substrate. In the process of FIGS. 2b and 2c, therefore, copious nuclei grow into small crystalline domains that coalesce to produce a smooth layer at a smaller thickness than in the process illustrated in FIG. 2a.

TABLE 1

Table of Processes in FIGS. 2a and 2b

| $R^\#$ | Process |
| --- | --- |
| $R^1$ | Accommodation of precursor gas by the substrate |
| $R^2$ | Accommodation of precursor gas on growing nuclei |
| $R^3$ | Growth of nuclei |
| $R^4$ | Accommodation of smoothing agent by nuclei |
| $R^5$ | Release of inhibitor species into gas phase |
| $R^6$ | Accommodation of smoothing agent by the substrate |
| $R^7$ | Desorption of precursor from substrate |
| $R^8$ | Desorption of precursor from nuclei |

The invention is further detailed in the following Examples, which are offered by way of illustration and are not intended to limit the scope of the invention in any manner.

Example 1

Low Temperature Chemical Vapor Deposition of Hafnium Nitride-Boron Nitride Nanocomposite Films Nanocomposite $HfN_x$—BN thin films are deposited by chemical vapor deposition at substrate temperatures of 350-800° C. using the precursor hafnium borohydride, $Hf(BH_4)_4$, in combination with ammonia, $NH_3$. Below 350° C., the product is metallic $HfB_2$ with essentially no incorporation of nitrogen. However, the presence of ammonia decreases the $HfB_2$ deposition rate considerably; this growth suppression effect is attributed to blocking of reactive surface sites by adsorbed ammonia molecules. At substrate temperatures above 350° C., film deposition occurs; however, the $HfB_2$ phase is completely absent. The resulting film stoichiometry is $HfB_yN_{2.5}$; although the value of y is difficult to determine precisely, it is about unity. X-ray photoelectron spectroscopy (XPS) analysis detects Hf—N and B—N bonds but no Hf—B bonds; thus the films are nanocomposites that consist of a mixture of hafnium nitride, $HfN_x$ with x>1 and boron nitride. The deposited films are X-ray amorphous and Raman inactive. Compared to $HfB_2$ films grown under similar precursor pressure and substrate temperature, the $HfN_x$—BN films are smoother and have a denser microstructure. The thermal activation energy for growth of $HfN_x$/BN in the reaction-rate limited regime is ~0.72 eV (70 kJ/mol), a value 0.3 eV larger than that for the growth of $HfB_2$ from $Hf(BH_4)_4$ alone. This difference in activation energy indicates that growth is governed by a different rate-limiting step; these results have been interpreted to mean that the $Hf(BH_4)_4$ precursor reacts with ammonia on the growth surface to generate species with Hf—N and B—N bonds, which subsequently lose $H_2$ and $BH_y$ to generate the nanocomposite. The $HfN_x$/BN films have resistivities ~10 Ω·cm. Optical transmission and spectroscopic ellipsometry measurements indicate a bandgap of ~2.6 eV.

Introduction

Nanocomposite materials often exhibit enhanced properties owing to synergistic interactions among their component phases, and as a result such materials have great technological potential. Particularly interesting are nanocomposites that combine materials with vastly different electrical, mechanical, optical, magnetic, thermal, structural, or rheological properties. In this example, preparation of ceramic nanocomposite thin films by low temperature chemical vapor deposition is disclosed.

The transition metal diborides $TiB_2$, $ZrB_2$, and $HfB_2$ are line compounds with the hexagonal $AlB_2$ structure and high metallic conductivities.[1] In contrast, the corresponding transition metal nitrides TiN, ZrN, and HfN have wide phase fields with the cubic NaCl structure, and their electrical conductivities depend sensitively on stoichiometry. When substoichiometric in nitrogen, they are highly metallic; when overstoichiometric, they are either poor metals ($TiN_x$) or insulators with bandgaps of 2-3 eV ($ZrN_x$, $HfN_x$).[1-3] The most nitrogen-rich materials in the composition field are cubic $M_3N_4$ phases with the $Th_3P_4$ structure and closely related materials of stoichiometry $MN_{1.35}$ with the NaCl structure; these phases are insulating with bandgaps of 2.5 eV for $Hf_3N_4$[1,4,5] and 2.7 eV for $HfN_{1.35}$.[6,7]

There have been a few studies of ternary metal-boron-nitrogen materials, $MB_xN_y$. Sputtering $MB_2$ targets in an $Ar/N_2$ atmosphere affords a mixture of the phases $MB_2$, MN, and BN, where M is Hf and Ti.[8,9] Chemical vapor deposition (CVD) from a mixture of $MCl_4$, $BCl_3$, $N_2$, and $H_2$ at substrate temperatures of 850-1350° C. affords a similar mixed phase product $MB_xN_y$ (M=Ti, Zr).[10,11] In some cases, the stoichiometry and distribution of local phases (M-B, M-N, and B—N) are a function of the growth conditions, which affords a means to enhance the mechanical properties.[9] The deposition of $MB_xN_y$ films at 300° C. by CVD is achievable using the hafnium borohydride precursor $Hf(BH_4)_4$ in the presence of nitrogen atoms generated by a remote microwave $N_2$ plasma.[12] The films contain the phases $HfB_2$, HfN, and BN, remain amorphous after high temperature annealing and can be used to synthesize multilayer $HfB_2/HfB_xN_y$ hard coatings whose hardness and elastic modulus can be adjusted over a wide range.[12]

Thermal CVD from the $Hf(BH_4)_4$ precursor affords metallic $HfB_2$ thin films in the temperature range 200-1300° C.[13,14] It is shown here that CVD from $Hf(BH_4)_4$ in the presence of ammonia at temperatures above 350° C. changes the reaction pathway completely: no $HfB_2$ is generated; indeed, no Hf—B bonds are present at all; instead, the films consist of a mixture of amorphous $HfN_x$ (x>1) and BN phases. The spectroscopic, electrical, and optical properties of these films are reported in detail.

Experiment

Chemical vapor deposition is carried out in a UHV system[15] with a base pressure of $10^{-8}$ torr, most of which is hydrogen. The solid $Hf(BH_4)_4$ precursor sublimes with a remarkably high vapor pressure of ~15 torr at room temperature. Before film growth, the flow of $Hf(BH_4)_4$ is adjusted by means of a needle valve so that the precursor pressure inside the chamber is 0.1 mTorr; no carrier gas is used. Ammonia (15 sccm) is delivered to the chamber through a mass flow controller. The total pressure (ammonia+precursor) before initiation of film growth is 0.8 mtorr as measured by a capacitance manometer. Film thickness and microstructure are analyzed ex situ from fracture cross-sectional images on a scanning electron microscope. Growth rates are measured by dividing the scanning electron microscopy (SEM) thickness by the growth time. The growth kinetics and optical dielectric properties of the films are also monitored in situ using spectroscopic ellipsometry (SE) in the energy range 0.75-5.0 eV. For these experiments, as well as for postgrowth determination of the optical constants, the substrate is highly doped silicon that is dipped in hydrofluoric acid to remove the native oxide before loading into the system. To interpret the SE data, the surface roughness is modeled using the Bruggeman effective medium approximation (EMA) as an isotropic composite consisting of 50% film and 50% void, which is a standard model assumption.[16,17] The optical dielectric response of the $HfN_x$—BN nanocomposite is modeled using the Tauc-Lorentz (TL) model given by:

$$\varepsilon_{2TL}(E) = \left[\frac{AE_oC(E-E_g)^2}{(E^2-E_o^2)^2 + C^2E^2} \cdot \frac{1}{E}\right], \text{ for } E > E_g \quad (1)$$
$$= 0, \text{ for } E \leq E_g$$

where $\varepsilon_{2TL}$ is the imaginary part of the dielectric function, A is the fit parameter with unit of energy, $E_o$ is the peak transition energy, C is the peak broadening, and $E_g$ is the bandgap.[18] The real part of the dielectric constant in this model is calculated by the Kramers-Kronig integral.[18] The pseudodielectric constants $\langle\varepsilon_1\rangle$ and $\langle\varepsilon_2\rangle$ extracted from this procedure fit the data with a mean square error of 5, which is well within the acceptable limit. The model affords the refractive index n and the extinction coefficient k of a bulk film with no surface roughness layer. For an amorphous semiconductor, the bandgap $E_g$ is determined from the extrapolated intercept of the absorbance $\alpha=4\pi k/\lambda$ with the hv axis on a Tauc plot, $(\alpha h\nu)^{1/2}$ vs hv.[19]

For optical transmission measurements, films are grown on Corning 7059 glass, and the normalized absorbance is calculated from $\alpha=\log(T/T_o)$ where T is the transmittance of the substrate/film combination, and $T_0$ was the transmittance of the glass substrate alone. The absorbances calculated in this way are approximate because they ignore the wavelength-dependent reflectivity of the films; nevertheless, this simplified approach is sufficient to afford an estimate of the bandgap.

For ex situ electrical measurements, the substrate is thermally grown $SiO_2$ (300 nm) on Si. After film deposition, two parallel strips of aluminum (~100 nm thick) are evaporated onto the surface to enable coplanar resistivity measurements across the gap between the electrodes; the applied bias (>10 V) is large compared to the potential drop due to the nonohmic contacts; hence, the measurement reveals the bulk resistivity of the film.

Film crystallinity and composition are determined by ex situ X-ray diffraction (XRD; Philips X' pert 2), X-ray photoelectron spectroscopy (XPS; Kratos Axis ULTRA XPS), and Rutherford Backscattering Spectroscopy (RBS) (High Voltage Engineering Van de Graaff), respectively. RBS is also used to measure the atomic density of Hf in the films. The XPS studies are conducted without sputtering in order to avoid atomic mixing and preferential removal of low atomic mass species that make accurate phase identification unreliable.[20]

Results and Discussion

Deposition of Films from $Hf(BH_4)_4$ and $NH_3$. At temperatures below 350° C., passage of a mixture of $Hf(BH_4)_4$ and ammonia over Si, $SiO_2$, or glass substrates produces pure $HfB_2$ films, with relatively little incorporation of ammonia (<5 at % N). As monitored by SE, the growth rate at 250° C. decreases with increasing ammonia pressure as GR [nm/min]=$16/(1+250\rho_{ammonia}[\text{mtorr}])$. Thus, in this low temperature regime ammonia acts as a very effective growth inhibitor for the chemical vapor deposition of $HfB_2$; at ammonia pressures near 1 mtorr, growth is essentially arrested. Growth suppression enhances the conformal coverage of films inside deep trench and via structures.[21,22]

Figure 4:
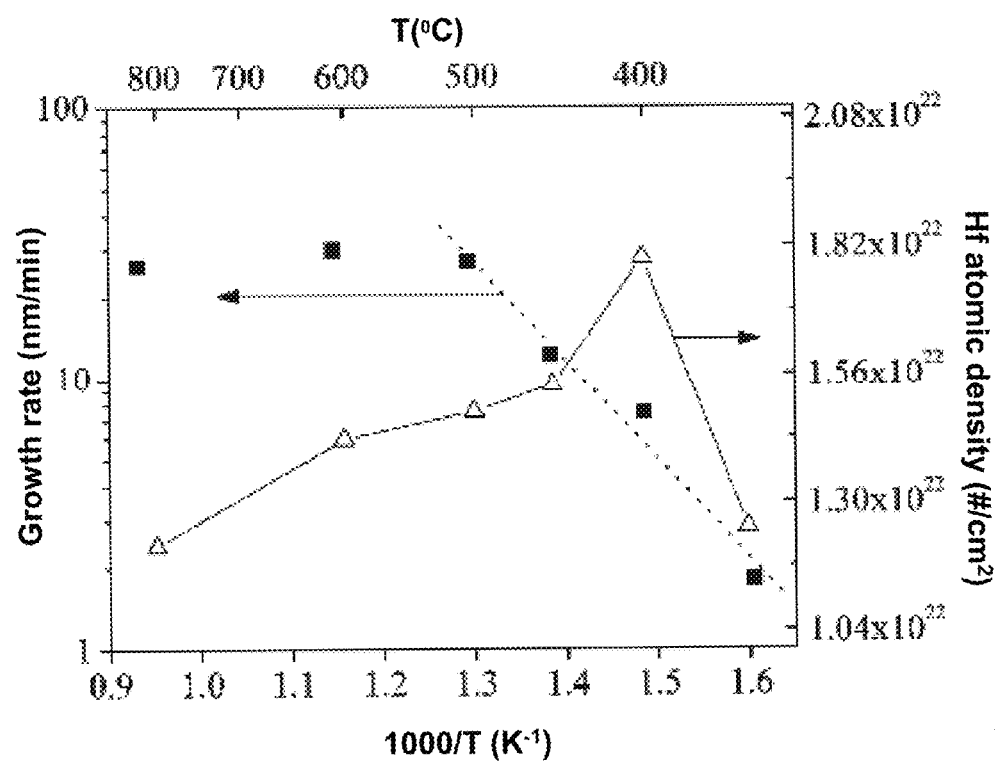
FIG. 4. Log of film growth rate (left axis, closed squares) and Hf atomic density from RBS (right axis, open triangles) vs inverse temperature. The low-temperature, reaction-limited regime (dotted line) affords the apparent activation energy.

For an ammonia pressure of 1 mtorr, as the substrate temperature is raised, the suppression effect is eventually overcome and film growth occurs. The onset temperature for film growth under these conditions is 350° C., but there are very long nucleation delays (>5 min) below substrate temperatures of 450° C. on Si substrates and 500° C. on $SiO_2$ substrates. To deposit films at temperatures between 350 and 400° C., it is advantageous to deposit a nucleation layer at 450° C., then lower the substrate temperature to the desired value. As described below, films grown above 350° C. contain nitrogen and consist of a mixture of hafnium nitride, $HfN_x$ (x>1) and boron nitride, BN. The atomic density of Hf in the films varies from 1.3 to $1.8 \times 10^{22}$ cm$^{-3}$ and reaches a maximum at 400° C. (FIG. 4). For comparison, the theoretical atomic density of Hf in bulk HfN assuming a cell constant of 4.52 Å is $4.2 \times 10^{22}$ cm$^{-3}$.[23]

Similar to other CVD processes, the growth rate is reaction rate limited at low temperatures (350-500° C.) and flux limited at high temperatures (FIG. 4). The apparent activation energy in the reaction rate limited regime is ~70 kJ/mol (0.72 eV), which is 1.7 times higher than for thermal decomposition of $Hf(BH_4)_4$ alone.[13] This result implies that the rate-limiting step for film growth is different in the presence of ammonia. The higher activation energy may be due to the formation of Hf—$NH_2$ species on the surface, which decompose to produce the $HfN_x$ phase in the films. This suggestion is supported by studies of the solution-phase reaction of the analogous molecule $Zr(BH_4)_4$ with ammonia, which affords adducts of stoichiometry $Zr(BH_4)_4(NH_3)_n$, where n=4, 6, or 8.[24] These adducts decompose near room temperature to form ammonium borohydride, $NH_4BH_4$, and zirconium complexes thought to contain Zr—$NH_2$ bonds. At higher temperatures, these species evolve $H_2$ to give an X-ray amorphous solid, which crystallizes above 1000° C. to give a mixture containing ZrN and BN. Similarly, the reaction of the halide precursors $ZrX_4$ (X=Cl, Br) with ammonia generates a complex $ZrX_4(NH_3)_n$ that affords cubic $Zr_3N_4$ when annealed.[4]

Figure 5:
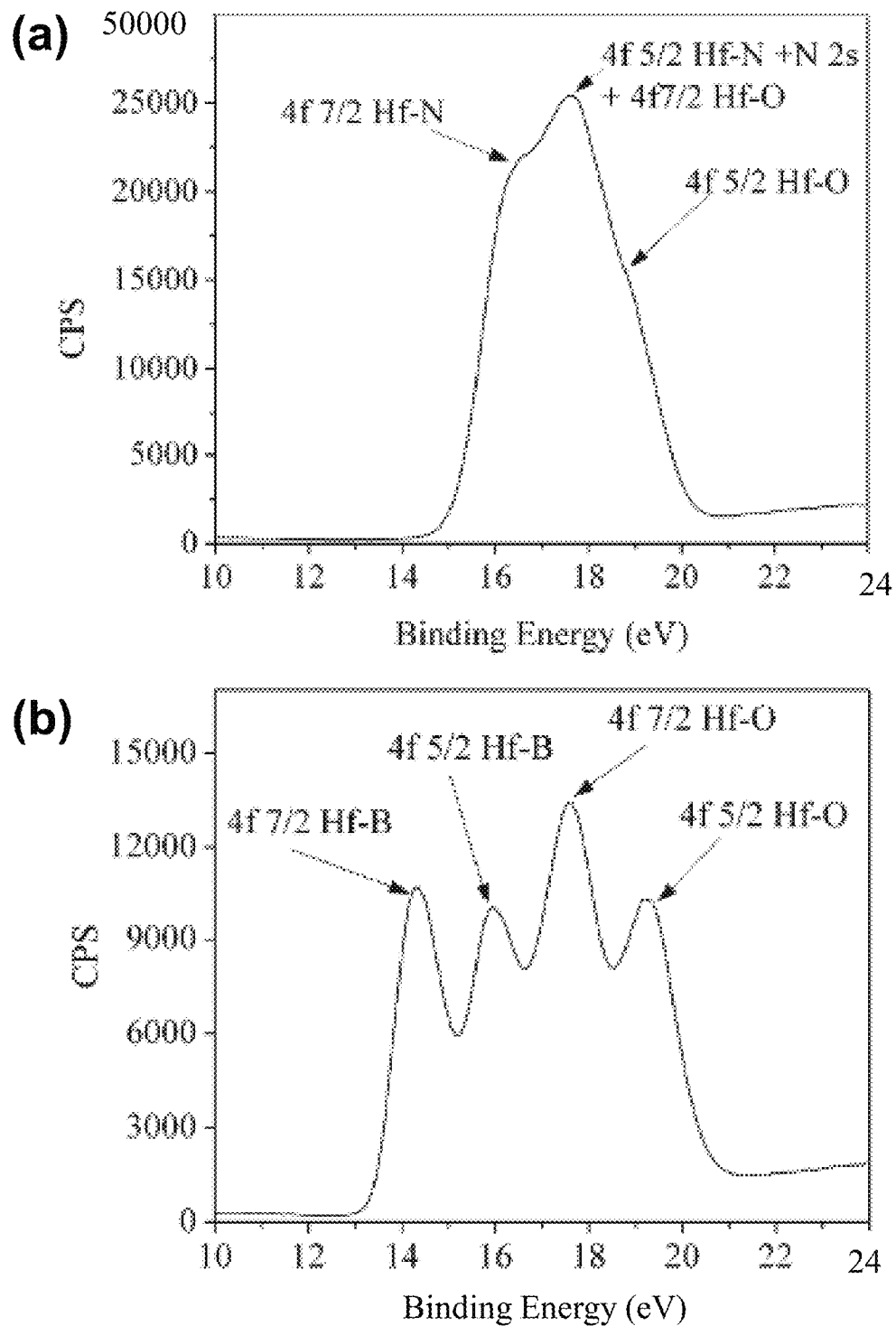
FIG. 5. (a) Hf 4f XPS spectrum of the $HfN_x$—BN film surface. (b) Hf 4f XPS spectrum of the $HfB_2$ film surface. Arrows identify peak positions.

Film Composition. XPS analysis was used to identify phases present on the surface of the film. Often sputtering is used to eliminate the surface oxide on air-exposed samples. Sputtering was avoided here because it results in atomic mixing and preferential removal of low atomic mass species, which makes accurate phase identification difficult (or impossible). XPS analysis of air-exposed films reveals significant differences between films deposited below 350° C. and those deposited above this temperature (FIG. 5). For the low temperature films, the Hf 4f ($4f_{5/2}$ and $4f_{7/2}$) region shows features for Hf—O and Hf—B phases, but no features for Hf—N species. The results are consistent with the growth of $HfB_2$ films followed by surface oxidation upon air exposure. The Hf—B feature is absent for films deposited at higher temperature. Instead, peaks corresponding to Hf—N and Hf—O phases overlap with one another and also with the N 2s peak at 16.7 eV.[25] The shoulder in the 4f peak at ~16 eV arises due to Hf—N bonding and its magnitude indicates that the N/Hf ratio is greater than one.[26] These results support the conclusion that CVD using $Hf(BH_4)_4$ and $NH_3$ above 350° C. affords composite films containing $HfN_x$ (x>1) and BN phases. The area under the B and Hf XPS peaks from the film surface are integrated to obtain the B:Hf ratio of 1.2.

Figure 6:
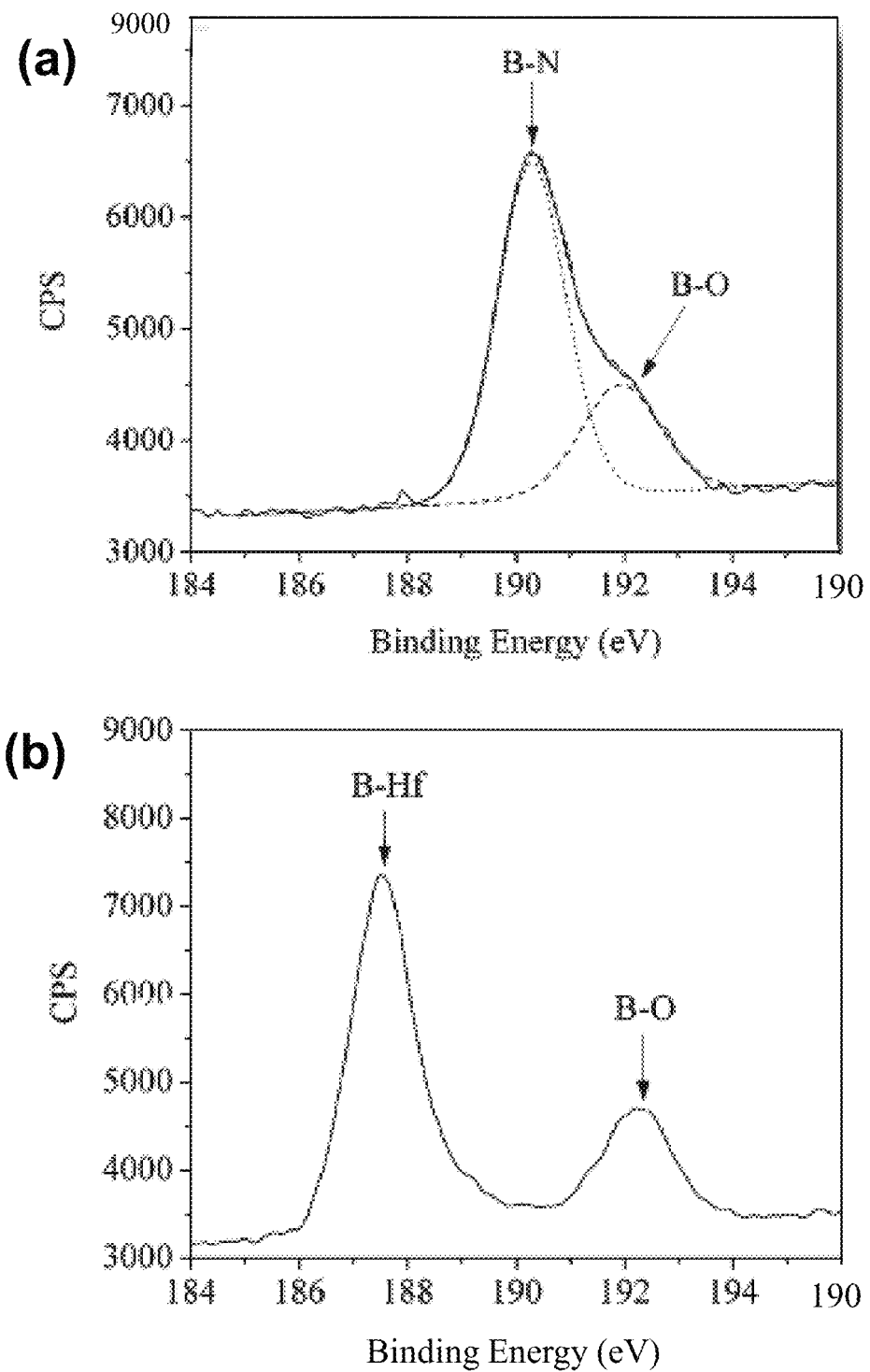
FIG. 6. (a) B 1s XPS spectrum (solid line) of the $HfN_x$—BN film surface. The peaks are deconvoluted using two Gaussians (dashed lines) that correspond to the known oxide and nitride peaks. (b) B 1s XPS spectrum of the $HfB_2$ film surface.
Figure 7:
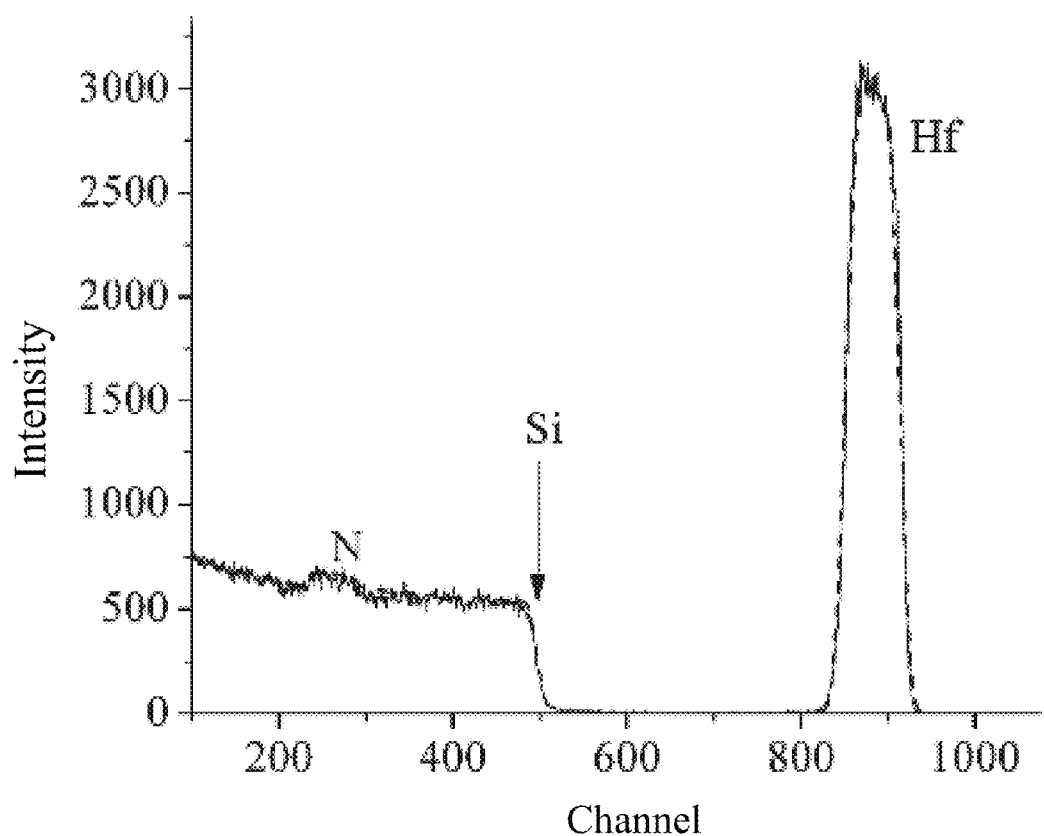
FIG. 7. RBS spectrum (dotted line) and model fit (continuous line) of a $HfN_x$—BN film.

Both the $HfB_2$ and $HfN_x$—BN films show a B(1s) peak at 192.25 eV corresponding to $B_2O_3$ (FIG. 6, deconvoluted in panel (b). In the $HfN_x$—BN film, the absence of a B(1s) peak at 187.6 eV indicates the absence of $HfB_2$; instead, a peak at 190.30 eV indicates the presence of BN.[8,27] RBS analysis of a film deposited at 450° C. on Si (FIG. 7) provides a quantitative measure of the film stoichiometry as $HfB_yN_{2.5}$; the boron content y cannot be determined accurately because the boron signal is superposed on the large background due the Si substrate. This result is consistent with the conclusion from the XPS results that the film is composed of $HfN_x$ (x>1) and BN phases.

Electrical and Optical Properties. At room temperature, the $HfN_x$—BN films are highly resistive (ρ=12 Ω·cm), in sharp contrast with $HfB_2$ films, which are metallic (ρ≤$4 \times 10^{-4}$ Ω·cm). The high resistivity is due to the insulating nature of the $HfN_x$ and BN phases. (In comparison, CVD grown $HfN_{1.35}$ reported by Fix et al. were insulators with resistivity>1 Ω·cm[6] and those obtained from sputtering Hf in a $N_2$ atmosphere by Smith had the highest obtained value of 10 Ω·cm[28]).

Figure 8:
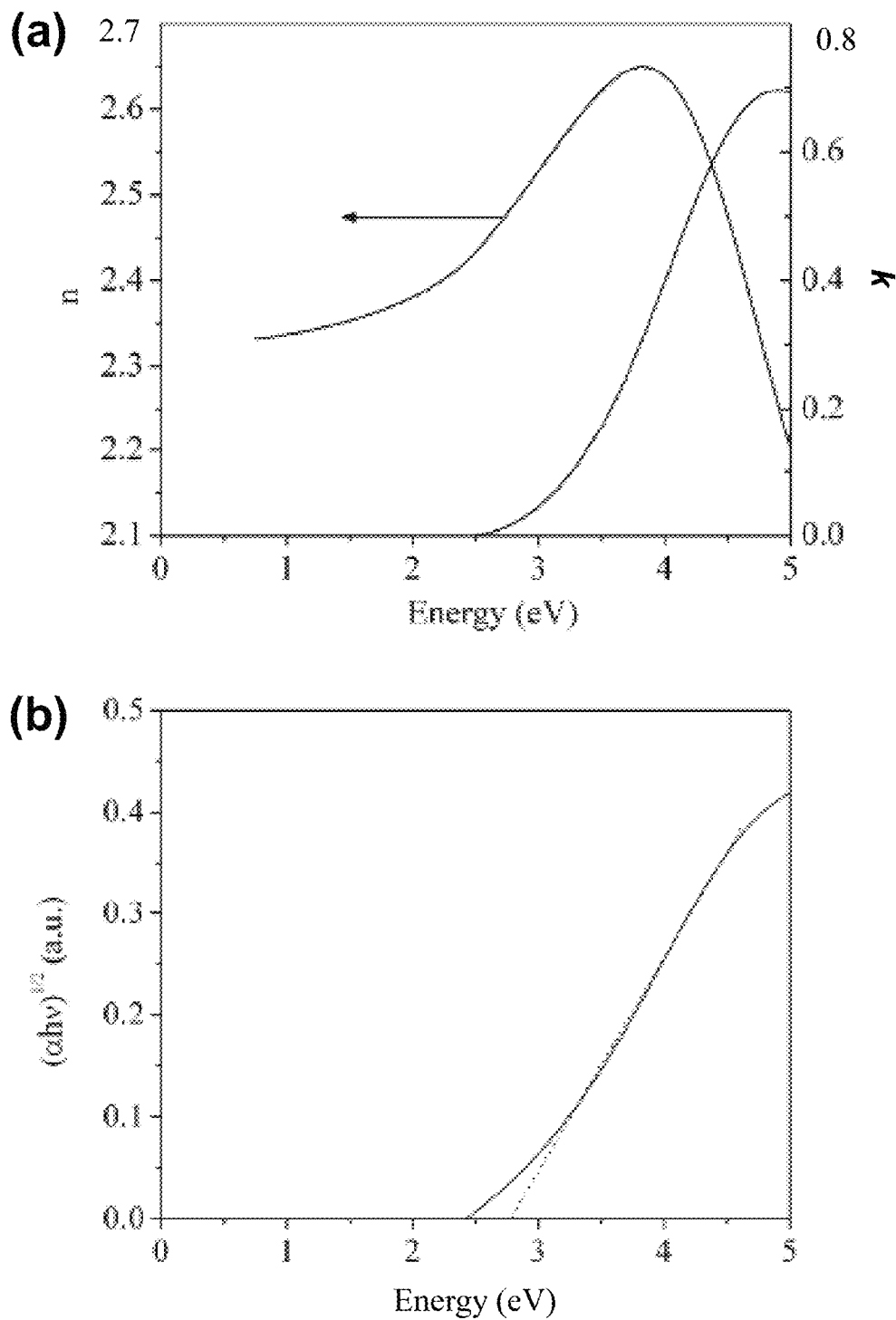
FIG. 8. (a) Bulk optical constants n and k for a $HfN_x$—BN film grown on silicon at 450° C. obtained from ellipsometry data using a Tauc-Lorentz model. (b) Tauc plot, $(\alpha h \nu)^{1/2}$ vs photon energy hν. The extrapolated linear region (dotted line) intercepts the hν axis at the value of the effective bandgap.
Figure 9:
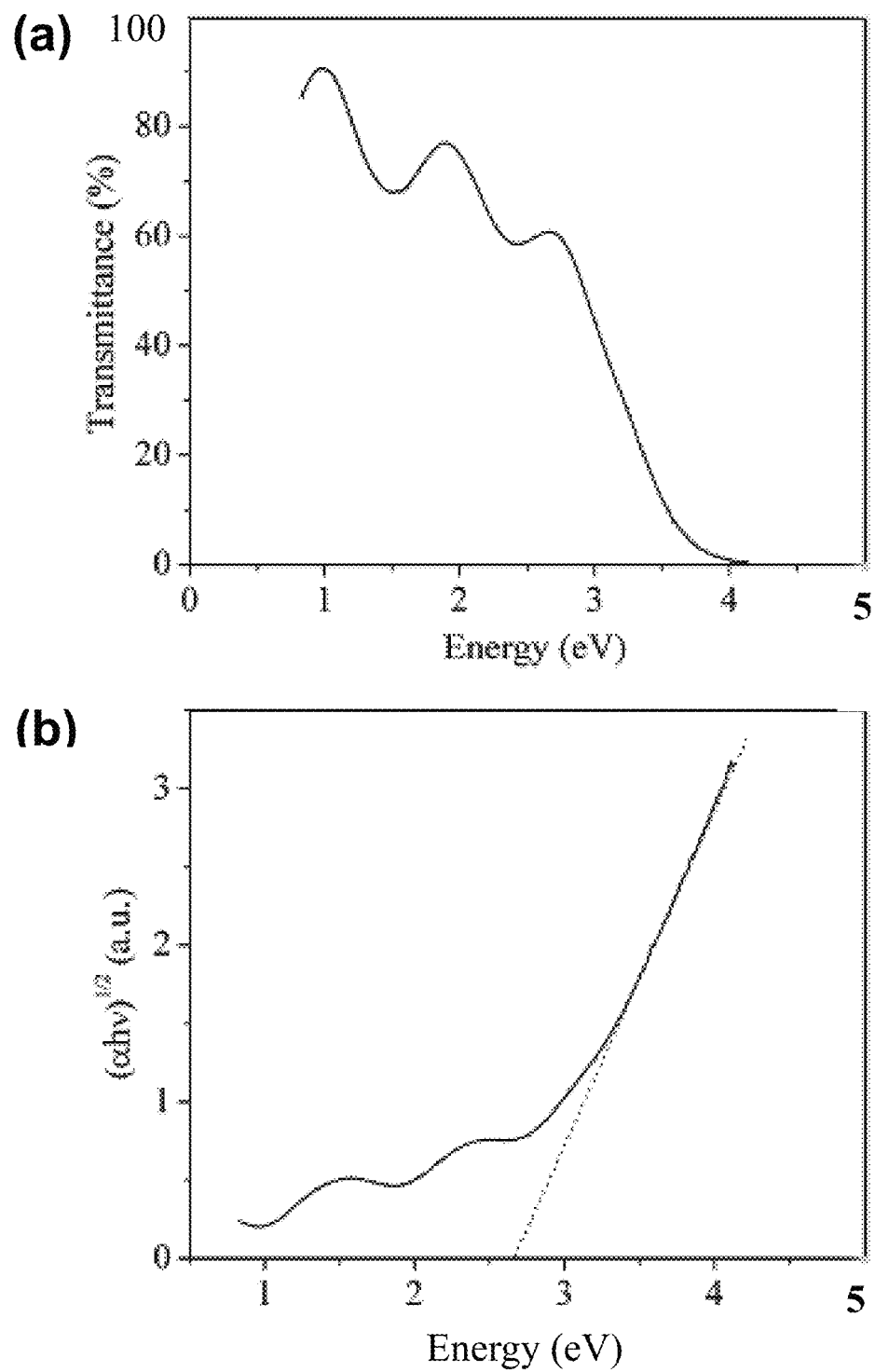
FIG. 9. (a) Optical transmittance (solid line) of a $HfN_x$—BN film grown on Corning 7059 glass at 500° C. The plot is normalized to the transmission of a bare substrate. (b) Tauc plot (as in FIG. 8b).

Ellipsometric analysis of the $HfN_x$—BN films grown at 450° C. indicates a bandgap $E_g$ ~2.8 eV (FIG. 8). The bandgap estimated from the optical transmission spectrum (FIG. 9a) suggests $E_g$ ~2.6 eV (FIG. 9b). The value of the bandgap obtained from both methods is close to the range 2.5-2.7 eV reported for CVD $Hf_3N_4$ films[6,7] and for sputtered $HfN_x$ films[3] but is smaller than of the range 3.6-7.1 eV observed for BN.[29,36] As expected, the properties of the $HfN_x$—BN films are dominated by the $HfN_x$ component because it has a smaller optical bandgap and higher electrical conductivity than the BN component.

Figure 10:
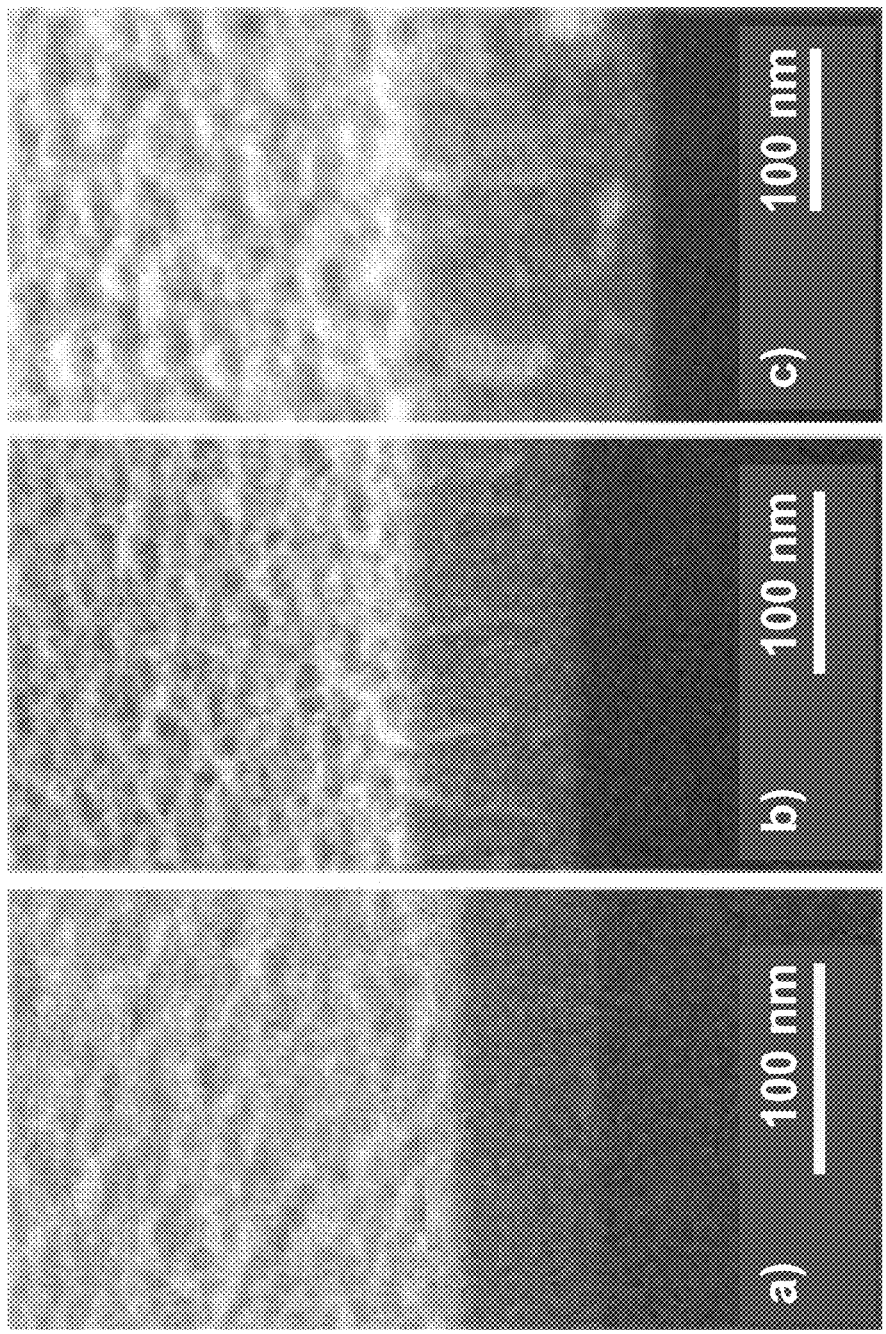
FIG. 10. SEM fracture cross sections of $HfN_x$—BN films grown at (a) 400, (b) 600, and (c) 800° C. on Si substrates.

Microstructure and Crystallinity. SEM fracture cross sections of a $HfN_x$—BN film grown at 450° C. reveal a relatively smooth and homogeneous film microstructure (FIG. 10a). In contrast, deposition from $Hf(BH_4)_4$ alone at the same temperature yields a very rough and columnar $HfB_2$ film microstructure.[13] This difference in microstructure is consistent with a smaller reactive sticking probability (β) of the $Hf(BH_4)_4$ precursor when excess ammonia is present (ammonia pressures used in the experiments are 10 times higher than $Hf(BH_4)_4$ precursor pressure). Excess ammonia aids in blocking surface sites for $Hf(BH_4)_4$ adsorption thereby reducing β. A lower β has been shown theoretically[31,32] to afford a smoother surface, and very smooth surfaces for $HfB_2$ grown under conditions of extremely low β ($10^{-3}$-$10^{-5}$) at 200-300°

C. have been reported.[33] The lowering of β is also evident from the kinetic data: for the same $Hf(BH_4)_4$ pressure and substrate temperature between 350 and 500° C., the growth rate of $HfN_x$—BN film (in the presence of ammonia; FIG. 4) is smaller by a factor of 10 than the growth rate of $HfB_2$ (in the absence of ammonia[13]). As growth temperature increases above 500° C., the microstructure becomes more columnar and rougher (FIGS. 10*b* and 10*c*) without a significant change in film composition. This change occurs because of two factors: β for the $Hf(BH_4)_4$ precursor increases with temperature and excess ammonia used should desorb more rapidly from the surface at higher temperatures, thereby reducing its surface coverage and its ability to act as a growth suppressor.[21,22] At all of the growth temperatures reported here, the surface of the $HfN_x$—BN film is smoother and the microstructure is denser (a larger Hf atomic density as measured by RBS) than for $HfB_2$ films grown at the same temperature.

All the films grown at 350-800° C. are amorphous as judged from XRD and transmission electron microscopy (TEM) diffraction patterns. A film grown at 450° C. remained amorphous even after being annealed in vacuum at 800° C. for 1 h. It was previously reported that amorphous $HfB_xN_y$ films deposited from $Hf(BH_4)_4$ and atomic N showed broad diffraction peaks at positions corresponding to the $HfB_2$ phase after a 700° C. anneal.[12] Given the relatively low flux of atomic N generated by the remote plasma source, it is possible that those films were deficient in N and contained $HfB_2$ inclusions. Further experiments would be necessary to determine whether the film growth with atomic N affords a fundamentally different product than with $NH_3$ due to the surface reaction chemistry or whether the difference reflects the difference in nitrogen flux at the growth surface and is largely independent of the species.

The present results show that ammonia suppresses the deposition of $HfB_2$ from the single-source molecular precursor $Hf(BH_4)_4$ at temperatures below 350° C. At higher temperatures, the nanocomposite material $HfN_x$—BN is formed instead. These effects most likely result from a kinetic competition between different surface reaction channels. Ammonia molecules adsorbed on the growth surface may either (i) reside for a characteristic time, during which they block the adsorption of the precursor and thus reduce the film growth rate, then desorb without decomposition, or (ii) dissociate on the growth surface, which may also change the adsorption rate of the precursor, followed by N incorporation into the film. The suppression effect leads to the growth of highly smooth films, both below and above 350° C. The resulting nanocomposite $HfN_x$—BN films are amorphous, resist crystallization up to the maximum temperature tested (800° C.), and are poor electrical conductors.

The results demonstrate that surface chemistry during CVD is a powerful means to control the reactive net sticking coefficient and resulting microstructure and complements the usual control parameters of substrate temperature and precursor flux.

References

1 Williams, W. S. JOM-J. Miner. Met. Mater. Soc. 1997, 49, 38-42.
2 Aron, P. R.; Grill, A. Thin Solid Films 1982, 96, 87-91.
3 Yee, D. S.; Cuomo, J. J.; Frisch, M. A.; Smith, D. P. E. J. Vac. Sci. Technol. A-Vac. Surf. Films 1986, 4, 381-387.
4 Von Juza, R.; Rabenau, A.; Nitschke, I. Z. Anorg. Allg. Chem. 1964, 332, 1-4.
5 Zerr, A.; Miehe, G.; Riedel, R. Nat. Mater. 2003, 2, 185-189.
6 Fix, R.; Gordon, R. G.; Hoffman, D. M. Chem. Mater. 1991, 3, 1138-1148.
7 Hoffman, D. M. Polyhedron 1994, 13, 1169-1179.
8 Baker, M. A.; Mollart, T. P.; Gibson, P. N.; Gissler, W. J. Vac. Sci. Technol. A-Vac. Surf. Films 1997, 15, 284-291.
9 Gissler, W. Surf. Interface Anal. 1994, 22, 139-148.
10 Holzschuh, H. Thin Solid Films 2004, 469, 92-98.
11 Peytavy, J. L.; Lebugle, A.; Montel, G. Wear 1979, 52, 89-94.
12 Jayaraman, S.; Gerbi, J. E.; Yang, Y.; Kim, D. Y.; Chatterjee, A.; Bellon, P.; Girolami, G. S.; Chevalier, J. P.; Abelson, J. R. Surf. Coat. Technol. 2006, 200, 6629-6633.
13 Jayaraman, S.; Yang, Y.; Kim, D. Y.; Girolami, G. S.; Abelson, J. R. J. Vac. Sci. Technol. A 2005, 23, 1619-1625.
14 Yang, Y.; Jayaraman, S.; Kim, D. Y.; Girolami, G. S.; Abelson, J. R. J. Cryst. Growth 2006, 294, 389-395.
15 Jayaraman, S.; Klein, E. J.; Yang, Y.; Kim, D. Y.; Girolami, G. S.; Abelson, J. R. J. Vac. Sci. Technol. A 2005, 23, 631-633.
16 Aspnes, D. E. Proc. Soc. Photo-Opt. Instrument. Eng. 1984, 452, 60-70.
17 Schmid, P. E.; Sunaga, M. S.; Levy, F. J. Vac. Sci. Technol. A-Vac. Surf. Films 1998, 16, 2870-2875.
18 Jellison, G. E.; Modine, F. A. Appl. Phys. Lett. 1996, 69, 371-373.
19 Tauc, J.; Grigorovici, R.; Vancu, A. Phys. Status Solidi 1966, 15, 627-637.
20 Hofmann, S. Prog. Surf. Sci. 1991, 36, 35-87.
21 Kumar, N.; Yanguas-Gil, A.; Daly, S. R.; Girolami, G. S.; Abelson, J. R. J. Am. Chem. Soc. 2008, 130, 17660-17661.
22 Yanguas-Gil, A.; Yang, Y.; Kumar, N.; Abelson, J. R. J. Vac. Sci. Technol. A 2009, 27(5), 1244-48.
23 Johansson, B. O.; Sundgren, J. E.; Helmersson, U.; Hibbs, M. K. Appl. Phys. Lett. 1984, 44, 670-672.
24 Kravchenko, O. V.; Kravchenko, S. E.; Polyakova, V. B.; Makhaev, V. D.; Borisov, A. P.; Semenenko, K. N. Koor. Khim. 1982, 8, 1650-1654.
25 Perry, A. J.; Schlapbach, L. Solid State Commun. 1985, 56, 837-841.
26 Perry, A. J.; Schlapbach, L.; Sproul, W. D. Solid State Commun. 1987, 62, 23-26.
27 Panayiotatos, Y.; Logothetidis, S.; Handrea, M.; Kautek, W. Diam. Relat. Mat. 2003, 12, 1151-1156.
28 Smith, F. T. J. J. Appl. Phys. 1970, 41, 4227.
29 Watanabe, K.; Taniguchi, T.; Kanda, H.-Nat. Mater. 2004, 3, 404-409.
30 Zunger, A.; Katzir, A.; Halperin, A. Phys. Rev. B 1976, 13, 5560-5573.
31 Singh, V. K.; Shaqfeh, E. S. G. J. Vac. Sci. Technol. A-Vac. Surf. Films 1993, 11, 557-568.
32 Zhao, Y. P.; Drotar, J. T.; Wang, G. C.; Lu, T. M. Phys. Rev. Lett. 2001, 87, 136102.
33 Yang, Y.; Jayaraman, S.; Sperling, B.; Kim, D. Y.; Girolami, G. S.; Abelson, J. R. J. Vac. Sci. Technol. A 2007, 25, 200-206.

Example 2

Growth Inhibitors to Enhance Nucleation Density in Thin Film Chemical Vapor Deposition Many nanotechnologies, especially those involved in the fabrication of integrated circuits, require low temperature deposition of extremely thin, pinhole-free and ultra-smooth films that are conformal on high aspect ratio features such as trenches and vias [1]. Growth processes in which the reaction rate of the precursor species can be limited to very small values, such as chemical vapor deposition (CVD) or atomic layer deposition (ALD), can meet the requirement for conformality [2-6]. However, poor nucleation, especially on dielectric substrates, seriously degrades the morphology [7,8]: if the areal density of nuclei is low, then the initial film growth takes place in an island mode and the film does not fully coalesce until its thickness is much larger than acceptable for the device design. In addition, the coalescence of large islands produces a large initial surface roughness and the inter-island material may have reduced density. To avoid these problems, the lateral spacing between nuclei needs to be comparable to, or preferably smaller than, the desired film thickness at which complete coalescence should occur, i.e. the nucleation process must occur with very high density on the substrate of choice.

Pre-treatment of the substrate surface can enhance the nucleation density. Reported methods include altering the chemical termination [9,10], abrasion [11], and etching by plasma species [12]. For demanding cases, such as the nucleation of diamond, complex surface modifications have been developed [11]. All these techniques afford nucleation enhancement, however, some are difficult or impossible to perform in high aspect ratio features and others induce surface damage.

Here, differential surface chemistry based on a growth rate inhibitor, which is injected continuously along with the precursor, to enhance the nucleation density in low temperature CVD is used. In the presence of the inhibitor, initial nuclei form but cannot grow very quickly; subsequent nuclei develop on bare areas of the substrate but likewise are unable to grow rapidly; ultimately the surface becomes densely populated with very small nuclei that coalesce into a smooth and continuous film. This approach does not require pre-treatment of the substrate surface and works equally well in high aspect ratio features.

The experimental system is the chemical vapor deposition of $HfB_2$ films on $SiO_2$ and $Si(100)$ substrates using the precursor $Hf(BH_4)_4$ plus ammonia ($NH_3$) as the inhibitor. In the absence of the inhibitor, AFM reveals initial islands up to 15 nm in height on $SiO_2$ substrates. With $NH_3$ present, full coalescence occurs at a thickness of ≤0.3 nm, with an rms surface roughness of only 0.3 nm and no surface asperity over 3 nm in height.

The present work involves the nucleation and growth of $HfB_2$ films using the $Hf(BH_4)_4$ precursor. $HfB_2$ is a highly refractory conductor ($T_{melt}$ ~3200° C.) that is an excellent diffusion barrier, e.g. against the migration of copper [13,14]. At low growth temperatures (200-300° C.), the films are essentially stoichiometric and pure, amorphous in diffraction measurements, and highly conformal on vias or trenches with high aspect ratios (≥30:1 at 200° C.) [15]. However, in-situ analysis of the growth on Si and $SiO_2$ substrates reveals significant delays before nucleation takes place [14-16].

Neutral molecules are useful as growth rate inhibitors in CVD processing. Examples include the deposition of $TiB_2$ films using $Ti(BH_4)_3(dme)$ as the precursor with dme (1,2-dimethoxyethane) as the inhibitor [17], and the deposition of $HfB_2$ films using $Hf(BH_4)_4$ as the precursor with $NH_3$ as the inhibitor [18]. At low substrate temperature, the addition of the inhibitor to the gas stream does not change the stoichiometry of the film or introduce impurity atoms from the inhibitor molecule. The lack of contamination indicates that the inhibitor can adsorb transiently and modify the surface reactivity, but does not dissociate. The use of inhibitors has wider applicability: many available precursors can afford films at low temperature but are too reactive, hence cannot afford conformal coatings; the addition of a suitable inhibitor would allow them to coat aspect ratios>10:1 [5,17].

The dependence of film growth rate on the partial pressure (incident flux) of the inhibitor species has been modeled using kinetic theory in which surface site blocking and/or associative desorption lowers the net reactivity of the precursor [6]. Both of the above examples fit quantitatively to this theory. For the CVD of $HfB_2$ at 250° C. using 0.10 mTorr of the $Hf(BH_4)_4$ precursor, the steady-state growth rate GR=16 [nm/min]/(1+250 $P_{NH3}$ [mTorr]). Thus, an ammonia pressure of only 0.04 mTorr reduces the growth rate by more than a factor of 10.

The present experiments are performed in a high vacuum chamber with a base pressure of $10^{-9}$ Torr, most of which is $H_2$ [19]. The substrate temperature is 250° C.; the partial pressure of $Hf(BH_4)_4$ precursor is 0.075 mTorr; and the partial pressure of $NH_3$ inhibitor is either zero or 0.05 mTorr. At these pressures, gas phase collisions are negligible; all rate-limiting processes must occur on the film growth surface. The substrates are 300 nm thick dry thermal $SiO_2$ on Si (grown under microelectronic conditions) and Si(100). Prior to introducing the $SiO_2$ substrate in the chamber, it is degreased in an ultrasonic bath using standard organic solvents followed by rinsing in DI water. The native oxide on the Si(100) surface is removed with 10% HF solution followed by a rinse in DI water. This treatment leaves the hydrogen terminated Si(100) surface which is stable against oxidation [20]. The precursor $Hf(BH_4)_4$ and the inhibitor $NH_3$ both have high vapor pressure at room temperature and are regulated using needle valves with no carrier gas. The film nucleation is monitored by in-situ spectroscopic ellipsometry (SE). No attempt was made to fit the SE data to an effective medium theory because the initial surface morphology can be highly anisotropic, e.g. a sparse population of tall islands. Nonetheless, the raw data provide a sensitive and very reproducible measure of the stages of the nucleation and coalesce processes [12]. Ex-situ analysis of the film surface is performed by tapping mode AFM and by field emission SEM.

Figure 11:
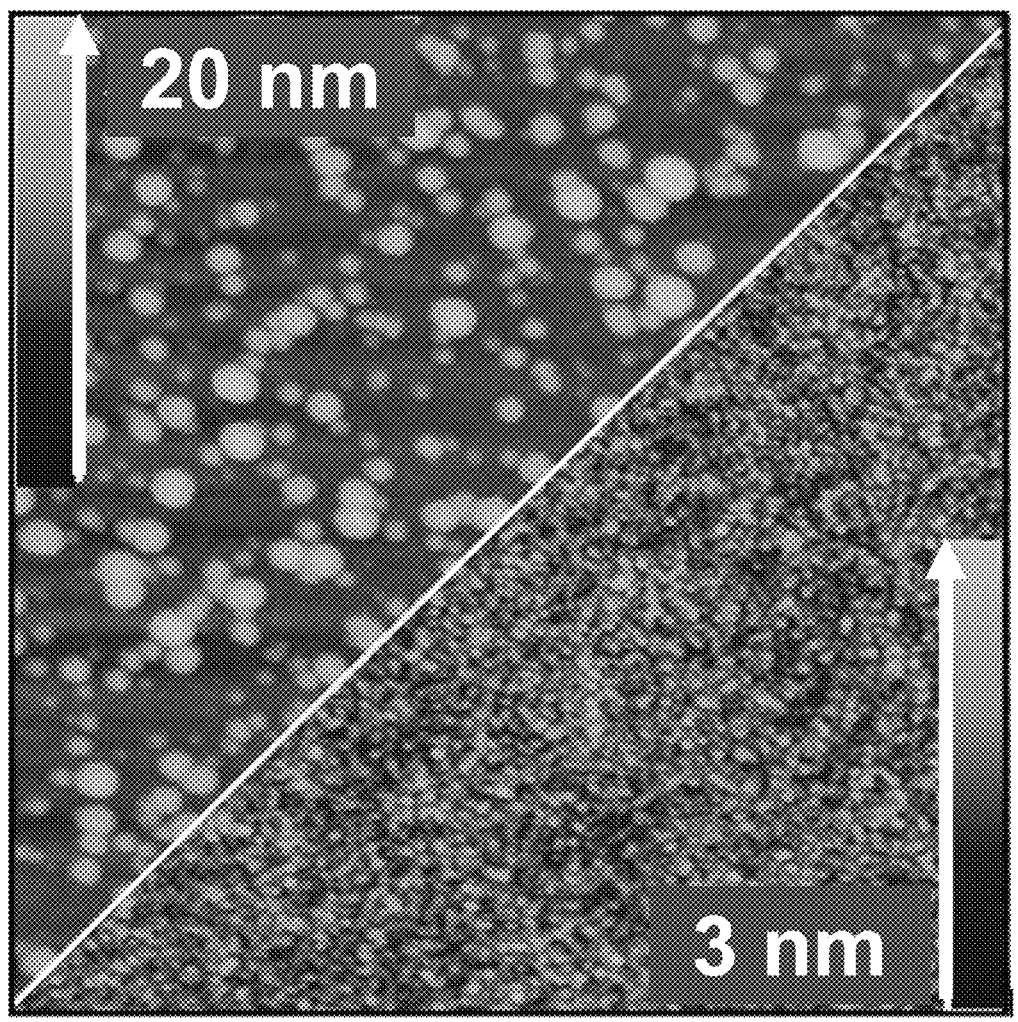
FIG. 11. (1×1) µm AFM images of $HfB_2$ nucleation on $SiO_2$ using the $Hf(BH_4)_4$ precursor alone (top left) and with a co-flow of $NH_3$ (bottom right). Note that the height scale bars are 20 nm and 3 nm, respectively.
Figure 12:
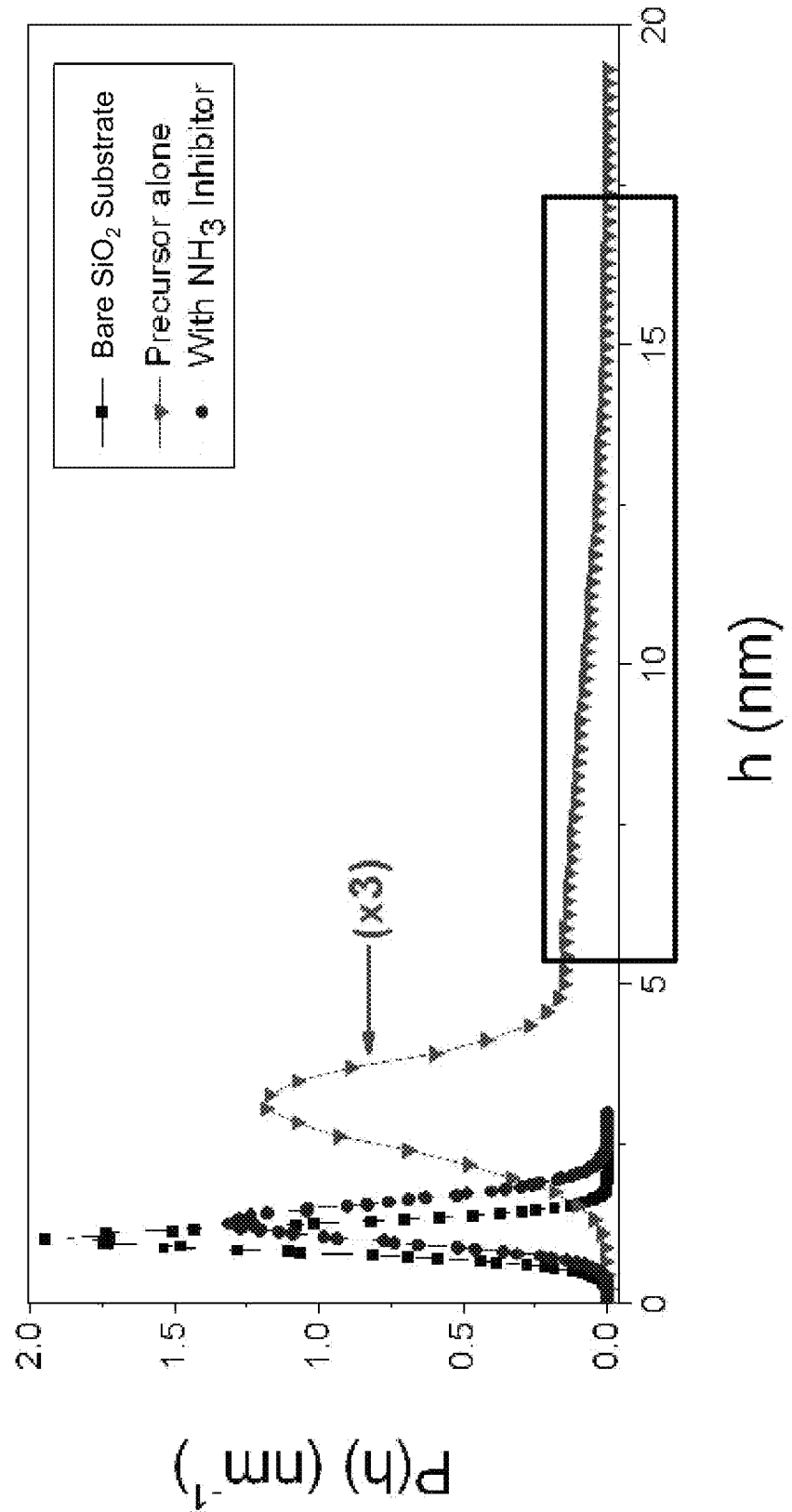
FIG. 12. Height distribution functions determined by AFM for the bare $SiO_2$ substrate (black squares) and for $HfB_2$ nuclei deposited using the precursor alone (red triangles) and with a co-flow of $NH_3$ (blue circles). In the latter case there is no experimental reference for the substrate height (there are no pinholes through the film) so the film thickness cannot be determined from the peak position. The inset black rectangle highlights the existence of a population of very tall nuclei for the case of precursor alone (red triangles).

SE data reveal dramatic changes in the nucleation kinetics due to the inhibitor. The imaginary component of the pseudo-dielectric constant $\rho$ is very sensitive to small quantities of optically absorbing film on the $SiO_2$ surface, which has a starting value of $\rho=2.03$. In a growth experiment using the precursor alone, $\rho$ changes very little during the first 8 min of growth, then turns sharply upwards and reaches a value of 2.30 at a total time of 12 min. At the end of this period (FIG. 11, top left) the areal density of nuclei is small ($4\times10^{10}/cm^2$) and the height distribution function P(h) is broad (FIG. 12, red triangles); the maximum island height is ~15 nm and the rms roughness 2.6 nm. When the experiment is repeated with 0.05 mTorr of $NH_3$ added to the gas mixture, $\rho$ increases linearly to ~2.09 over the first 25 min, then increases more rapidly to a value of ~2.14 for a total time of 35 min. At the end of this period (FIG. 11, bottom right), the surface is densely covered with nuclei ($1.3\times10^{11}/cm^{-2}$) with a very narrow nuclei size distribution (FIG. 12, blue circles). The maximum height-to-valley difference is 3 nm and the rms roughness is 0.3 nm. For reference, the height distribution function for the bare $SiO_2$ substrate (FIG. 12, black squares) has a similar rms roughness, 0.2 nm. The peak shift (0.24 nm) is less than the equivalent film thickness (0.3 nm) which suggest the absence of detectable pinholes. For these growth times without and with the inhibitor, the areal density of Hf atoms measured by RBS is similar, 0.8 and $1.0\times10^{15}/cm^2$, respectively. Dividing by the density of Hf atoms in bulk $HfB_2$ ($3.3\times10^{22}$ atoms/$cm^3$) affords equivalent average film thicknesses of 0.24 and 0.30 nm. Prior experiments reveal that the density of $HfB_2$ films is below bulk, $2.3\times10^{22}$ atoms/$cm^3$ under these growth conditions.

As shown in FIG. 12 the height distribution for conditions with precursor alone (triangles) exhibits a long tail corresponding to a distribution of heights ranging from 5 to about 15 nanometers. This feature, indicated by a box provided in FIG. 12, indicates that processing with the precursor alone results in formation of a significant number of large surface features (e.g., >5 nm) extending from the substrate surface. In contrast, the height distribution for conditions with precursor and $NH_3$ (circles) provided in FIG. 12 does not exhibit such a tail. This indicates that use of the smoothing agent results in a significantly more narrow height distribution and avoidance of such large features.

Figure 13:
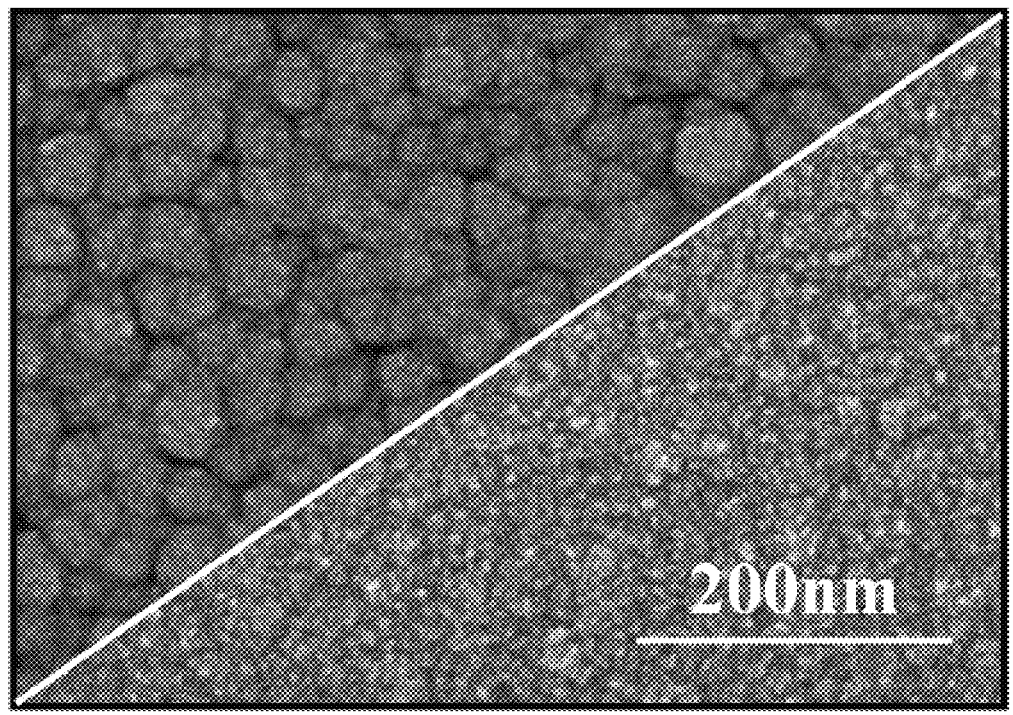
FIG. 13. SEM micrographs of $HfB_2$ grown on $SiO_2$ substrates: a 44 nm thick film using the precursor alone (top left) and a 44 nm thick film with $NH_3$ during the nucleation stage (bottom right).

The initial morphology has a strong influence on the subsequent microstructure. The above nucleation stages are repeated, followed by the growth of $HfB_2$ films at a rate of 6 nm/min in the absence of the inhibitor. (Note that a minor inhibition effect continues for ~40 sec after the ammonia injection is cut off due to the slow desorption of adsorbed ammonia from the room-temperature chamber walls.) A 44 nm thick $HfB_2$ film grown on the sparse nucleation layer (precursor alone) has a high rms roughness of ~4.3 nm (FIG. 13, top left). A 44 nm thick film grown on the dense nucleation layer (with inhibitor) has a low rms value of 1.7 nm with no indication of the mounding (FIG. 13, bottom right). It was previously shown that CVD, even under highly conformal growth conditions, is unable to smooth out initial surface roughness on long lateral length scales [21]. In the present case, sparse nucleation creates enough initial roughness to prevent the growth of smooth films.

The microscopic mechanism(s) associated with a growth inhibitor are difficult to fully determine from macroscopic measurements alone [6]. However, two important aspects can be inferred. First, the fact that nucleation continues on the substrate surface in the presence of $NH_3$ indicates that the inhibitor has only a small (if any) effect on the surface populations. The adsorption of $NH_3$ on hydroxylated $SiO_2$ surfaces has been previously studied in the context of low-temperature CVD of $SiO_2$. The adsorption data fit quantitatively to a BET multilayer model in which the first layer on the substrate had an adsorption energy of 0.41 eV and desorption prefactor of $1.0 \times 10^{12} \text{ s}^{-1}$ [22]. At the substrate temperature and $NH_3$ pressure (flux) used in these experiments, the model predicts a negligible surface coverage by $NH_3$ ($\theta$~0), evidently insufficient to prevent the formation of $HfB_2$ nuclei. The results of these studies, when scaled to the ammonia pressure and substrate temperature, indicate that $NH_3$ adsorbs only briefly on $SiO_2$ or on H-terminated Si surfaces, then returns to the gas phase without decomposition.

Second, if the pathway of $NH_3$ on the $HfB_2$ surface is to adsorb, slow or prevent film growth, then desorb back to the gas phase, then $NH_3$ is not consumed in steady-state. This implies that the partial pressure of $NH_3$ will equilibrate everywhere in a structure no matter how high its aspect ratio; in turn, the enhancement of nucleation due to the inhibitor will occur equally well everywhere since there is no depletion of $NH_3$. This is in sharp contrast to plasma or ion beam treatments that afford uneven fluxes on the inner surfaces of high aspect ratio features.

In summary, this Example provides a new method to enhance the areal density of nuclei during the low-temperature CVD of $HfB_2$ films on $SiO_2$ substrates. The method includes adding an inhibitor, $NH_3$, which greatly reduces the growth rate of first-formed $HfB_2$ nuclei but allows the nucleation process to proceed on bare areas of the substrate; eventually the surface becomes covered with a large density of fine nuclei. The presence of the inhibitor does not change the film stoichiometry or introduce nitrogen in detectable concentrations. The use of the inhibitor affords fully coalesced films at a thickness of only ~0.3 nm with a remarkably low rms roughness of 0.3 nm. This approach has the potential to enable formation of ultra-thin $HfB_2$ diffusion barriers (which are very effective against copper) on oxide dielectric surfaces for microelectronics. The present results indicate that the inhibition method also works with other precursor-inhibitor combinations.

References

1 Y. Shacham-Diamand, Journal of Electronic Materials 30, 336-344 (2001).
2 S. M. George, Chemical Reviews 110, 111-131 (2010).
3 H. Kim, Surface & Coatings Technology 200, 3104-3111 (2006).
4 B. S. Lim, A. Rahtu, and R. G. Gordon, Nature Materials 2, 749-754 (2003).
5 A. Yanguas-Gil, Y. Yang, N. Kumar, and J. R. Abelson, Journal of Vacuum Science & Technology A 27, 1235-1243 (2009).
6 A. Yanguas-Gil, N. Kumar, Y. Yang, and J. R. Abelson, Journal of Vacuum Science & Technology A 27, 1244-1248 (2009).
7 Y. Kajikawa and S, Noda, Applied Surface Science 245, 281-289 (2005).
8 A. Satta, J. Schuhmacher, C. M. Whelan, W. Vandervorst, S. H. Brongersma, G. P. Beyer, K. Maex, A. Vantomme, M. M. Viitanen, H. H. Brongersma, and W. F. A. Besling, Journal of Applied Physics 92, 7641-7646 (2002).
9 C. F. Pomarede, J. Roberts, and E. J. Shero, in U.S. Pat. No. 6,613,695 B2 ASM America, Inc., United States, (2003).
10 O, Sneh, T. E. Seidel, and C. Galewski, in U.S. Pat. No. 6,638,859 B2, Genus, Inc. United States, (2003).
11 W. Ahmed, C. A. Rego, R. Chemy, A. Afzal, N. Ali, and I. U. Hassan, Vacuum 56, 153-158 (2000).
12 N. Kumar, A. Yanguas-Gil, S. R. Daly, G. S. Girolami, and J. R. Abelson, Applied Physics Letters 95, 144107 (2009).
13 N. Kumar, Thesis, University of Illinois at Urbana-Champaign, 2009.
14 S. Jayaraman, Y. Yang, D. Y. Kim, G. S. Girolami, and J. R. Abelson, Journal of Vacuum Science & Technology A 23, 1619-1625 (2005).
15 Y. Yang, S. Jayaraman, D. Y. Kim, G. S. Girolami, and J. R. Abelson, Chemistry of Materials 18, 5088-5096 (2006).
16 Y. Yang, S. Jayaraman, B. Sperling, D. Y. Kim, G. S. Girolami, and J. R. Abelson, Journal of Vacuum Science & Technology A 25, 200-206 (2007).
17 N. Kumar, A. Yanguas-Gil, S. R. Daly, G. S. Girolami, and J. R. Abelson; Journal of the American Chemical Society 130, 17660 (2008).
18 N. Kumar, W. Noh, S. R. Daly, G. S. Girolami, and J. R. Abelson, Chemistry of Materials 21, 5601-5606 (2009).
19 S. Jayaraman, E. J. Klein, Y. Yang, D. Y. Kim, G. S. Girolami, and J. R. Abelson, Journal of Vacuum Science & Technology A 23, 631-633 (2005).
20 H. F. Okorn-Schmidt, IBM Journal of Research and Development 43, 351-365 (1999).
21 B. A. Sperling and J. R. Abelson, Appl. Phys. Lett. 85, 3456-3458 (2004).
22 J. W. Klaus and S. M. George, Journal of the Electrochemical Society 147, 2658-2664 (2000).
23 M. J. Dresser, P. A. Taylor, R. M. Wallace, W. J. Choyke, and J. T. Yates, Surface Science 218, 75-107 (1989).

Example 3

Nucleation and Growth of Cu Films Using Smoothing Agents

Nucleation and growth of thin Cu films on copper oxide substrates (e.g., $CuO/CuO_2$) is examined using a Cu(hfac)

vtms or Cu(hfac)MHY precursor in the presence and absence of a smoothing agent comprising vtms or MHY. These results are compared to experiments corresponding to growth of smooth $HfB_2$ layers using $Hf(BH_4)_4$ precursor gas and an $NH_3$ smoothing agent.

Figure 14:
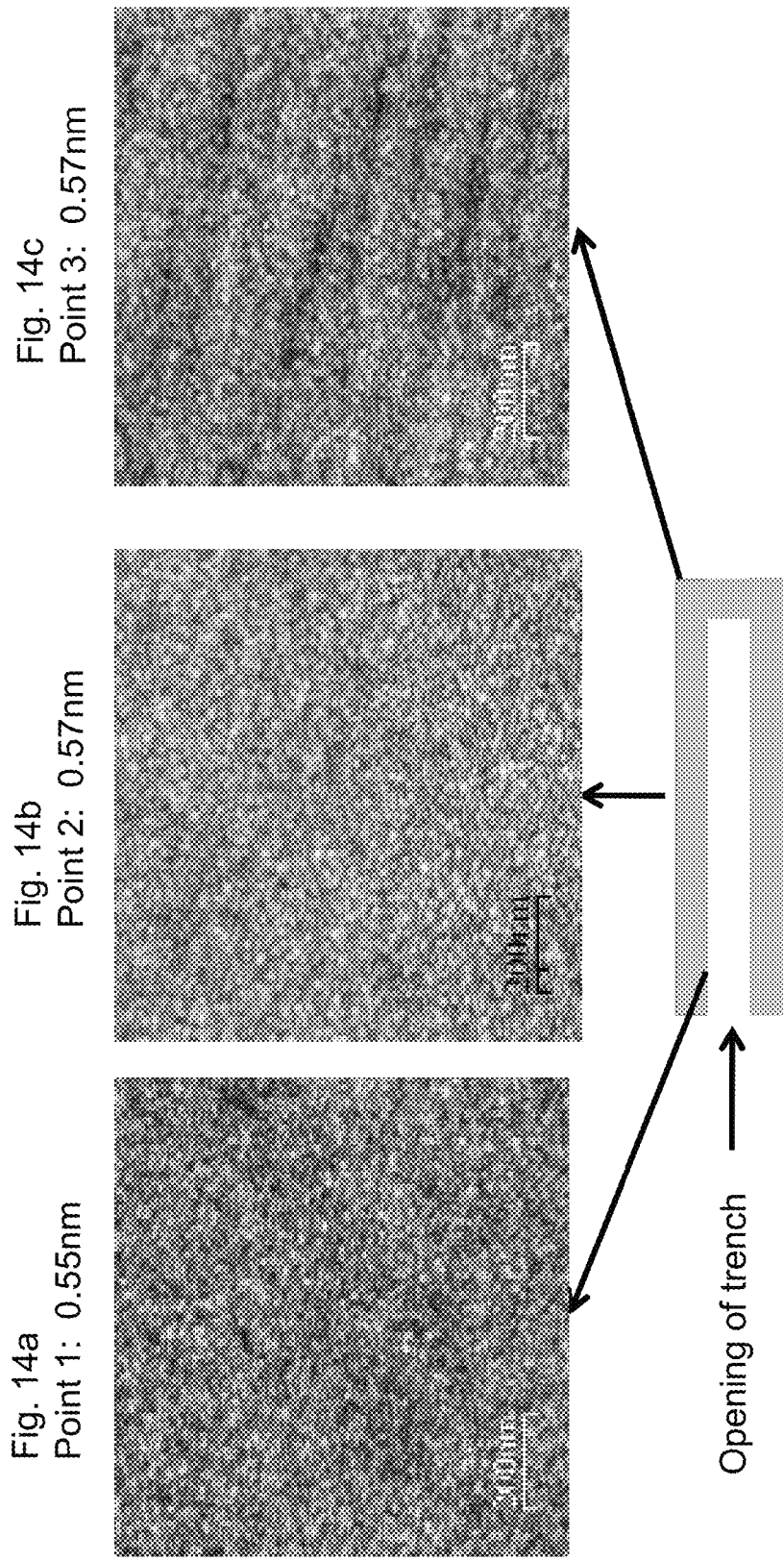
FIG. 14. AFM images of a $HfB_2$ film fabricated according to exemplary methods of the present invention at three positions of a recessed feature (250 micron width, $1.5 \times 10^4$ micron depth) of a $SiO_2$ substrate: (a) at the opening of a trench, (b) at the midpoint of an interior sidewall of the trench, and (c) at the bottom of the trench. Note that nucleation is substantially uniform along an aspect ratio of 60:1.
Figure 15:
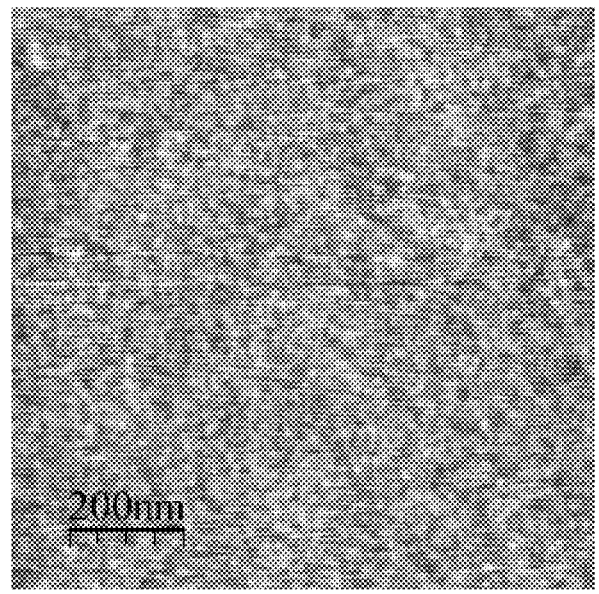
FIG. 15. An AFM image of the $SiO_2$ substrate of FIG. 14 prior to film growth. The featureless characteristic of the substrate indicates that the rms roughness and image contrast of FIG. 14 correspond to growth of nuclei.

FIG. 14 provides AFM images of a $HfB_2$ film fabricated according to exemplary methods of the present invention at three positions of a recessed feature (250 micron width, $1.5 \times 10^4$ micron depth) of a $SiO_2$ substrate: (a) at the opening of a trench, (b) at the midpoint of an interior sidewall of the trench, and (c) at the bottom of the trench. The results in FIG. 14 demonstrate that the present methods provide substantially uniform nucleation along a recessed feature having aspect ratio of 60:1. Still referring to FIG. 14, the conditions employed are a macro trench: 250 micron width—$1.5 \times 10^4$ micron depth; $SiO_2$ substrate; inhibitor: $NH_3$; growth temperature 250° C.; precursor pressure: 0.065 mTorr $Hf(BH_4)_4$. Very little film was grown, which means that the consumption of precursor gas down the axis of the trench was minimal. Therefore, it is possible that the precursor and inhibitor partial pressures were essentially uniform everywhere in the feature. Note that if film were to grow at a significant rate compared with transport by gas phase diffusion, then the precursor pressure would be much smaller at the bottom of the feature. But indeed, nucleation has taken place everywhere with approximately the same roughness. FIG. 15 provides an image of the substrate prior to the nucleation procedure. A comparison of FIGS. 14 and 15 shows that the observed rms surface roughness and image contrast corresponds to the growth of nuclei.

FIG. 16 provides SEM micrographs of copper films grown on copper oxide substrates from: (a) Cu(hfac)vtms precursor alone and (b) Cu(hfac)vtms precursor together with a vtms smoothing agent. The substrate was prepared by exposure of an e-beam copper film to air to form the oxide. As shown by a comparison of FIGS. 16a and 16b use of a vtms smoothing agent results in a substantially more smooth thin Cu film, but of the roughness of the substrate itself.

FIGS. 17-20 provide a series of SEM micrographs corresponding to a copper film grown on a copper oxide substrate using a Cu(hfac)MHY precursor in the presence and absence of a vtms smoothing agent or a MHY smoothing agent. Two micrographs are provided in each figure with different angle views.

Figure 17:
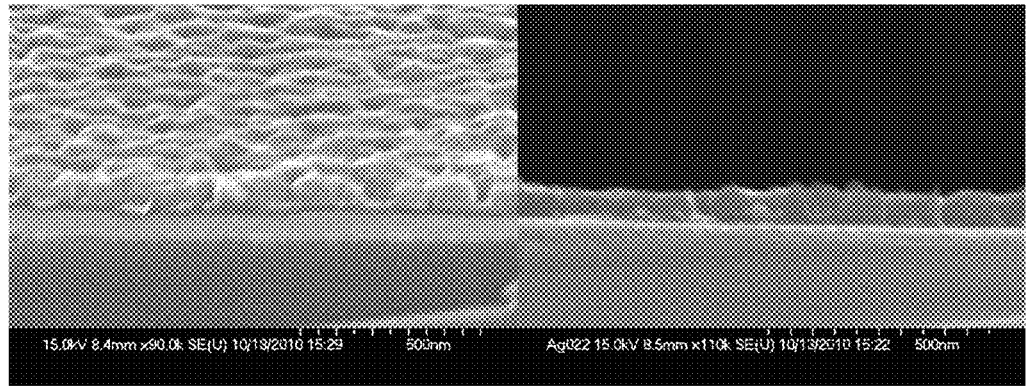
FIG. 17. SEM micrographs of a copper film grown on a copper oxide substrate from Cu(hfac)MHY (2.2 mTorr).
Figure 18:
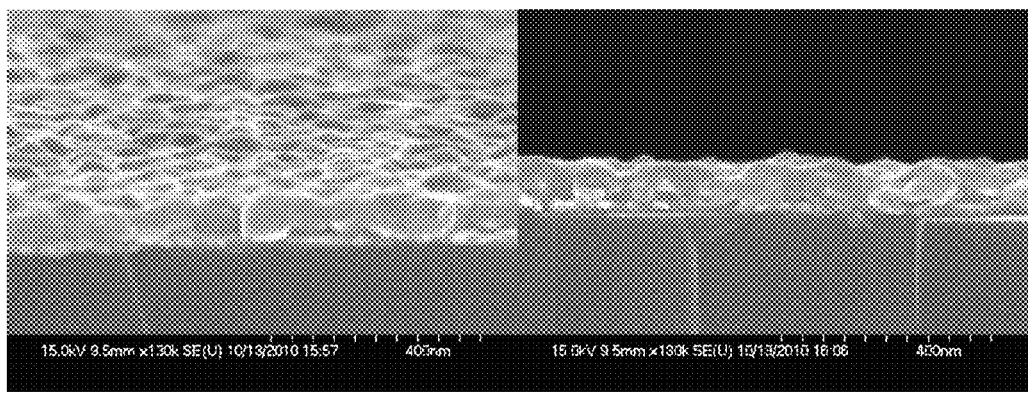
FIG. 18. SEM micrographs of a copper film grown on a copper oxide substrate from Cu(hfac)MHY+VTMS (3.6 mTorr).
Figure 19:
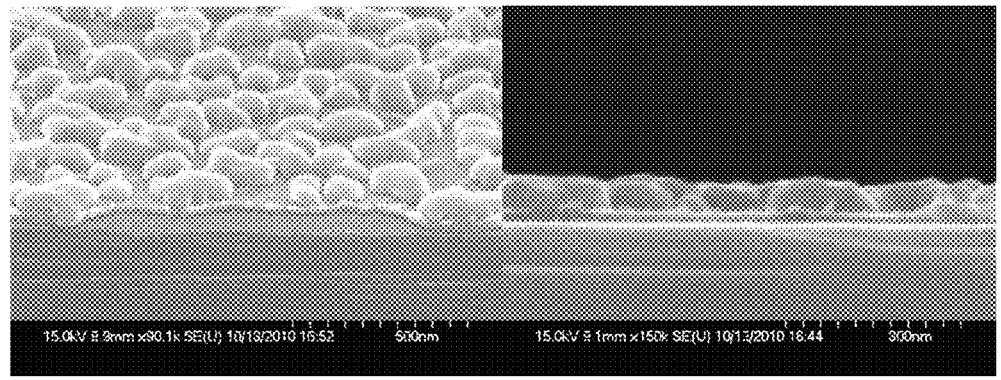
FIG. 19. SEM micrographs of copper films grown on copper oxide substrates from Cu(hfac)MHY+VTMS (3.6 mTorr) (left) and Cu(hfac)MHY (2.2 mTorr) (right).

FIG. 17 provides SEM micrographs of a copper film grown on a copper oxide substrate from Cu(hfac)MHY at a pressure of 2.2 mTorr in the absence of a smoothing agent. FIG. 18 provides SEM micrographs of a copper film grown on a copper oxide substrate from Cu(hfac)MHY and vtms at a pressure of 3.6 mTorr. FIG. 19 provides SEM micrographs of copper films grown on copper oxide substrates from Cu(hfac) MHY and vtms at a pressure of 3.6 mTorr and Cu(hfac)MHY at a pressure of 2.2 mTorr.

Figure 20:
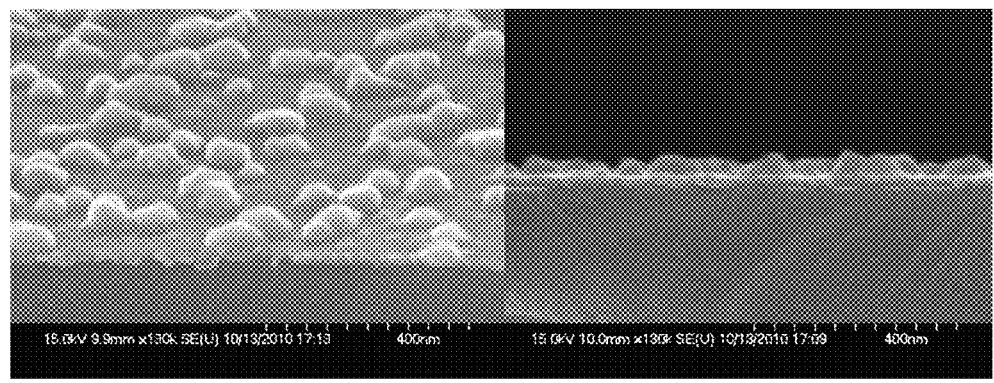
FIG. 20. SEM micrographs of a copper film grown on a copper oxide substrate from Cu(hfac)MHY+MHY (2.6 mTorr).
Figure 21:
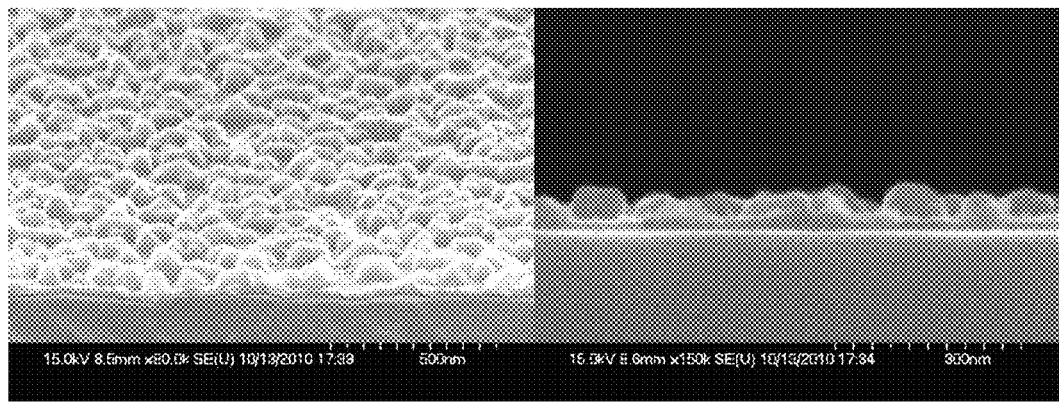
FIG. 21. SEM micrographs of a copper film grown on a copper oxide substrate from Cu(hfac)MHY+MHY (2.5(5) mTorr).

FIG. 20 provides SEM micrographs of a copper film grown on a copper oxide substrate from Cu(hfac)MHY and MHY at a pressure of 2.6 mTorr. FIG. 21 provides SEM micrographs of a copper film grown on a copper oxide substrate from Cu(hfac)MHY and MHY at a pressure of 2.5(5) mTorr).

Example 4

Growth Inhibitors to Enhance Nucleation Density in Thin Film Chemical Vapor Deposition The chemical vapor deposition of a thin film begins with the process of nucleation on a substrate: the initial morphology consists of small islands of material separated by bare areas of the substrate surface. Island growth and the ongoing nucleation of islands eventually afford complete coverage of the substrate surface, termed coalescence. However, when the process of nucleation is kinetically slow with respect to the rate at which islands grow, the initial deposit consists of a low areal density of relatively tall islands. In this situation, coalescence occurs only when the total deposit is relatively thick, and the surface roughness is very large due to the peak-and-valley morphology. This outcome is unacceptable when the objective is to deposit a very smooth film only a few nm thick, because many of the valleys will actually be pinholes. Use of molecular inhibitors is introduced here as a means to solve the initial morphology problem. The inhibitor binds weakly enough to the bare substrate surface that nucleation proceeds, but strongly enough to the islands that their growth rate is significantly retarded. The net effect is to modify the rates of surface processes in favor of nucleation over growth, such that the initial deposit consists of a large areal density of small islands that coalesce into a very smooth film. This mechanism is demonstrated for the growth of the metallic ceramic $HfB_2$ on $SiO_2$ from the single source precursor tetrakis(tetrahydroborato)hafnium, $Hf(BH_4)_4$. For growth with the $Hf(BH_4)_4$ precursor alone, the island density is $\sim 6 \times 10^{10}$ islands/$cm^2$ and the rms roughness is 2.6 nm at an equivalent film thickness of 0.24 nm. When ammonia ($NH_3$) is used as an inhibitor, i.e. co-flowed with the precursor, the island density increases to $3 \times 10^{12}$ islands/$cm^2$ and the islands have a narrow size distribution that affords a rms roughness of 0.3 nm at an equivalent thickness of 0.3 nm. However, the film composition remains $HfB_2$ with negligible N content, indicating that the inhibitor is ultimately released from the growth surface rather than incorporated into the film. Use of inhibitors to enhance nucleation density may be a general phenomenon that is applicable for many other precursor-inhibitor combinations.

Many nanotechnologies, especially those involved in the fabrication of integrated circuits, require low temperature deposition of extremely thin, pinhole-free, and ultra-smooth films that are conformal on high aspect ratio features such as trenches and vias [1]. Growth processes in which the sticking coefficients of the precursor species are small, such as chemical vapor deposition (CVD) or atomic layer deposition (ALD), are best suited to meet the requirement for conformality [2-6]. However, if the nucleation rate is low relative to the steady-state growth rate, then the initially deposited layer will consist of a broad size distribution of islands, i.e., the film will be very rough and may have pinholes or regions of reduced physical density [7-9]. This morphology results because the initially formed islands will grow to large sizes before additional islands can nucleate and "fill in" the gaps between islands on the surface. This problem is commonly encountered in the deposition of metallic films on dielectric substrates; for example, in the deposition $HfB_2$ on $SiO_2$ (FIG. 11, top left), the film does not coalesce until its peak thickness (15-17 nm) is much larger than the desired film thickness (a few nm).

To obtain films that are conformal, thin, smooth, and pinhole-free, the lateral spacing between nuclei needs to be comparable to, or preferably smaller than, the desired film thickness, i.e., the nucleation process must occur with very high areal density on the substrate of choice and the size distribution must be narrow.

It is well known that the nucleation density in CVD and ALD processes can be increased by pre-treating the substrate surface to create 'active' sites, such as dangling bonds, where reaction with the precursor occurs with high probability. Under favorable conditions, a large density of islands forms in a short time and the islands then coalesce by growth to afford a smooth film. Reported methods to activate the substrate include chemical modification [10, 11], physical abrasion [12], and plasma etching [13]. For demanding cases, such as the nucleation of diamond, complex surface modifications have been developed [12]. Although all of these techniques enhance nucleation, some are difficult or impossible to perform in high aspect ratio features and others may damage the substrate.

Here, a new method to enhance the nucleation density in low temperature CVD is reported. A growth rate inhibitor is injected along with the precursor molecule to suppress the island growth rate with respect to the nucleation rate. This differential change in the rates of surface processes affords a very uniform nucleation layer. No substrate pre-treatment is required and the method works equally well in very high aspect ratio features.

Application of Inhibitors to the Nucleation Regime

Figure 22:
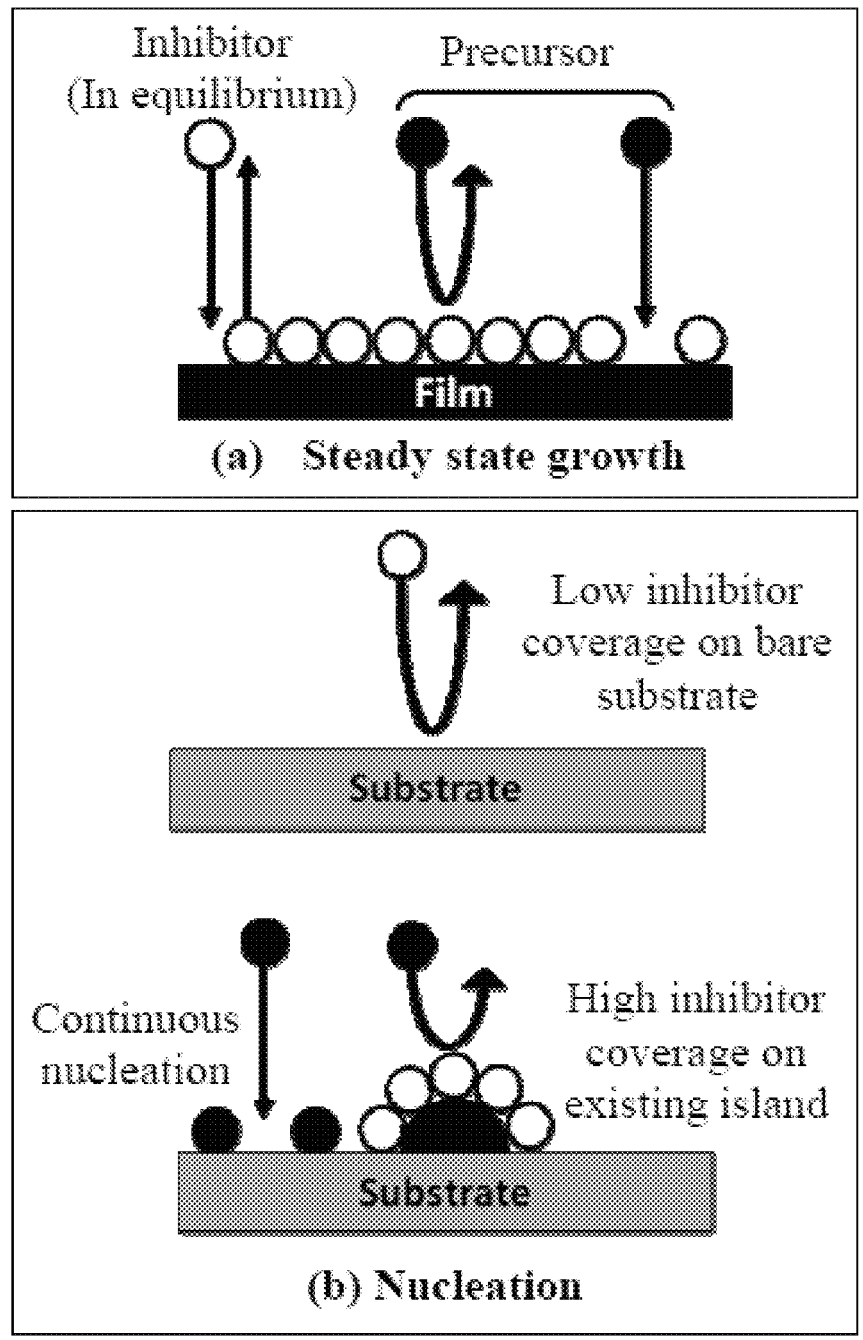
FIG. 22. Proposed role of growth inhibitors. (a) In the presence of large amounts of a growth inhibitor, the steady state film growth rate is lowered by site blocking. (b) In the presence of a growth inhibitor that binds weakly to the substrate but strongly to the deposited film, there is no inhibition during the film nucleation stage (top); at later times, a reduced growth rate of initially formed islands with continuing nucleation on the remaining regions of bare substrate (bottom).

The inventors have recently demonstrated several examples of the use of neutral molecules as steady state growth rate inhibitors in CVD to improve the conformality of film growth. Examples include the deposition of $TiB_2$ films using $Ti(BH_4)_3(dme)$ as the precursor with dme (1,2-dimethoxyethane) as the inhibitor [14], and the deposition of $HfB_2$ films using $Hf(BH_4)_4$ as the precursor with $NH_3$ as the inhibitor [15]. At low substrate temperatures, the addition of these inhibitors to the gas stream does not change the stoichiometry of the film or introduce impurity atoms from the inhibitor molecule. The lack of contamination suggests that the inhibitor adsorbs transiently and reversibly to the surface, where it reduces the reaction probability (and consumption rate) of the precursor (FIG. 22(a)) [6]. As a result, conformality within recessed features is improved because the gas phase precursor concentration suffers less depletion as a function of depth [5, 14].

The presently proposed method to enhance nucleation density is to use a similar inhibition effect to decrease the growth rate of islands relative to the nucleation rate on the substrate. The inhibitor should have a relatively low binding energy to the substrate surface so that, at appropriate partial pressures of inhibitor, the steady-state coverage on the surface is low whereas the binding energy and surface coverage are higher on the islands (FIG. 22(b) top and bottom, respectively). Under these conditions, initial nuclei form but then become covered with inhibitor and cannot grow very quickly. Subsequent nuclei develop on bare areas of the substrate but likewise are unable to grow rapidly. Ultimately the surface becomes densely populated with very small nuclei that coalesce into a smooth and continuous film. This approach has the advantage that it does not require pre-treatment of the substrate surface. Because the inhibitor is not consumed during film growth, the inhibitor pressure quickly becomes constant everywhere in a high aspect ratio feature and the enhancement in nucleation density should be uniform.

Experimental System: $HfB_2$, a Metallic Ceramic

The present work builds on past studies of the nucleation and growth of $HfB_2$ films using the single source precursor $Hf(BH_4)_4$. $HfB_2$ is a highly refractory conductor ($T_{melt}$~3200° C.) that is an excellent diffusion barrier, e.g., against the migration of copper [16, 17]. At low growth temperature (200-300° C.), the films are essentially stoichiometric and pure, amorphous in diffraction measurements, and highly conformal on vias or trenches, with step coverages typically of 0.9 on a trench of 30:1 aspect ratio [18]. In situ analysis of the growth on $SiO_2$ and H-terminated Si substrates reveals that there is a nucleation delay [17-19]. Results below show that islands grow and the deposits are highly rough during this incubation period.

Investigations of the inhibition of $HfB_2$ film growth from $Hf(BH_4)_4$ with ammonia ($NH_3$) as the inhibitor are performed in a turbo-pumped chamber of ultrahigh vacuum construction [20]. The substrates are 100 nm thick dry thermal $SiO_2$ on Si (grown under microelectronic conditions) and Si(100). Before the $SiO_2$ substrate is introduced into the chamber, it is degreased successively with acetone and isopropyl alcohol in an ultrasonic bath and then is rinsed with DI water. The native oxide on the Si(100) surface is removed with 10% HF solution followed by a rinse in DI water. This treatment generates a hydrogen terminated Si(100) surface, which is stable against oxidation [21]. The substrate temperature during film growth is 250° C.; the partial pressure of $Hf(BH_4)_4$ is 0.075 mTorr; and the partial pressure of $NH_3$ inhibitor is either zero or 0.05 mTorr. At these pressures, gas phase collisions are negligible; all rate-limiting processes must occur on the film growth surface. The pressures of the precursor and the inhibitor are regulated using needle valves with no carrier gas. The nucleation and growth of the thin films are monitored using in-situ spectroscopic ellipsometry (SE) with a fixed incident angle of 70° and a continuous spectrum of photon energies in the range 0.75-5.05 eV. Ex situ analysis of the film surface is performed by tapping mode AFM, by RBS, and by field emission SEM.

Growth of the nucleation layer. In-situ spectroscopic ellipsometry is a sensitive and reproducible means to determine when initial islands have formed on the substrate [13]. Because the initial morphology can be highly anisotropic, e.g., a sparse population of tall islands, it is not physically meaningful to fit the data to an effective medium theory. However, a multilayer optical model, consisting of a thin $HfB_2$ film on the $SiO_2$/Si substrate, can be used to assess the order of magnitude of the optical response. Using the Woollam [EASE] software with the optical data for thick $HfB_2$ films [19] shows that a $HfB_2$ thickness of 0.3 Å affords a 1% increase in the imaginary component of the complex reflectivity $\rho$ at a photon energy of 2.42 eV. There is less change at very low or very high photon energies, presumably due to the coherent interference effects introduced by the $SiO_2$ sublayer.

For the present example, the initial growth was interrupted when im($\rho$) at 2.42 eV had increased by ~7%, using either the precursor alone or the precursor plus inhibitor. Although this procedure in no way guarantees that the quantity of deposited material should be the identical, RBS analysis reveals that the areal density of Hf atoms is very similar: with precursor alone, growth was stopped at 12 minutes and the Hf density is $0.8 \times 10^{15}$ atoms/cm$^2$; with the inhibitor, growth was stopped at 35 min and the Hf density is $1.0 \times 10^{15}$ atoms/cm$^2$. Dividing by the density of Hf atoms in bulk $HfB_2$ ($3.3 \times 10^{22}$ atoms/cm$^3$) affords equivalent film thicknesses of 0.24 and 0.30 nm, respectively. (In fact, the density of $HfB_2$ films grown under these conditions is only 70% of the bulk value, but that does not affect the present results [17].) The similar quantity of material implies that a direct comparison can be made between the initial morphologies, as opposed to a situation in which the morphologies differ because more or less $HfB_2$ has been deposited.

Enhanced nucleation density. In the absence of the inhibitor (FIG. 11, top left), the density of $HfB_2$ nuclei is small ($6 \times 10^{10}$ nuclei/cm$^2$) and the height distribution function P(h) is broad (FIG. 12, red triangles). The maximum island height is 17 nm and the rms roughness is 2.6 nm. In contrast, in the presence of the inhibitor (FIG. 11, bottom right), the surface is densely covered with nuclei (~$3 \times 10^{12}$ nuclei/cm$^2$) with a very narrow size distribution (FIG. 12, blue circles). The maximum height-to-valley difference is 2.5 nm and the rms roughness is 0.3 nm. For reference, the height distribution function for the bare $SiO_2$ substrate has a rms roughness of 0.2 nm (FIG. 12, black circles). In the presence of the inhibitor, the mean feature height (0.24 nm) is less than the equivalent film thickness (0.3 nm), which is consistent with the absence of detectable pinholes.

Evolution of surface roughness. The initial morphology has a very strong influence on the surface roughness at later stages of film growth. To demonstrate this point, thicker films were grown on top of two contrasting initial morphologies: (a) sparse islands in a broad size distribution, and (b) dense islands in a narrow height distribution, similar to the results in FIG. 12. For each initial morphology, $HfB_2$ films were grown on top at a rate of ~2 nm/min using the precursor alone, or at a rate of ~0.2 nm/min using both the inhibitor and precursor. (The effective film thickness based on RBS measurement of the areal density of Hf atoms is referred to throughout.) The lower growth rate corresponds to a precursor sticking coefficient of $<10^{-3}$.

Figure 23:
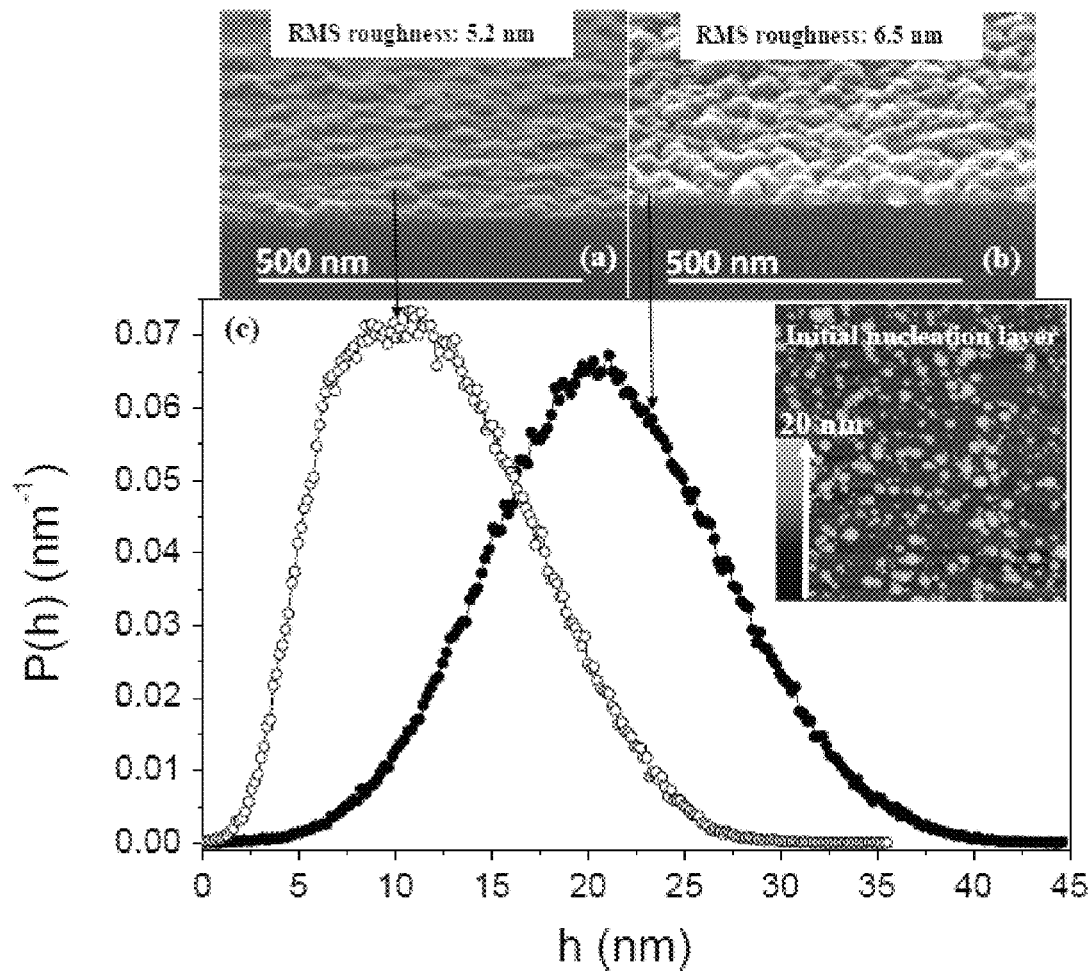
FIG. 23. Effect of the sparse nucleation layer on the morphology of a 20 nm thick film: (a) slow growth (with inhibitor) and (b) fast growth (without inhibitor). (c) Height distribution functions. In (a), the reduced sticking coefficient of the precursor smoothes the local roughness, but cannot eliminate the mounding due to the islands formed during the nucleation stage, $t_{growth}$=40 min and 4 min, respectively. $T_{growth}$=250° C., $P_{precursor}$=0.075 mTorr, $P_{NH3}$=0.050 mTorr.

Consider first growth on the sparse nucleation layer. A 7.8 nm thick film grown on this nucleation layer using the precursor alone has a rms roughness of 6.5 nm and $~4 \times 10^{10}$ $cm^{-2}$ of mounds in a broad height distribution (FIG. 23, black filled circles). For comparison, a 6.5 nm thick film grown on the sparse nucleation layer in the presence of the inhibitor exhibits very smooth areas on the surface, but also has $~2 \times 10^{10}$ $cm^{-2}$ of mounds and a rms roughness of ~5.2 nm (FIG. 23, black open circles). Thus, the sparse nucleation layer creates enough initial roughness to prevent the growth of a smooth thick film, irrespective of whether the additional film is grown in the presence or absence of an inhibitor.

The latter result is at first somewhat surprising, because it is known that lowering the sticking coefficient of a CVD precursor generally favors higher conformality (less depletion in recesses) and also favors the growth of smooth surfaces [22,23]. Therefore, it might have been expected that the initial rough morphology of a sparsely-nucleated layer could be eliminated by the growth of a sufficiently thick film on top, especially if the sticking coefficient of the precursor is lowered by the presence of an inhibitor. Consistent with earlier studies, however, the present results confirm that CVD is unable to smooth out initial surface roughness on long lateral length scales, even under highly conformal growth conditions [24]. This result is due to the instability against roughening caused by peak shadowing [22].

Figure 24:
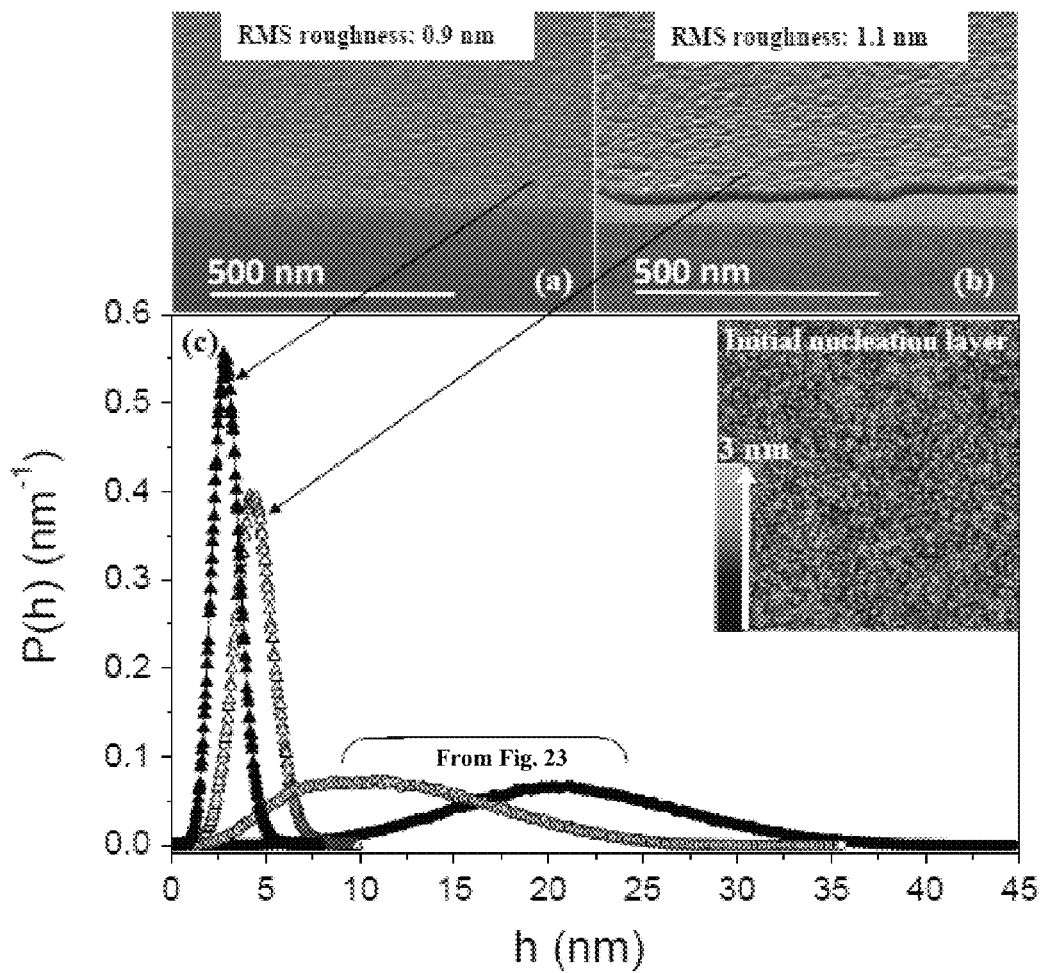
FIG. 24. Effect of the dense and smooth nucleation layer on the morphology of a 20 nm thick film: (a) slow growth (with inhibitor) and (b) fast growth (without inhibitor). (c) Height distribution functions. Note that the same growth conditions that produced a very rough film in FIG. 23(b) here afford a low surface roughness, $t_{growth}$=44 min and 4 min, respectively $T_{growth}$=250° C., $P_{precursor}$=0.075 mTorr, $P_{NH3}$=0.050 mTorr.

Consider next growth on the smooth and more uniform nucleation layer. A 5.7 nm thick film grown on this nucleation layer in the presence of the inhibitor has a rms roughness of only 0.9 nm and a very narrow height distribution (FIG. 24, black empty triangles). This is an excellent result, but has the drawback that the film growth rate is relatively slow, ~0.2 nm/min. Surprisingly, a 15.2 nm thick film grown using the precursor alone has a similarly small rms roughness of 1.1 nm and a narrow height distribution (FIG. 24, black filled triangles). This experiment shows that, when the initial nucleation morphology is extremely smooth, very smooth and fully coalesced films can be grown on top of the nucleation layer even with a precursor having a relatively high sticking coefficient. (Of course, for the growth of thicker films, the surface must slowly become rougher [24].) The above procedure is technologically attractive: the total deposition time can be kept acceptably short by using the inhibitor only during the nucleation stage, i.e., slow nucleation followed by rapid film growth.

In this embodiment, a smooth layer of a preselected thickness is formed on a substrate at a relatively slow film growth rate. Once the smooth layer is fully coalesced, injection of an inhibitor gas/smoothing agent is stopped. Injection of a precursor gas continues, in the absence of the smoothing agent, thereby thickening the initially deposited smooth layer at an increased growth rate without substantially increasing rms roughness (i.e., rms roughness increases less than about 20%, or less than about 30%). This method, involving formation of a smooth layer in the presence of a smoothing agent and thickening of the smooth layer in the absence of the smoothing agent, provides commercial advantages by reducing reagent usage while simultaneously increasing film thickness in a cost- and time-efficient manner.

The microscopic mechanism(s) responsible for growth inhibition in the present example cannot be fully determined from macroscopic measurements alone [6]. However, two important aspects of the mechanism can be inferred. First, the fact that nucleation continues on the substrate surface in the presence of $NH_3$ indicates that the inhibitor has only a small (if any) effect on the surface populations of growth species. The adsorption of $NH_3$ on hydroxylated $SiO_2$ surfaces has been previously studied in the context of low-temperature CVD of $SiO_2$. The adsorption data could be fitted quantitatively to a BET multilayer model in which the first layer on the substrate had an adsorption energy of 0.41 eV and a desorption prefactor of $1.0 \times 10^{12}$ $s^{-1}$ [25]. Furthermore, a study of $NH_3$ adsorption on the hydrogen terminated Si(100) surface indicated that no ammonia adsorption or decomposition takes place [26]. For the substrate temperature and $NH_3$ pressure (flux) used in the experiments, these results predict a negligible $NH_3$ surface coverage ($\theta$~0). Evidently, however, $NH_3$ must bind with a higher coverage on the surface of the $HfB_2$ nuclei, where it inhibits further growth by slowing down deposition of additional material from the precursor, probably by a site blocking effect.

If $NH_3$ adsorbs only weakly on $SiO_2$ or on H-terminated Si surfaces, and returns to the gas phase without decomposition or consumption, then the partial pressure of $NH_3$ will, following an initial time delay, equilibrate to the same value everywhere in a structure no matter how high its aspect ratio. This behavior implies that the enhancement of nucleation due to the inhibitor will occur equally well on all surfaces. A preliminary confirmation of this assertion using trenches of 200:1 aspect ratio (not shown) has been obtained. This behavior is in sharp contrast to plasma or ion beam treatments, which are unable to afford uniform fluxes on the inner surfaces of high aspect ratio features.

A new method to enhance the areal density of nuclei during low-temperature CVD by adding a neutral molecular growth inhibitor has been demonstrated. This method has been demonstrated for the growth of $HfB_2$ films on $SiO_2$ substrates using $NH_3$ as the inhibitor. $NH_3$ greatly reduces the film growth rate on already established $HfB_2$ nuclei, but allows the nucleation process to proceed largely unimpeded on bare areas of the substrate; eventually the surface becomes covered with a large density of fine nuclei with a narrow size distribution. The presence of the inhibitor does not change the film stoichiometry or introduce nitrogen in detectable concentrations. In the presence of the inhibitor, the precursor affords fully coalesced films at a thickness of only ~0.3 nm with a remarkably low rms roughness of 0.3 nm. This approach has the potential to enable the rapid and controllable formation of ultra-thin $HfB_2$ diffusion barriers (which are very effective against copper) on oxide dielectric surfaces for microelectronics. Preliminary results indicate that the inhibition method also works with other precursor-inhibitor combinations.

References
1. Y. Shacham-Diamand, Journal of Electronic Materials 30 (4), 336-344 (2001).
2. S. M. George, Chemical Reviews 110 (1), 111-131 (2010).
3. H. Kim, Surface & Coatings Technology 200 (10), 3104-3111 (2006).
4. B. S. Lim, A. Rahtu and R. G. Gordon, Nature Materials 2 (11), 749-754 (2003).
5. A. Yanguas-Gil, Y. Yang, N. Kumar and J. R. Abelson, Journal of Vacuum Science & Technology A 27 (5), 1235-1243 (2009).
6. A. Yanguas-Gil, N. Kumar, Y. Yang and J. R. Abelson, Journal of Vacuum Science & Technology A 27 (5), 1244-1248 (2009).
7. Y. Kajikawa and S, Noda, Applied Surface Science 245 (1-4), 281-289 (2005).
8. A. Salta, J. Schuhmacher, C. M. Whelan, W. Vandervorst, S. H. Brongersma, G. P. Beyer, K. Maex, A. Vantomme, M. M. Viitanen, H. H. Brongersma and W. F. A. Besling, Journal of Applied Physics 92 (12), 7641-7646 (2002).
9. L. Baker, A. S. Cavanagh, D. Seghete, S. M. George, A. J. M. Mackus, W. M. M. Kessels, Z. Y. Liu and F. T. Wagner, Journal of Applied Physics 109 (8).
10. C. F. Pomarede, J. Roberts and E. J. Shero, U.S. Pat. No. 6,613,695 B2 (Sep. 2, 2003).
11. O. Sneh, T. E. Seidel and C. Galewski, U.S. Pat. No. 6,638,859 B2 (Oct. 28, 2003 2003).
12. W. Ahmed, C. A. Rego, R. Chemy, A. Afzal, N. Ali and I. U. Hassan, Vacuum 56 (3), 153-158 (2000).
13. N. Kumar, A. Yanguas-Gil, S. R. Daly, G. S. Girolami and J. R. Abelson, Applied Physics Letters 95 (14) (2009).
14. N. Kumar, A. Yanguas-Gil, S. R. Daly, G. S. Girolami and J. R. Abelson, Journal of the American Chemical Society 130 (52), 17660 (2008).
15. N. Kumar, W. Noh, S. R. Daly, G. S. Girolami and J. R. Abelson, Chemistry of Materials 21 (23), 5601-5606 (2009). 16N. Kumar, University of Illinois at Urbana-Champaign, 2009.
17. S. Jayaraman, Y. Yang, D. Y. Kim, G. S. Girolami and J. R. Abelson, Journal of Vacuum Science & Technology A 23 (6), 1619-1625 (2005).
18. Y. Yang, S. Jayaraman, D. Y. Kim, G. S. Girolami and J. R. Abelson, Chemistry of Materials 18 (21), 5088-5096 (2006).
19. Y. Yang, S. Jayaraman, B. Sperling, D. Y. Kim, G. S. Girolami and J. R. Abelson, Journal of Vacuum Science & Technology A 25 (1), 200-206 (2007).
20. S. Jayaraman, E. J. Klein, Y. Yang, D. Y. Kim, G. S. Girolami and J. R. Abelson, Journal of Vacuum Science & Technology A 23 (4), 631-633 (2005).
21. H. F. Okorn-Schmidt, Ibm Journal of Research and Development 43 (3), 351-365 (1999).
22. G. S. Bales and A. Zangwill, Journal of Vacuum Science & Technology a-Vacuum Surfaces and Films 9 (1), 145-149 (1991).
23. T. K. T. Karabacak, Journal of Nanophotonics 5 (2011).
24. B. A. Sperling and J. R. Abelson, Journal of Applied Physics 101 (2) (2007).
25. J. W. Klaus and S. M. George, Journal of the Electrochemical Society 147 (7), 2658-2664 (2000).
26. M. J. Dresser, P. A. Taylor, R. M. Wallace, W. J. Choyke and J. T. Yates, Surface Science 218 (1), 75-107 (1989).

Example 5

Nucleation and Growth of $HfB_2$ Films in Macro-Trenches

Nucleation and growth of thin $HfB_2$ films in macro-trenches with aspect ratios of approximately 500 are examined using a $Hf(BH_4)_4$ precursor in the presence and absence of a smoothing agent comprising $NH_3$.

Figure 25A:
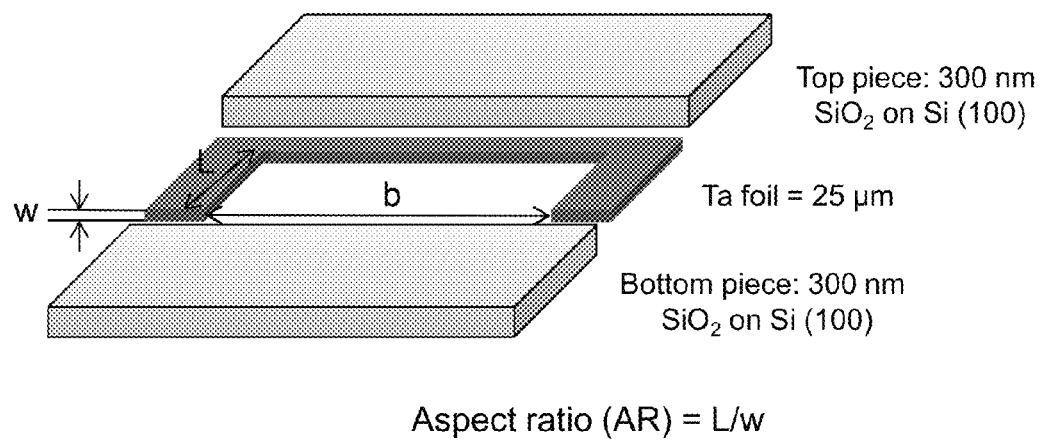
FIG. 25 provides a schematic diagram illustrating (a) component parts of a macro-trench and (b) an assembled macro-trench having an aspect ratio of approximately 500:1.
Figure 25B:
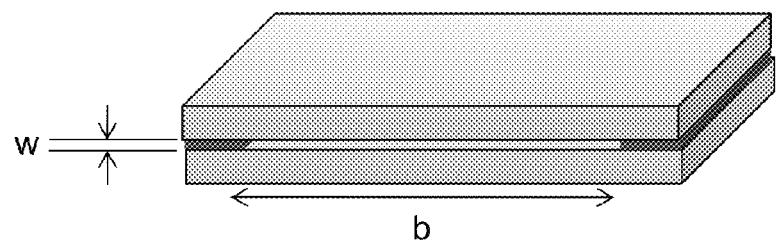

FIG. 25 provides a schematic of a macro-trench comprising top and bottom pieces of 300 nm $SiO_2$ on Si(100) separated by a 25 µm tantalum (Ta) foil, as shown in FIG. 25(a). The macro-trench that is formed when these pieces are assembled, as shown in FIG. 25(b), has an aspect ratio, L/w, of about 500. Still referring to FIG. 25, the conditions employed are a macro trench: 25 micron width-13 mm length; $SiO_2$ (300 nm) on a Si(100) substrate; growth temperature 250° C.; growth time: 60 minutes; precursor pressure: 0.12 mTorr $Hf(BH_4)_4$; (optional) inhibitor pressure: 0.02 mTorr $NH_3$.

Figure 26:
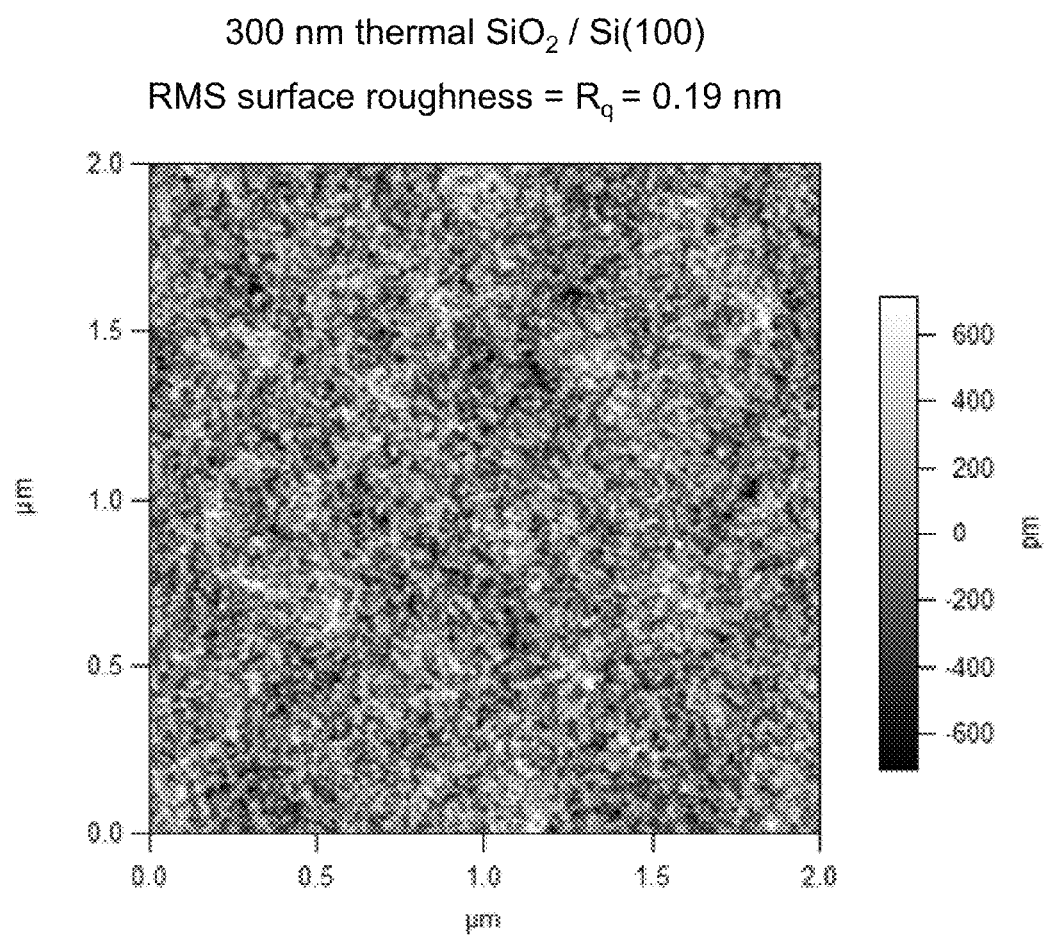
FIG. 26. An AFM image of the $SiO_2$ substrate within a macro-trench of FIG. 25.
Figure 27:
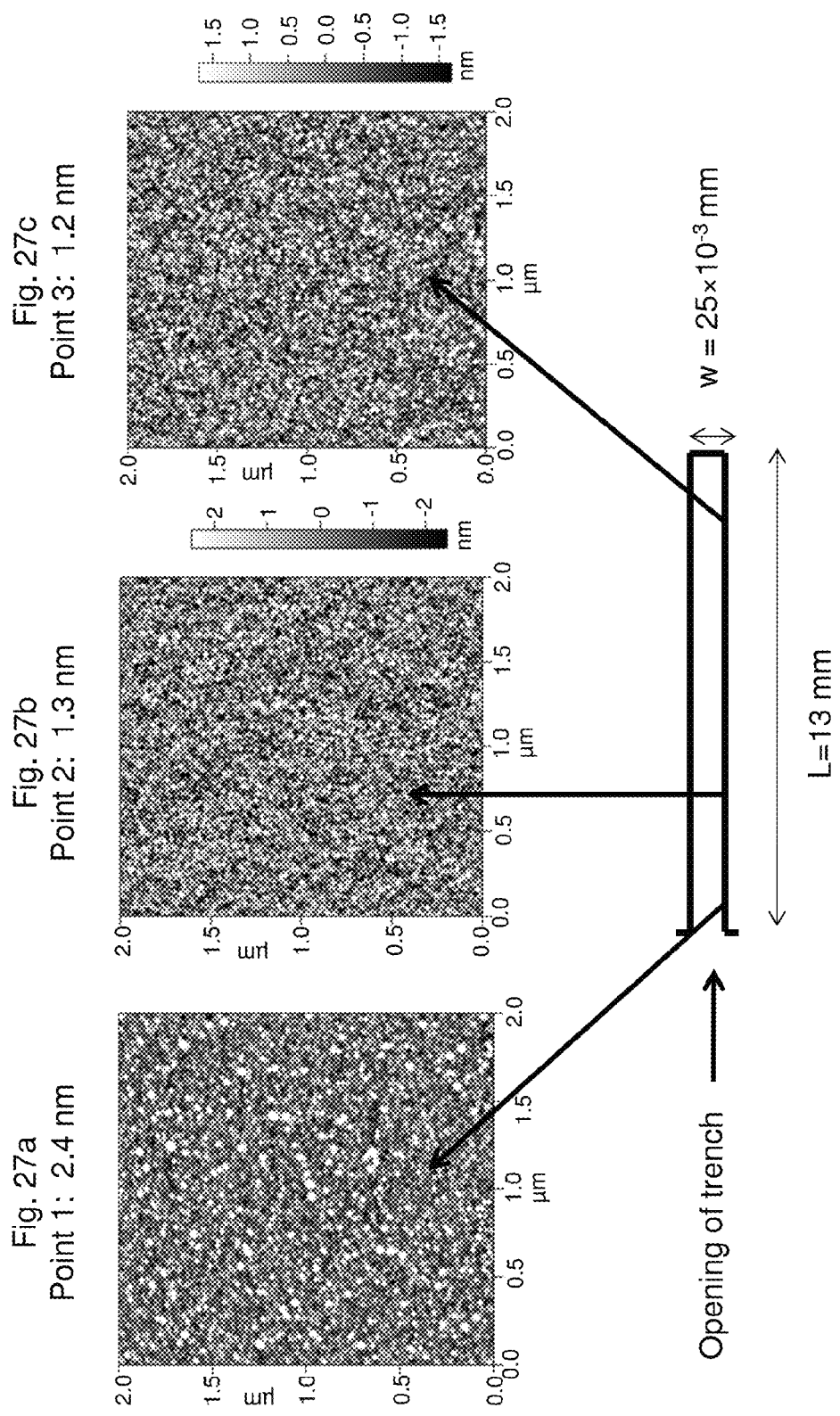
FIG. 27. SEM micrographs of $HfB_2$ films grown in a $SiO_2$ coated macro-trench from $Hf(BH_4)_4$ precursor alone.
Figure 28:
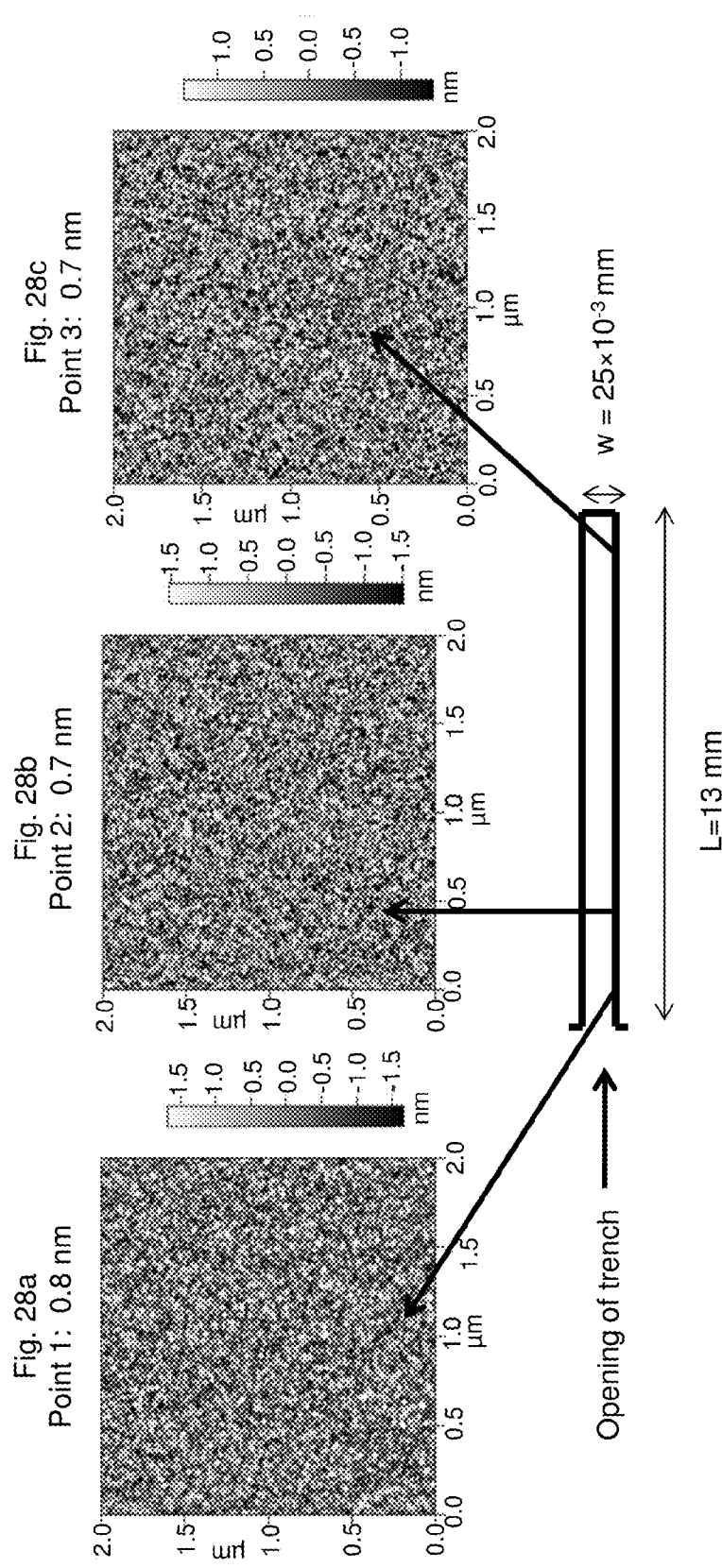
FIG. 28. SEM micrographs of $HfB_2$ films grown in a $SiO_2$ coated macro-trench from $Hf(BH_4)_4$ precursor together with an $NH_3$ smoothing agent.

FIG. 26 shows an AFM image of the $SiO_2$ substrate prior to the nucleation procedure. The substrate had an rms surface roughness equal to 0.19 nm. FIGS. 27 and 28 provide AFM images of $HfB_2$ films fabricated using only a precursor gas (no smoothing agent) (FIG. 27) and using a precursor gas and a smoothing agent (FIG. 28) at three positions of a recessed feature: (a) at the opening of the trench, (b) at the midpoint of an interior sidewall of the trench, and (c) at the bottom of the trench. The results in FIG. 27 demonstrate a rougher surface (rms=2.4 nm) at the opening of the trench compared to the middle or bottom of the trench (rms=1.2-1.3 nm) when only precursor is used. These results suggest that film growth occurs at a significant rate compared with transport by gas phase diffusion. FIG. 28 demonstrates a substantially uniform roughness (rms=0.7-0.8 nm) throughout the trench when a smoothing agent is used in combination with the precursor gas. Thus, the present methods provide substantially uniform nucleation along a recessed feature having an aspect ratio of ~500:1, suggesting that the precursor and smoothing agent partial pressures were essentially uniform everywhere in the feature.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the invention has been specifically disclosed by preferred embodiments, exemplary embodiments and optional features, modification and variation of the concepts herein disclosed can be resorted to by those skilled in the art, and that such modifications and variations are considered to be within the scope of this invention as defined by the appended claims. The specific embodiments provided herein are examples of useful embodiments of the invention and it will be apparent to one skilled in the art that the invention can be carried out using a large number of variations of the devices, device components, and method steps set forth in the present description. As will be apparent to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomer and enantiomer of the compound described individually or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compound differently.

Many of the molecules disclosed herein contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every formulation or combination of components described or exemplified herein can be used to practice the invention, unless otherwise stated.

Whenever a range is given in the specification, for example, a range of integers, a temperature range, a time range, a composition range, or concentration range, all intermediate ranges and subranges, as well as all individual values included in the ranges given are intended to be included in the disclosure. As used herein, ranges specifically include the values provided as endpoint values of the range. As used herein, ranges specifically include all the integer values of the range. For example, a range of 1 to 100 specifically includes the end point values of 1 and 100. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when compositions of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

It must be noted that as used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method for making a smooth layer on a substrate, the method comprising the steps of:
    providing the substrate having a receiving surface;
    contacting the receiving surface of the substrate simultaneously with a smoothing agent and a precursor gas, wherein accommodation of the precursor gas by the substrate results in formation of nuclei of deposited material on the receiving surface of the substrate; and wherein accommodation of the smoothing agent by the nuclei, or the substrate or both the nuclei and substrate decreases a growth rate of the nuclei sufficiently to form an average areal density of nuclei on the receiving surface of at least $1 \times 10^{11}$ cm$^{-2}$;
    contacting the nuclei on the receiving surface with the precursor gas and the smoothing agent; wherein accommodation of the precursor gas by the nuclei, substrate or both the nuclei and the substrate results in growth of the nuclei at the growth rate, thereby resulting in formation of a uniform nucleation layer on the substrate;

stopping contacting the nuclei with the smoothing agent upon formation of the uniform nucleation layer having a preselected thickness selected from the range of 0.5 nm to 50 nm and having a surface roughness (rms) less than or equal to 1 nm; and growing the smooth layer after the step of stopping contacting the nuclei with the smoothing agent by contacting the uniform nucleation layer with the precursor gas in the absence of the smoothing agent so as to generate the smooth layer having a thickness selected from the range of 1 nm to 1 µm.

2. The method of claim 1, wherein the smooth layer is a conformal or superconformal thin film.

3. The method of claim 1, further comprising the step of contacting the substrate, the nuclei or both with at least one additional smoothing agent, at least one additional precursor gas or at least one co-reactant gas.

4. The method of claim 1, wherein accommodation of the smoothing agent by the nuclei, the substrate or both the nuclei and the substrate decreases the growth rate of the nuclei sufficiently such that the formation, growth and coalescence of additional nuclei on the substrate generates the uniform nucleation layer.

5. The method of claim 1, wherein accommodation of the smoothing agent by the nuclei, the substrate or both the nuclei and the substrate decreases the growth rate of the nuclei by a factor of at least 2 relative to a growth rate of the nuclei in the absence of the smoothing agent.

6. The method of claim 1, wherein the precursor gas has a net sticking coefficient with respect to accommodation on the nuclei, and wherein accommodation of the smoothing agent by the nuclei, the substrate or both the nuclei and the substrate results in a decrease of the net sticking coefficient of the precursor gas with respect to accommodation on the nuclei by a factor greater than or equal to 2.

7. The method of claim 1, wherein the precursor gas is selected from the group consisting of hydrides, borohydrides, halides, oxides, chalcogenides, nitrides, pnictides, alkyls, aryls, allyls, cyclopentadienyls, alkenes, arenes, silyls, amides, amines, phosphides, phosphines, arsines, diazines, alkoxides, alcohols, ethers, siloxides, carboxylates, beta-diketonates, thiolates, selenolates, and tellurolates.

8. The method of claim 1, wherein the precursor gas comprises $Hf(BH_4)_4$, $Cu(hfac)(vtms)$, $Cu(hfac)(mhy)$, $Cu(tmod)_2$, $Ti(BH_4)_3(dme)$, or $Zr(BH_4)_4$.

9. The method of claim 1, wherein the precursor gas has a net sticking coefficient with respect to accommodation on the nuclei in the absence of smoothing agent or with respect to accommodation on the substrate equal to or greater than $1\times10^{-6}$.

10. The method of claim 1, wherein the precursor gas or the smoothing agent has a partial pressure less than or equal to 20 mTorr.

11. The method of claim 1, wherein the smoothing agent is a neutral molecule.

12. The method of claim 1, wherein the smoothing agent is an electron donor molecule.

13. The method of claim 1, wherein the smoothing agent comprises $NH_3$, $H_2O$, vtms, H(hfac), H(tmod), mhy or dme.

14. The method of claim 1, wherein the smoothing agent is $NH_3$, $HNR^1R^2$, $H_2NR^1$, or $H_2O$, where each of $R^1$ and $R^2$ is independently H or $C_1$-$C_6$ alkyl.

15. The method of claim 1, wherein the smoothing agent has a net sticking coefficient with respect to accommodation on the nuclei or the substrate equal to or greater than $1\times10^{-6}$.

16. The method of claim 1, wherein the smoothing agent and the precursor gas are a combination selected from the group consisting of:

$NH_3$ and $Hf(BH_4)_4$;

vtms and $Cu(hfac)(vtms)$;

H(tmod) and $Cu(tmod)_2$; and dme and $Ti(BH_4)_3(dme)$.

17. The method of claim 1, wherein the substrate is a metal oxide or a semiconductor oxide.

18. The method of claim 1, wherein the substrate includes a recessed feature having an opening, a bottom surface and side surfaces extending from the opening to the bottom surface.

19. The method of claim 18, wherein the smooth layer fills or coats the recessed feature, and wherein the recessed feature has an aspect ratio of depth to width greater than or equal to 10.

20. The method of claim 1, wherein the smooth layer has a thickness less than or equal to 20 nm.

21. The method of claim 1, wherein the smooth layer is a diffusion barrier in an electronic device.

22. The method of claim 1, wherein the smooth layer is substantially free of pinholes.

23. A method for making a smooth $HfB_2$ layer on a substrate, the method comprising the steps of:

providing the substrate having a receiving surface;

contacting the receiving surface of the substrate simultaneously with $NH_3$ gas and $Hf(BH_4)_4$ gas, wherein accommodation of the $Hf(BH_4)_4$ gas by the substrate results in formation of $HfB_2$ nuclei on the receiving surface of the substrate; and wherein accommodation of the $NH_3$ gas by the $HfB_2$ nuclei or the substrate or both the $HfB_2$ nuclei and the substrate decreases a growth rate of the $HfB_2$ nuclei sufficientl to form an average areal density of nuclei on the receiving surface of at least $1\times10^{11}$ cm$^{-2}$;

contacting the $HfB_2$ nuclei on the receiving surface with the $Hf(BH_4)_4$ gas and the $NH_3$ gas; wherein accommodation of the $Hf(BH_4)_4$ gas by the $HfB_2$ nuclei, the substrate or both the $HfB_2$ nuclei and the substrate results in growth of the $HfB_2$ nuclei at the growth rate, thereby resulting in formation of a uniform nucleation layer of $HfB_2$ on the substrate;

stopping contacting the $HfB_2$ nuclei with the $NH_3$ gas upon formation of the uniform nucleation layer having a preselected thickness selected from the range of 0.5 nm to 50 nm and having a surface roughness (rms) less than or equal to 1 nm; and growing the smooth layer after the step of stopping contacting the $HfB_2$ nuclei with the $NH_3$ gas by contacting the uniform nucleation layer of $HfB_2$ with the $Hf(BH_4)_4$ precursor gas in the absence of the $NH_3$ gas so as to generate the smooth layer having a thickness selected from the range of 1 nm to 1 µm.

24. The method of claim 23, wherein accommodation of the $NH_3$ gas by the $HfB_2$ nuclei, the substrate or both $HfB_2$ nuclei and the substrate decreases the growth rate of the $HfB_2$ nuclei sufficiently such that growth and coalescence of additional $HfB_2$ nuclei generates the uniform nucleation layer of $HfB_2$ layer on the substrate.

25. The method of claim 1, wherein the preselected thickness of the uniform nucleation layer is selected over the range of 0.5 nanometer to 20 nanometers.

26. The method of claim 1, wherein the preselected thickness of the uniform nucleation layer is selected over the range of 0.5 nanometer to 10 nanometers.

27. The method of claim 1, wherein the step of growing the smooth layer after the step of stopping contacting the nuclei with the smoothing agent by contacting the uniform nucleation layer with the precursor gas in the absence of the smoothing agent generates the smooth layer having a thickness selected from the range of 1 nanometer to 500 nanometers.

28. The method of claim 1, wherein the step of growing the smooth layer after the step of stopping contacting the nuclei with the smoothing agent by contacting the uniform nucleation layer with the precursor gas in the absence of the smoothing agent generates the smooth layer having a thickness selected from the range of 1 nanometer to 100 nanometers.

\* \* \* \* \*